(12) United States Patent
Kanno et al.

(10) Patent No.: US 10,873,018 B2
(45) Date of Patent: Dec. 22, 2020

(54) THERMOELECTRIC GENERATOR SYSTEM

(71) Applicant: Panasonic Corporation, Osaka (JP)

(72) Inventors: Tsutomu Kanno, Kyoto (JP); Akihiro Sakai, Nara (JP); Kohei Takahashi, Osaka (JP); Hiromasa Tamaki, Osaka (JP); Hideo Kusada, Osaka (JP); Yuka Yamada, Nara (JP)

(73) Assignee: Panasonic Corporation, Osaka (JP)

( * ) Notice: Subject to any disclaimer, the term of this patent is extended or adjusted under 35 U.S.C. 154(b) by 95 days.

(21) Appl. No.: 16/198,977

(22) Filed: Nov. 23, 2018

(65) Prior Publication Data

US 2019/0097114 A1    Mar. 28, 2019

Related U.S. Application Data

(63) Continuation of application No. 14/680,402, filed on Apr. 7, 2015, now Pat. No. 10,170,677, which is a
(Continued)

(30) Foreign Application Priority Data

Mar. 12, 2013   (JP) ................. 2013-048864

(51) Int. Cl.
   *H01L 35/32*    (2006.01)
   *H01L 35/30*    (2006.01)

(52) U.S. Cl.
   CPC .............. *H01L 35/32* (2013.01); *H01L 35/30* (2013.01)

(58) Field of Classification Search
   CPC ......... H01L 35/00; H01L 35/02; H01L 35/28; H01L 35/32; H01L 23/34; H01L 23/38;
(Continued)

(56) References Cited

U.S. PATENT DOCUMENTS

| | | | |
|---|---|---|---|
| 6,236,810 B1 | 5/2001 | Kadotani | |
| 2008/0060695 A1* | 3/2008 | Brignone | ............... H01L 35/30 136/206 |

(Continued)

FOREIGN PATENT DOCUMENTS

| | | | |
|---|---|---|---|
| JP | H03-221757 A | 9/1991 | |
| JP | H10-300621 A | 11/1998 | |

(Continued)

OTHER PUBLICATIONS

International Search Report for corresponding International Application No. PCT/JP2014/001284 dated Jun. 17, 2014.
(Continued)

*Primary Examiner* — Christina Chern
(74) *Attorney, Agent, or Firm* — Renner, Otto, Boisselle & Sklar, LLP

(57) ABSTRACT

A thermoelectric generator system according to the present disclosure includes first and second thermoelectric generator units, each including tubular thermoelectric generators. Each of the generators has a flow path defined by its inner peripheral surface, and generates electromotive force in an axial direction thereof based on a temperature difference between its inner and outer peripheral surfaces. Each unit further includes: a container housing the generators inside; and electrically conductive members providing electrical interconnection for the generators. The container has fluid inlet and outlet ports through which a fluid flows inside, and openings into which the generators are inserted. A buffer vessel is arranged between the first and second units, and has a first opening communicating with the flow paths of the generators in the first unit and a second opening communicating with the flow paths of the generators in the second unit.

19 Claims, 28 Drawing Sheets

Related U.S. Application Data continuation of application No. PCT/JP2014/001284, filed on Mar. 7, 2014.

(58) Field of Classification Search
CPC ........ F28D 7/00; F28D 7/0025; F28D 7/0083; F28D 7/0091; F28D 7/163
See application file for complete search history.

(56) References Cited

U.S. PATENT DOCUMENTS

| | | | |
|---|---|---|---|
| 2008/0173343 A1 | 7/2008 | Kanno et al. | |
| 2010/0024859 A1* | 2/2010 | Bell | H01L 35/30 136/201 |
| 2011/0120106 A1 | 5/2011 | Bruck | |
| 2011/0258995 A1 | 10/2011 | Limbeck | |
| 2013/0068273 A1 | 3/2013 | Kanno et al. | |
| 2013/0104953 A1 | 5/2013 | Poliquin | |
| 2014/0086781 A1 | 3/2014 | Sakai et al. | |
| 2014/0102499 A1 | 4/2014 | Takahashi et al. | |
| 2014/0216514 A1 | 8/2014 | Simonin | |

FOREIGN PATENT DOCUMENTS

| | | | |
|---|---|---|---|
| JP | 2002-015749 A | 1/2002 | |
| JP | 2005-197385 A | 7/2005 | |
| JP | 2011-214829 A | 10/2011 | |
| JP | 2012-069625 A | 4/2012 | |
| JP | 2012-069626 A | 4/2012 | |
| JP | 2013-016685 A | 1/2013 | |
| JP | 2013-038219 A | 2/2013 | |
| JP | 2013-062275 A | 4/2013 | |
| WO | WO 1999/057768 A1 | 11/1999 | |
| WO | WO 2008/056466 A1 | 5/2008 | |
| WO | WO 2012/014366 A1 | 2/2012 | |
| WO | WO 2012/170443 A2 | 12/2012 | |
| WO | WO 2012163916 | 12/2012 | |
| WO | WO 2013/150773 A1 | 10/2013 | |
| WO | WO 2013/161174 A1 | 10/2013 | |

OTHER PUBLICATIONS

Kanno et al., "A Tubular Electric Power Generator Using Off-Diagonal Thermoelectric Effects", preprints from the 72nd Symposium of the Japan Society of Applied Physics, 30a-F-14, 2011 (with concise English translation).

Sakai et al., "Enhancement in performance of the tubular thermoelectric generation (TTEG)", International Conference on Thermoelectrics, 2012.

Kanno et al., "A Tubular Thermoelectric Generator with Piled Conical Rings Structure", Advanced Technology Research Laboratories, Panasonic Corporation, Kyoto, Japan Aug. 29, 2011.

Kanno et al., "Development of thermoelectric generation tube for utilising unutilized thermo energy", Panasonic Corporation, Japan, Jul. 24, 2012, pp. 100-108 (with concise English translation).

Allowed Claims from Parent Application as presented in Examiner's Amendment in Parent U.S. Appl. No. 14/680,402, filed Apr. 7, 2015.

* cited by examiner (a)                              (b)

THERMOELECTRIC GENERATOR SYSTEM

This is a continuation of U.S. patent application Ser. No. 14/680,402, with a filing date of Apr. 7, 2015, which is a continuation of International Application No. PCT/JP2014/001284, with an international filing date of Mar. 7, 2014, which claims priority of Japanese Patent Application No. 2013-048864, filed on Mar. 12, 2013, the contents of which are hereby incorporated by reference.

BACKGROUND

1. Technical Field

The present disclosure relates to a thermoelectric generator system including a plurality of thermoelectric generator units. The present disclosure also relates to a method of producing the thermoelectric generator system.

2. Description of the Related Art

A thermoelectric conversion element is an element which can convert either heat into electric power or electric power into heat. A thermoelectric conversion element made of a thermoelectric material that exhibits the Seebeck effect can obtain thermal energy from a heat source at a relatively low temperature (of 200 degrees Celsius or less, for example) and can convert the thermal energy into electric power. With a thermoelectric generation technique based on such a thermoelectric conversion element, it is possible to collect and effectively utilize thermal energy which would conventionally have been dumped unused into the ambient in the form of steam, hot water, exhaust gas, or the like.

A thermoelectric conversion element made of a thermoelectric material will be hereinafter referred to as a "thermoelectric generator". A thermoelectric generator generally has a so-called "π structure" where p- and n-type semiconductors, of which the carriers have mutually different electrical polarities, are combined together (see Japanese Laid-Open Patent Publication No. 2013-016685, for example). In a thermoelectric generator with the π structure, a p-type semiconductor and an n-type semiconductor are connected together electrically in series together and thermally parallel with each other. In the π structure, the direction of a temperature gradient and the direction of electric current flow are either mutually parallel or mutually antiparallel to each other. This makes it necessary to provide an output terminal on the high-temperature heat source side or the low-temperature heat source side. Consequently, to connect a plurality of such thermoelectric generators, each having the π structure, electrically in series together, a complicated wiring structure is required.

PCT International Application Publication No. 2008/056466 (which will be hereinafter referred to as "Patent Document 1") discloses a thermoelectric generator including a stacked body of a bismuth layer and a layer of a different metal from bismuth between first and second electrodes that face each other. In the thermoelectric generator disclosed in Patent Document 1, the planes of stacking are inclined with respect to a line that connects the first and second electrodes together. PCT International Application Publication No. 2012/014366 (which will be hereinafter referred to as "Patent Document 2"), kanno et al., preprints from the 72$^{nd}$ Symposium of the Japan Society of Applied Physics, 30a-F-14 "A Tubular Electric Power Generator Using Off-Diagonal Thermoelectric Effects" (2011), and A. Sakai et al., International conference on thermoelectrics 2012 "Enhancement in performance of the tubular thermoelectric generator (TTEG)" (2012) disclose tubular thermoelectric generators.

SUMMARY

Development of a practical thermoelectric generator system that uses such thermoelectric generation technologies is awaited.

A thermoelectric generator system according to an implementation of the present disclosure includes a plurality of thermoelectric generator units including first and second thermoelectric generator units, each of which includes a plurality of tubular thermoelectric generators. Each of the plurality of tubular thermoelectric generators has an outer peripheral surface, an inner peripheral surface and a flow path defined by the inner peripheral surface, and generates electromotive force in an axial direction of each tubular thermoelectric generator based on a difference in temperature between the inner and outer peripheral surfaces. Each of the first and second thermoelectric generator units further includes: a container housing the plurality of tubular thermoelectric generators inside, the container having fluid inlet and outlet ports through which a fluid flows inside the container, and a plurality of openings into which the respective tubular thermoelectric generators are inserted; and a plurality of electrically conductive members providing electrical interconnection for the plurality of tubular thermoelectric generators. The thermoelectric generator system further includes a buffer vessel which is arranged between the first and second thermoelectric generator units. The buffer vessel has a first opening communicating with the respective flow paths of the plurality of tubular thermoelectric generators in the first thermoelectric generator unit and a second opening communicating with the respective flow paths of the plurality of tubular thermoelectric generators in the second thermoelectric generator unit.

A thermoelectric generator system according to the present disclosure contributes to increasing the practicality of thermoelectric power generation.

These general and specific aspects may be implemented using a system and a method, and any combination of systems and methods.

Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

DETAILED DESCRIPTION

A thermoelectric generator system according to a non-limiting exemplary implementation of the present disclosure includes a plurality of thermoelectric generator units including first and second thermoelectric generator units, each of which includes a plurality of tubular thermoelectric generators. Each of the tubular thermoelectric generators has an outer peripheral surface, an inner peripheral surface and a flow path defined by the inner peripheral surface, and is configured to generate electromotive force in an axial direction of each tubular thermoelectric generator based on a difference in temperature between the inner and outer peripheral surfaces.

Each of the first and second thermoelectric generator units further includes: a container housing the tubular thermoelectric generators inside; and a plurality of electrically conductive members providing electrical interconnection for the tubular thermoelectric generators. The container has fluid inlet and outlet ports through which a fluid flows inside the container, and a plurality of openings into which the respective tubular thermoelectric generators are inserted.

The thermoelectric generator system according to this implementation further includes a buffer vessel which is arranged between the first and second thermoelectric generator units. The buffer vessel has first and second openings. The first opening communicates with the respective flow paths of the tubular thermoelectric generators in the first thermoelectric generator unit, and the second opening communicates with the respective flow paths of the tubular thermoelectric generators in the second thermoelectric generator unit.

<Basic Configuration and Principle of Operation of Thermoelectric Generator>

Before embodiments of a thermoelectric generator system according to the present disclosure are described, the basic configuration and principle of operation of a thermoelectric generator for use in each thermoelectric generator unit that the thermoelectric generator system has will be described. As will be described later, in a thermoelectric generator system according to the present disclosure, a tubular thermoelectric generator is used. However, the principle of operation of such a tubular thermoelectric generator can also be understood more easily through description of the principle of operation of a thermoelectric generator in a simpler shape.

Figure 1A:
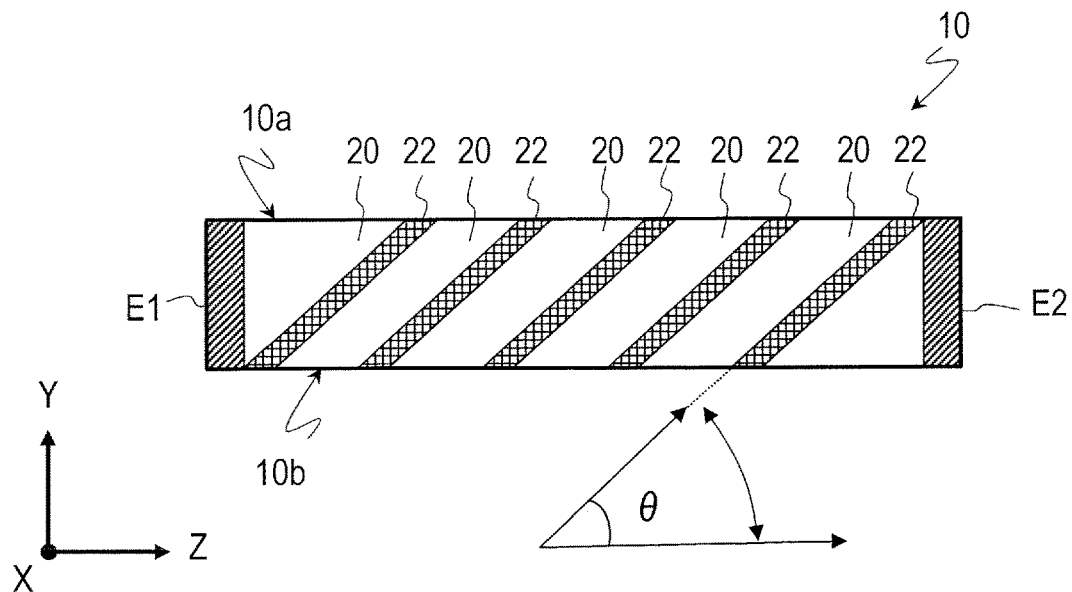
FIG. 1A is a schematic cross-sectional view of a thermoelectric generator 10.
Figure 1B:
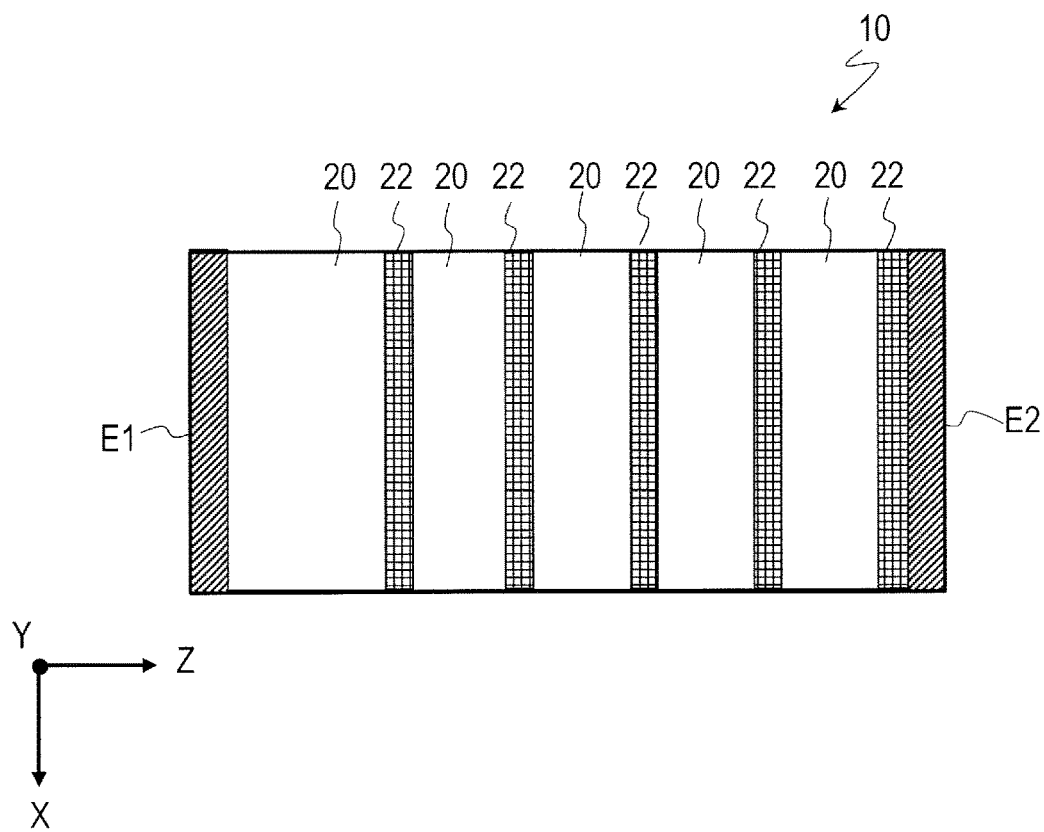
FIG. 1B is a top view of the thermoelectric generator 10 shown in FIG. 1A.

First of all, look at FIGS. 1A and 1B. FIG. 1A is a schematic cross-sectional view of a thermoelectric generator 10 with a generally rectangular parallelepiped shape, and FIG. 1B is a top view of the thermoelectric generator 10. For reference sake, X-, Y- and Z-axis that intersect with each other at right angles are shown in FIGS. 1A and 1B. The thermoelectric generator 10 shown in FIGS. 1A and 1B includes a stacked body with a structure in which multiple metal layers and thermoelectric material layers 22 are alternately stacked one upon the other so that their planes of stacking are inclined. Although the stacked body is supposed to have a rectangular parallelepiped shape in this example, the principle of operation will be the same even if the stacked body has any other shape.

In the thermoelectric generator 10 shown in FIGS. 1A and 1B, first and second electrodes E1 and E2 are arranged so as to sandwich the stacked body horizontally between them. In the cross section shown in FIG. 1A, the planes of stacking define an angle of inclination θ (where 0<θ<π radians) with respect to the Z-axis direction. The angle of inclination θ will be hereinafter simply referred to as an "inclination angle".

In the thermoelectric generator 10 with such a configuration, when a temperature difference is created between its upper surface 10a and its lower surface 10b, the heat will be transferred preferentially through the metal layers 20 with higher thermal conductivity than the thermoelectric material layers 22. Thus, a Z-axis direction component is produced in the temperature gradient of each of those thermoelectric material layers 22. As a result, electromotive force occurs in the Z-axis direction in each thermoelectric material layer 22 due to the Seebeck effect, and eventually the electromotive forces are superposed one upon the other in series inside this stacked body. Consequently, a significant potential difference is created as a whole between the first and second electrodes E1 and E2. A thermoelectric generator including the stacked body shown in FIGS. 1A and 1B is disclosed in PCT International Application Publication No. 2008/056466 (Patent Document 1), the entire disclosure of which is hereby incorporated by reference.

Figure 2:
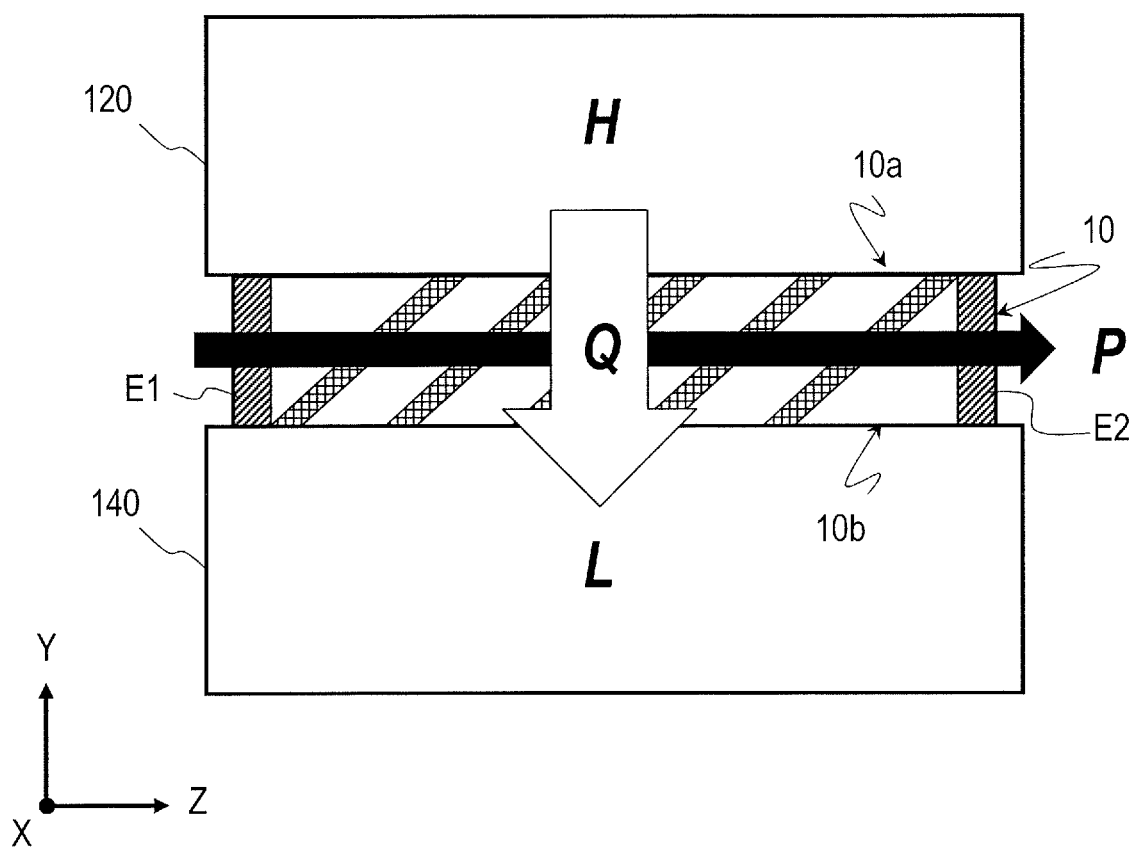
FIG. 2 schematically illustrates a situation where a high-temperature heat source 120 is brought into contact with the upper surface 10a of the thermoelectric generator 10 and a low-temperature heat source 140 is brought into contact with its lower surface 10b.

FIG. 2 schematically illustrates a situation where a high-temperature heat source 120 is brought into contact with the upper surface 10a of the thermoelectric generator 10 and a low-temperature heat source 140 is brought into contact with its lower surface 10b. In such a situation, heat Q flows from the high-temperature heat source 120 toward the low-temperature heat source 140 through the thermoelectric generator 10, and electric power P can be extracted from the thermoelectric generator 10 through the first and second electrodes E1 and E2. From a macroscopic point of view, in this thermoelectric generator 10, the direction of temperature gradient (Y-axis direction) and the direction of the electric current (Z-axis direction) intersect with each other at right angles. That is why there is no need to create a temperature difference between the two electrodes E1 and E2, through which the electric power is extracted. FIG. 2 schematically illustrates an example in which the electric power P flows from the left toward the right on the paper. However, this is only an example. For example, if the kind of the thermoelectric material used is changed, the electric power P may flow in the opposite direction from the one shown in FIG. 2.

Although the stacked body of the thermoelectric generator 10 is supposed to have a rectangular parallelepiped shape in the example described above for the sake of simplicity, a thermoelectric generator, of which the stacked body has a tubular shape, will be used in the embodiments to be described below. A thermoelectric generator in such a tubular shape will be hereinafter referred to as a "tubular thermoelectric generator" or "thermoelectric generation tube". It should be noted that in the present specification, the term "tube" is interchangeably used with the term "pipe", and is to be interpreted to encompass both a "tube" and a "pipe".

<Outline of Thermoelectric Generator Unit>

Next, a thermoelectric generator unit of the thermoelectric generator system according to the present disclosure will be outlined.

Figure 3A:
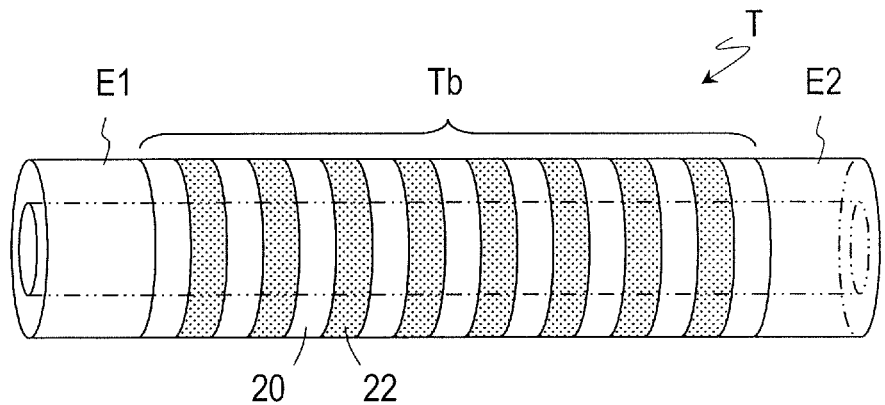
FIG. 3A is a perspective view illustrating an exemplary general configuration for a tubular thermoelectric generator T which may be used in an exemplary thermoelectric generator system according to the present disclosure.
Figure 3B:
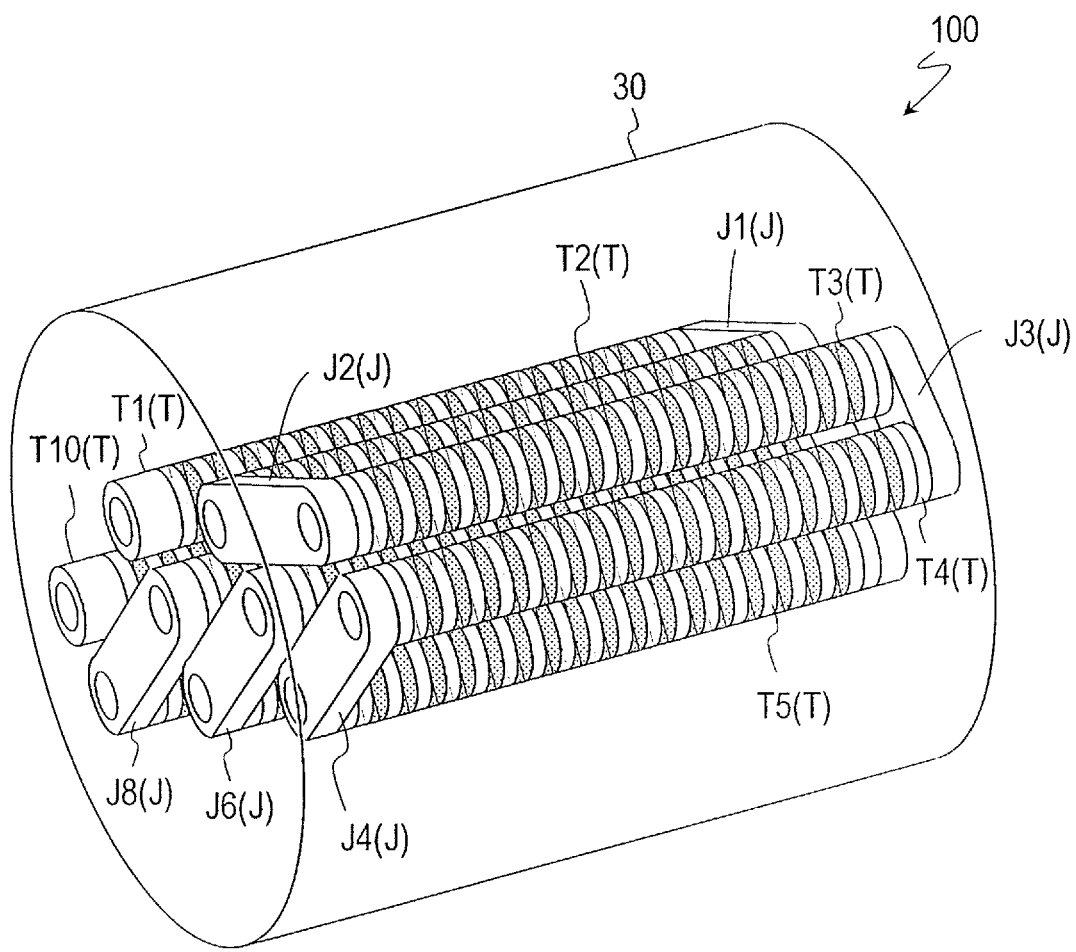
FIG. 3B is a perspective view illustrating a general configuration for an exemplary thermoelectric generator unit 100 that a thermoelectric generator system according to the present disclosure has.

First of all, look at FIGS. 3A and 3B. FIG. 3A is a perspective view illustrating an exemplary tubular thermoelectric generator T. The tubular thermoelectric generator T includes a tube body Tb in which multiple metal layers 20 and thermoelectric material layers 22 with a through hole at their center are alternately stacked one upon the other so as to be inclined and a pair of electrodes E1 and E2. A method of making such a tubular thermoelectric generator T is disclosed in Patent Document 2, for example. According to the method disclosed in Patent Document 2, multiple metallic cups, each having a hole at the bottom, and multiple thermoelectric material cups, each also having a hole at the bottom, are alternately stacked one upon the other and subjected to a plasma sintering process in such a state, thereby binding them together. The entire disclosure of PCT International Application Publication No. 2012/014366 is hereby incorporated by reference.

The tubular thermoelectric generator T shown in FIG. 3A may be connected to a conduit so that a hot heat transfer medium flows through a flow path defined by its inner peripheral surface (which will sometimes be referred to as an "internal flow path" hereinbelow). In that case, the outer peripheral surface of the tubular thermoelectric generator T may be brought into contact with a cold heat transfer medium. In this manner, a temperature difference is created between the inner and outer peripheral surfaces of the tubular thermoelectric generator T, thereby generating a potential difference between the pair of electrodes E1 and E2. As a result, the electric power generated can be extracted.

It should be noted that although these heat transfer media will be referred to herein as "hot" and "cold" heat transfer media, these terms "hot" and "cold" actually do not refer to specific absolute temperature levels of those media but just mean that there is a relative temperature difference between those media. Also, the "medium" is typically a gas, a liquid or a fluid that is a mixture of a gas and a liquid. However, the "medium" may contain solid, e.g., powder, which is dispersed within a fluid. Hereinbelow, the hot heat transfer medium and the cold heat transfer medium will sometimes be simply referred to as "the hot medium" and "the cold medium", respectively.

The shape of the tubular thermoelectric generator T may be anything tubular, without being limited to cylindrical. In other words, when the tubular thermoelectric generator T is cut along a plane which is perpendicular to the axis of the tubular thermoelectric generator T, the resultant shapes created by sections of the "outer peripheral surface" and the "inner peripheral surface" do not need to be circles, but may be any closed curves, e.g., ellipses or polygons. Although the axis of the tubular thermoelectric generator T is typically linear, it is not limited to being linear. These can be seen easily from the principle of thermoelectric generation that has already been described with reference to FIGS. 1A, 1B and 2.

FIG. 3B is a perspective view illustrating a general configuration for an exemplary thermoelectric generator unit 100 that a thermoelectric generator system according to the present disclosure has. The thermoelectric generator unit 100 shown in FIG. 3B includes a plurality of tubular thermoelectric generators T, a container 30 which houses these tubular thermoelectric generators T inside, and a plurality of electrically conductive members J to electrically connect these tubular thermoelectric generators T together. In the example illustrated in FIG. 3B, ten tubular thermoelectric generators T1 to T10 are housed inside the container 30. Those ten tubular thermoelectric generators T1 to T10 are typically arranged substantially parallel to each other but may also be arranged in any other pattern.

Each of these tubular thermoelectric generators T1 to T10 has an outer peripheral surface, an inner peripheral surface, and an internal flow path defined by the inner peripheral surface as described above. Each of these tubular thermoelectric generators T1 to T10 is configured to generate electromotive force along its axis based on a difference in temperature created between the inner and outer peripheral surfaces. That is to say, by creating a temperature difference between the outer and inner peripheral surfaces in each of those tubular thermoelectric generators T1 to T10, electric power generated can be extracted from the tubular thermoelectric generators T1 to T10. For example, by bringing a hot medium and a cold medium into contact with the internal flow path and the outer peripheral surface, respectively, in each of the tubular thermoelectric generators T1 to T10, electric power generated can be extracted from the tubular thermoelectric generators T1 to T10. Conversely, a cold medium and a hot medium may be brought into contact with the inner and outer peripheral surfaces, respectively, in each of the tubular thermoelectric generators T1 to T10.

In the example illustrated in FIG. 3B, the medium to be brought into contact with the outer peripheral surfaces of the tubular thermoelectric generators T1 to T10 inside the container 30 and the medium to be brought into contact with the inner peripheral surface of each tubular thermoelectric generator T1 to T10 in the internal flow path of the respective tubular thermoelectric generator are supplied through different conduits (not shown), thus being isolated so as not to intermix.

Figure 4:
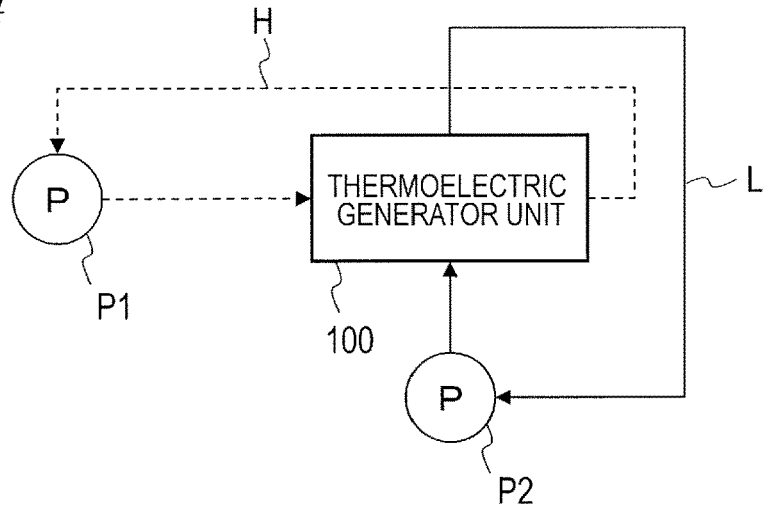
FIG. 4 is a block diagram illustrating an exemplary configuration for creating a temperature difference between the outer and inner peripheral surfaces of the tubular thermoelectric generator T.

FIG. 4 is a block diagram illustrating an exemplary configuration for introducing a temperature difference between the outer and inner peripheral surfaces of the tubular thermoelectric generator T. In FIG. 4, the dotted arrow H schematically indicates the flow of a hot medium and the solid arrow L schematically indicates the flow of a cold medium. In the example illustrated in FIG. 4, the hot and cold media are circulated by pumps P1 and P2, respectively. For example, the hot medium may be supplied to the internal flow path in each of the tubular thermoelectric generators T1 to T10 and the cold medium may be supplied into the container 30. Although not shown in FIG. 4, heat is supplied from a high-temperature heat source (such as a heat exchanger, not shown) to the hot medium and heat is supplied from the cold medium to a low-temperature heat source (not shown, either). As the high-temperature heat source, steam, hot water and exhaust gas at relatively low temperatures (of 200 degrees Celsius or less, for example) which have been dumped unused into the ambient can be used. Naturally, heat sources at even higher temperatures may also be used.

In the example illustrated in FIG. 4, the hot and cold media are supposed to be circulated by the pumps P1 and P2, respectively. However, this is only an example of a thermoelectric generator system according to the present disclosure. Alternatively, one or both of the hot and cold media may be dumped from their heat source into the ambient without forming a circulating system. For example, high-temperature hot spring water that has sprung from the ground may be supplied as the hot medium to the thermoelectric generator unit 100, and when its temperature lowers, the hot spring water may be used for any purpose other than power generation or just discharged. The same can be said about the cold medium. That is to say, phreatic water, river water or seawater may be pumped up and supplied to the thermoelectric generator unit 100. After any of these kinds of water has been used as the cold medium, its temperature may be lowered to an appropriate level as needed and then the water may be either poured back to its original source or just discharged to the ambient.

Now look at FIG. 3B again. In the thermoelectric generator unit 100 according to the present disclosure, a plurality of tubular thermoelectric generators T are electrically connected together via the electrically conductive members J. In the example illustrated in FIG. 3B, each pair of tubular thermoelectric generators T arranged adjacent to each other are connected together via their associated electrically conductive member J. As a result, these tubular thermoelectric generators T are electrically connected together in series as a whole. For example, the respective right ends of two tubular thermoelectric generators T3 and T4 which are illustrated as front ones in FIG. 3B are connected together with an electrically conductive member J3. On the other hand, the respective left ends of these two tubular thermoelectric generators T3 and T4 are connected to two other tubular thermoelectric generators T2 and T5 via electrically conductive members J2 and J4, respectively.

Figure 5:
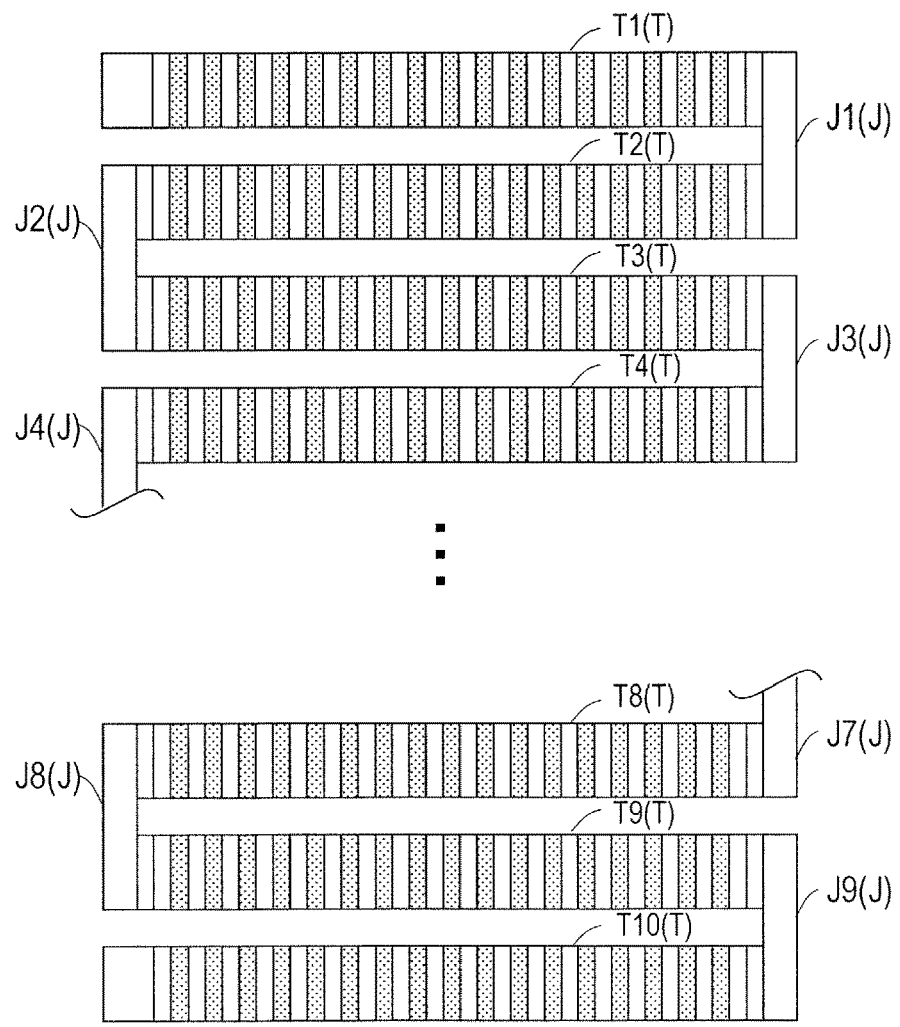
FIG. 5 schematically illustrates how the tubular thermoelectric generators T1 to T10 may be electrically connected together.

FIG. 5 schematically illustrates how those tubular thermoelectric generators T1 to T10 may be electrically connected together. As shown in FIG. 5, each of the electrically conductive members J1 to J9 electrically connects its associated two tubular thermoelectric generators together. That is to say, the electrically conductive members J1 to J9 are arranged to electrically connect these tubular thermoelectric generators T1 to T10 in series together as a whole. In this example, the circuit comprised of the tubular thermoelectric generators T1 to T10 and the electrically conductive members J1 to J9 is a traversable one. However, this circuit may also include some tubular thermoelectric generators which are connected in parallel, and it is not essential that the circuit be traversable.

In the example illustrated in FIG. 5, an electric current may flow from the tubular thermoelectric generator T1 to the tubular thermoelectric generator T10, for example. However, the electric current may also flow from the tubular thermoelectric generator T10 to the tubular thermoelectric generator T1. The direction of this electric current is determined by the kind of a thermoelectric material used to make the tubular thermoelectric generator T, the direction of flow of heat generated between the inner and outer peripheral surfaces of the tubular thermoelectric generator T, and the direction of inclination of the planes of stacking in the tubular thermoelectric generator T, for example. The connection of the tubular thermoelectric generators T1 to T10 is determined so that electromotive forces occurring in the respective tubular thermoelectric generators T1 to T10 do not cancel one another, but are superposed.

It should be noted that the direction in which the electric current flows through the tubular thermoelectric generators T1 to T10 has nothing to do with the direction in which the medium (i.e., either the hot medium or the cold medium) flows through the internal flow path of the tubular thermoelectric generators T1 to T10. For instance, in the example illustrated in FIG. 5, the medium going through the internal flow path may flow from the left toward the right on the paper in each and every one of the tubular thermoelectric generators T1 to T10.

<Detailed Configuration of Tubular Thermoelectric Generator T>

Figure 6A:
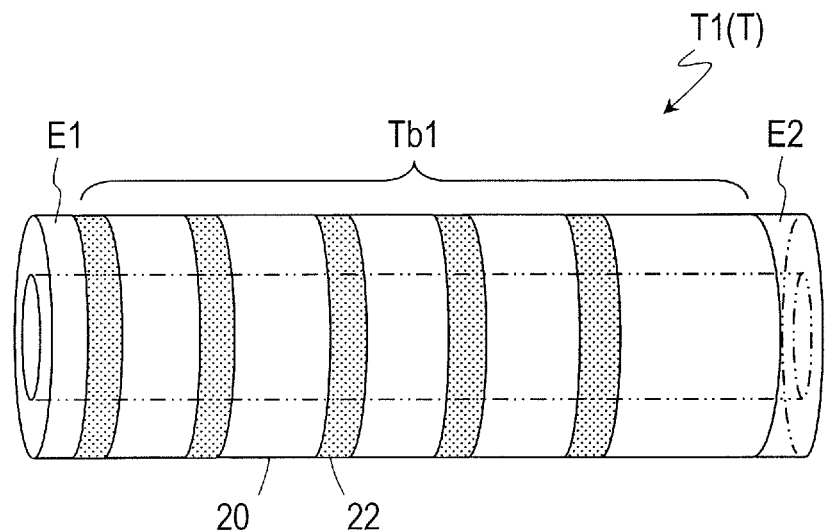
FIG. 6A is a perspective view illustrating one of the tubular thermoelectric generators T (e.g., the tubular thermoelectric generator T1 in this example) that the thermoelectric generator unit 100 has.

Next, a detailed configuration for the tubular thermoelectric generator T will be described with reference to FIGS. 6A and 6B. FIG. 6A is a perspective view illustrating one of the tubular thermoelectric generators T (e.g., the tubular thermoelectric generator T1 in this example) that the thermoelectric generator unit 100 has. The tubular thermoelectric generator T1 includes a tube body Tb1 and first and second electrodes E1 and E2 which are arranged at both ends of the tube body Tb1. The tube body Tb1 has a configuration in which multiple metal layers 20 and multiple thermoelectric material layers 22 are alternately stacked one upon the other. In the present specification, the direction in which a line that connects the first and second electrodes E1 and E2 together runs will sometimes be referred to as a "stacking direction" hereinbelow. The stacking direction agrees with the axial direction of the tubular thermoelectric generator.

Figure 6B:
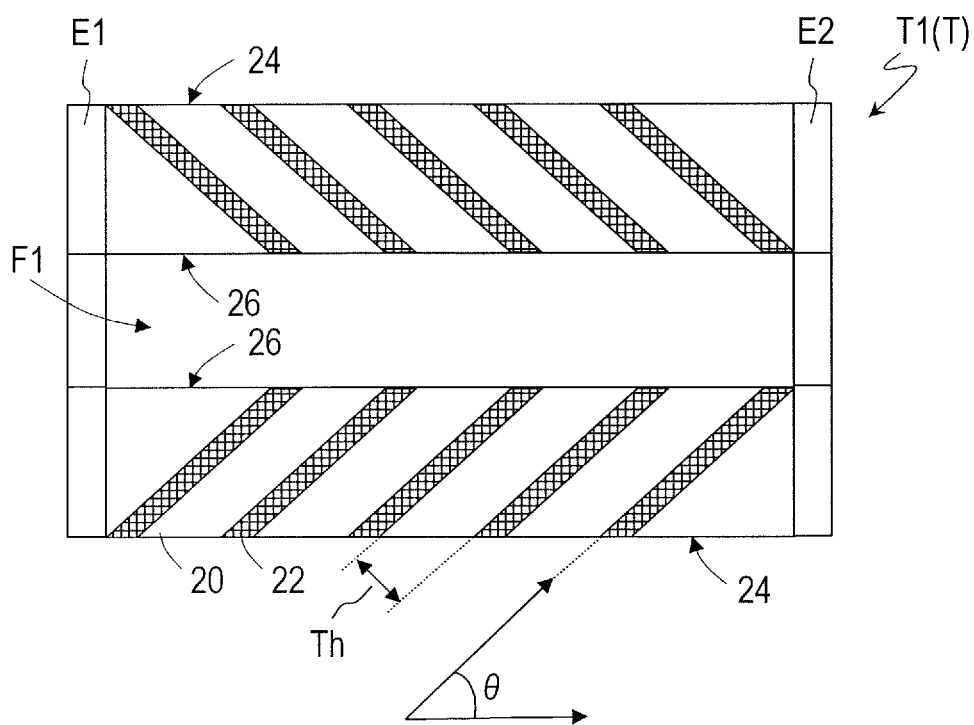
FIG. 6B schematically illustrates a cross section where the tubular thermoelectric generator T1 is cut along a plane which contains the axis (center axis) of the tubular thermoelectric generator T1.

FIG. 6B schematically illustrates a cross section of the tubular thermoelectric generator T1 as viewed on a plane including the axis (center axis) of the tubular thermoelectric generator T1. As shown in FIG. 6B, the tubular thermoelectric generator T1 has an outer peripheral surface 24 and an inner peripheral surface 26. A region which is defined by the inner peripheral surface 26 forms a flow path F1. In the illustrated example, cross sections of the outer peripheral surface 24 and the inner peripheral surface 26 taken perpendicular to the axial direction each present the shape of a circle. However, these shapes are not limited to circles, but may be ellipses or polygons, as described above. The cross-sectional area of the flow path on such a cross section that intersects with the axial direction at right angles is not particularly limited. The cross-sectional area of the flow path or the number of tubular thermoelectric generators to provide may be determined appropriately by the flow rate of the medium to be supplied into the internal flow path of the tubular thermoelectric generator T.

Although the first and second electrodes E1 and E2 each have a circular cylindrical shape in the example illustrated in FIGS. 6A and 6B, this is only an example and the first and second electrodes E1 and E2 do not need to have such a shape. At or near the respective end of the tube body Tb1, the first electrode E1 and the second electrode E2 may each have any arbitrary shape which is electrically connectable to at least one of the metal layers 20 or the thermoelectric material layers 22 and which does not obstruct the flow path F1. In the example shown in FIGS. 6A and 6B, the first electrode E1 and the second electrode E2 have outer peripheral surfaces conforming to the outer peripheral surface 24 of the tube body Tb1; however, it is not necessary for the outer peripheral surfaces of the first electrode E1 and the second electrode E2 to conform to the outer peripheral surface 24 of the tube body Tb1. For example, the diameter of the outer peripheral surface (i.e., the outer diameter) of the first and second electrodes E1 and E2 may be larger or smaller than that of the tube body Tb1. Also, when viewed on a plane that intersects with the axial direction at right angles, the cross-sectional shape of the first and second electrodes E1 and E2 may be different from that of the outer peripheral surface 24 of the tube body Tb1.

The first and second electrodes E1 and E2 may be made of a material with electrical conductivity and are typically made of a metal. The first and second electrodes E1 and E2 may be comprised of a single or multiple metal layers 20 which are located at or near the ends of the tube body Tb1. In that case, portions of the tube body Tb1 function as the first and second electrodes E1 and E2. Alternatively, the first and second electrodes E1 and E2 may also be formed out of a metal layer or annular metallic member which is arranged so as to partially cover the outer peripheral surface of the tube body Tb1. Still alternatively, the first and second electrodes E1 and E2 may also be a pair of circular cylindrical metallic members which are fitted into the flow path F1 through the ends of the tube body Tb1 so as to be in contact with the inner peripheral surface of the tube body Tb1.

As shown in FIG. 6B, the metal layers 20 and thermoelectric material layers 22 are alternately stacked one upon the other so as to be inclined. A tubular thermoelectric generator with such a configuration operates on basically the same principle as what has already been described with reference to FIGS. 1A, 1B and 2. That is why if a temperature difference is created between the outer peripheral surface 24 and inner peripheral surface 26 of the tubular thermoelectric generator T1, a potential difference is generated between the first and second electrodes E1 and E2. The general direction of the temperature gradient is the radial direction of the tubular thermoelectric generator T1 (i.e., the direction that intersects with the stacking direction at right angles).

The inclination angle θ of the planes of stacking in the tube body Tb1 may be set within the range of not less than 5 degrees and not more than 60 degrees, for example. The inclination angle θ may be not less than 20 degrees and not more than 45 degrees. An appropriate range of the inclination angle θ varies according to the combination of the material to make the metal layers 20 and the thermoelectric material to make the thermoelectric material layers 22.

The ratio of the thickness of each metal layer 20 to that of each thermoelectric material layer 22 in the tube body Tb1 (which will be hereinafter simply referred to as a "stacking ratio") may be set within the range of 20:1 to 1:9, for example. In this case, the thickness of the metal layer 20 refers herein to its thickness as measured perpendicularly to the plane of stacking (i.e., the thickness indicated by the arrow Th in FIG. 6B). In the same way, the thickness of the thermoelectric material layer 22 refers herein to its thickness as measured perpendicularly to the plane of stacking. It should be noted that the total number of the metal layers 20 and thermoelectric material layers 22 that are stacked one upon the other may be set appropriately.

The metal layers 20 may be made of any arbitrary metallic material. For example, the metal layers 20 may be made of nickel or cobalt. Nickel and cobalt are examples of metallic materials which exhibit excellent thermoelectric generation properties. Optionally, the metal layers 20 may include silver or gold. Furthermore, the metal layers 20 may include any of these metallic materials either by itself or as their alloy. If the metal layers 20 are made of an alloy, the alloy may include copper, chromium or aluminum. Examples of such alloys include constantan, CHROMEL™, and ALUMEL™.

The thermoelectric material layers 22 may be made of any arbitrary thermoelectric material depending on their operating temperature. Examples of thermoelectric materials which may be used to make the thermoelectric material layers include: thermoelectric materials of a single element, such as bismuth or antimony; alloy-type thermoelectric materials, such as BiTe-type, PbTe-type and SiGe-type; and oxide-type thermoelectric materials, such as $Ca_xCoO_2$, $Na_xCoO_2$ and $SrTiO_3$. In the present specification, the "thermoelectric material" refers herein to a material, of which the Seebeck coefficient has an absolute value of 30 μV/K or more and the electrical resistivity is 10 mΩ cm or less. Such a thermoelectric material may be a crystalline one or an amorphous one. If the hot medium has a temperature of approximately 200 degrees Celsius or less, the thermoelectric material layers 22 may be made of a dense body of bismuth-antimony-tellurium, for example. Bismuth-antimony-tellurium may be, but does not have to be, represented by a chemical composition $Bi_{0.5}Sb_{1.5}Te_3$. Optionally, bismuth-antimony-tellurium may include a dopant such as selenium. The mole fractions of bismuth and antimony may be adjusted appropriately.

Other examples of the thermoelectric materials to make the thermoelectric material layers 22 include bismuth telluride and lead telluride. When the thermoelectric material layers 22 are made of bismuth telluride, it may be of the chemical composition $Bi_2Te_x$, where 2<X<4. A representative chemical composition of bismuth telluride is $Bi_2Te_3$, which may include antimony or selenium. The chemical composition of bismuth telluride including antimony may be represented by $(Bi_{1-Y}Sb_Y)_2Te_X$, where 0<Y<1, and more preferably 0.6<Y<0.9.

The first and second electrodes E1 and E2 may be made of any material as long as the material has good electrical conductivity. For example, the first and second electrodes E1 and E2 may be made of a metal selected from the group consisting of nickel, copper, silver, molybdenum, tungsten, aluminum, titanium, chromium, gold, platinum and indium. Alternatively, the first and second electrodes E1 and E2 may also be made of a nitrides or oxides, such as titanium nitride (TiN), indium tin oxide (ITO), and tin dioxide ($SnO_2$). Still alternatively, the first or second electrode E1, E2 may also be made of solder, silver solder or electrically conductive paste, for example. It should be noted that if both ends of the tube body Tb1 are metal layers 20, then the first and second electrodes E1 and E2 may be replaced with those metal layers 20 as described above.

In the foregoing description, an element with a configuration in which metal layers and thermoelectric material layers are alternately stacked one upon the other has been described as a typical example of a tubular thermoelectric generator. However, this is just an example, and the tubular thermoelectric generator which may be used according to the present disclosure does not need to have such a configuration. Rather electrical power can also be generated thermoelectrically as described above as long as a first layer made of a first material with a relatively low Seebeck coefficient and relatively high thermal conductivity and a second layer made of a second material with a relatively high Seebeck coefficient and relatively low thermal conductivity are stacked alternately one upon the other. That is to say, the metal layer 20 and thermoelectric material layer 22 are only examples of such first and second layers, respectively.

<Implementation of Thermoelectric Generator Unit>

Figure 7A:
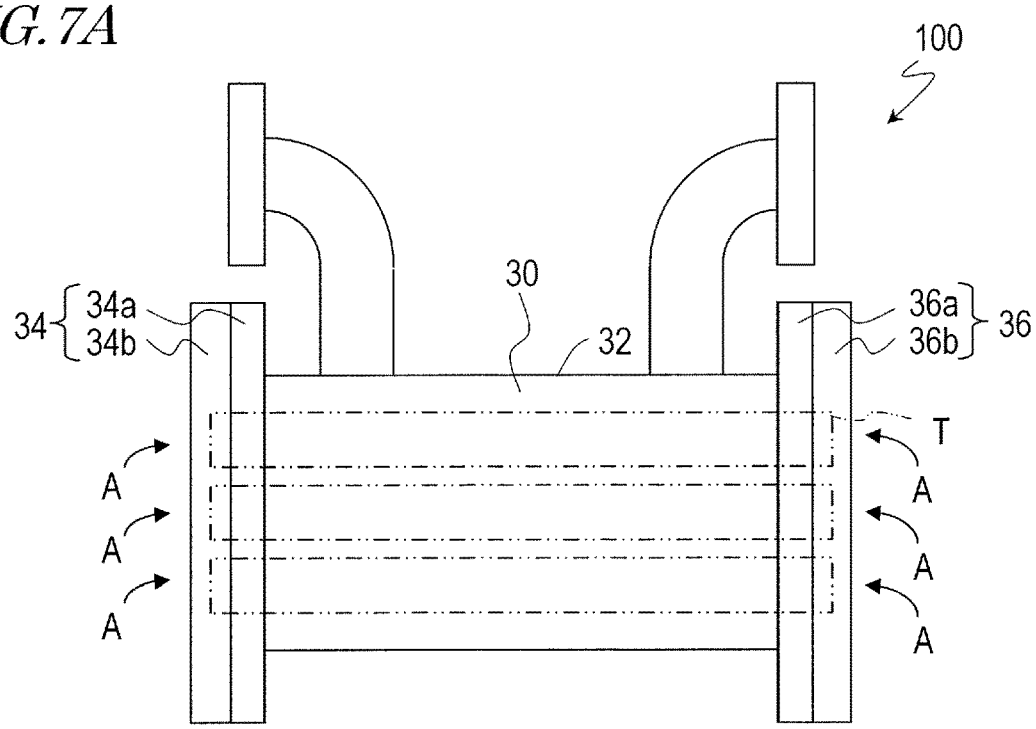
FIG. 7A is a front view illustrating an implementation of a thermoelectric generator unit that a thermoelectric generator system according to the present disclosure has.
Figure 7B:
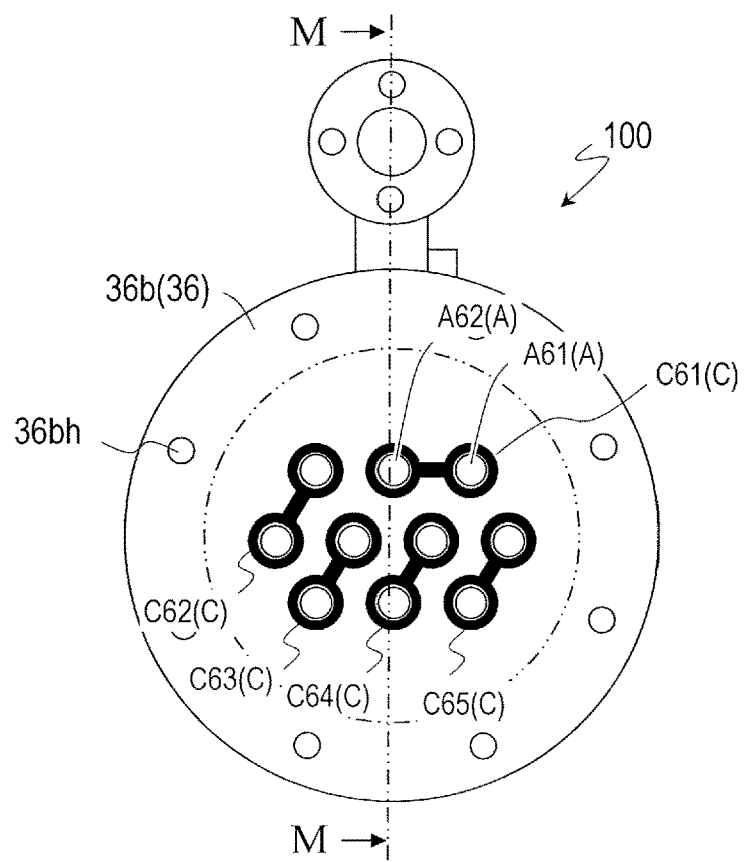
FIG. 7B illustrates one of the side surfaces of the thermoelectric generator unit 100 (a right side view in this case).

Next, look at FIGS. 7A and 7B. FIG. 7A is a front view illustrating an implementation of a thermoelectric generator unit that the thermoelectric generator system according to the present disclosure has, and FIG. 7B illustrates one of the side surfaces of the thermoelectric generator unit 100 (a right side view in this case). As shown in FIG. 7A, the thermoelectric generator unit 100 according to this implementation includes a number of tubular thermoelectric generators T and a container 30 which houses those tubular thermoelectric generators T inside. At a glance, such a structure looks like the "shell and tube structure" of a heat exchanger. In a heat exchanger, however, a number of tubes just function as pipelines to make fluid flow through and do not have to be electrically connected together. In a thermoelectric generator system according to the present disclosure, on the other hand, those tubular thermoelectric generators need to be electrically connected together in practice with good stability, unlike the heat exchanger.

As already described with reference to FIG. 4, a hot medium and a cold medium are supplied to the thermoelectric generator unit 100. The hot medium may be supplied into the respective internal flow paths of the tubular thermoelectric generators T1 to T10 through multiple openings A, for example. Meanwhile, the cold medium is supplied into the container 30 through a fluid inlet port 38a to be described later. As a result, a temperature difference is created between the outer and inner peripheral surfaces of each tubular thermoelectric generator T. In this case, in the thermoelectric generator unit 100, not only heat is exchanged between the hot and cold media but also electromotive force occurs in the axial direction in each of the tubular thermoelectric generators T1 to T10.

In this embodiment, the container 30 includes a cylindrical shell 32 which surrounds the tubular thermoelectric generators T and a pair of plates 34 and 36 which are arranged to close the open ends of the shell 32. More specifically, the plates 34 and 36 are respectively fixed onto the left and right ends of the shell 32. Each of these plates 34 and 36 has multiple openings A into which respective tubular thermoelectric generators T are inserted. Both ends of an associated tubular thermoelectric generator T are inserted into each corresponding pair of openings A of the plates 34 and 36.

Just like the tube sheets of a shell and tube heat exchanger, these plates 34 and 36 have the function of supporting a plurality of tubes (i.e., the tubular thermoelectric generators T) so that these tubes are spatially separated from each other. However, as will be described in detail later, the plates 34 and 36 of this embodiment have an electrical connection capability that the tube sheets of a heat exchanger do not have.

In the example illustrated in FIG. 7A, the plate 34 includes a first plate portion 34a fixed to the shell 32 and a second plate portion 34b which is attached to the first plate portion 34a so as to be readily removable from the first plate portion 34a. Likewise, the plate 36 also includes a first plate portion 36a fixed to the shell 32 and a second plate portion 36b which is attached to the first plate portion 36a so as to be readily removable from the first plate portion 36a. The openings A in the plates 34 and 36 penetrate through, respectively, the first plate portions 34a and 36a and the second plate portions 34b and 36b, thus leaving the flow paths of the thermoelectric generation tubes T open to the exterior of the container 30.

Examples of materials to make the container 30 include metals such as stainless steel, HASTELLOY™ or INCONEL™. Examples of other materials to make the container 30 include polyvinyl chloride and acrylic resin. The shell 32 and the plates 34, 36 may be made of the same material or may be made of two different materials. If the shell 32 and the first plate portions 34a and 36a are made of metal(s), then the first plate portions 34a and 36a may be welded onto the shell 32. Or if flanges are provided at both ends of the shell 32, the first plate portions 34a and 36a may be fixed onto those flange portions.

Since some fluid (that is either the cold medium or hot medium) is introduced into the container 30 while the thermoelectric generator unit 100 is operating, the inside of the container 30 should be kept either airtight or watertight. As will be described later, each opening A of the plates 34, 36 is sealed to keep the inside of the container 30 either airtight or watertight once the ends of the tubular thermoelectric generator T have been inserted through the opening A. A structure in which no gap is left between the shell 32 and the plates 34, 36 and which is kept either airtight or watertight throughout the operation is realized.

As shown in FIG. 7B, ten openings A have been cut through the plate 36. Likewise, ten openings A have also been cut through the other plate 34. In the example illustrated in FIGS. 7A and 7B, each opening A of the plate 34 and its associated opening A of the plate 36 are arranged mirror-symmetrically to each other, and ten lines which connect together the respective center points of ten pairs of associated openings A are parallel to each other. According to such a configuration, the respective tubular thermoelectric generators T may be supported parallel to each other through the pairs of associated openings A. Nevertheless, those tubular thermoelectric generators T do not have to be arranged parallel to each other inside the container 30 but may also be arranged either non-parallel or skew to each other.

As shown in FIG. 7B, the plate 36 has channels C, each of which has been formed to connect together at least two of the openings A cut through the plate 36 and will sometimes be referred to as a "interconnections" hereinbelow. In the example illustrated in FIG. 7B, the channel C61 connects together openings A61 and A62. Each of the other channels C62 to C65 also connects together two associated ones of the openings A in the plate 36. As will be described later, an electrically conductive member is housed in each of these channels C61 to C65.

Figure 8:
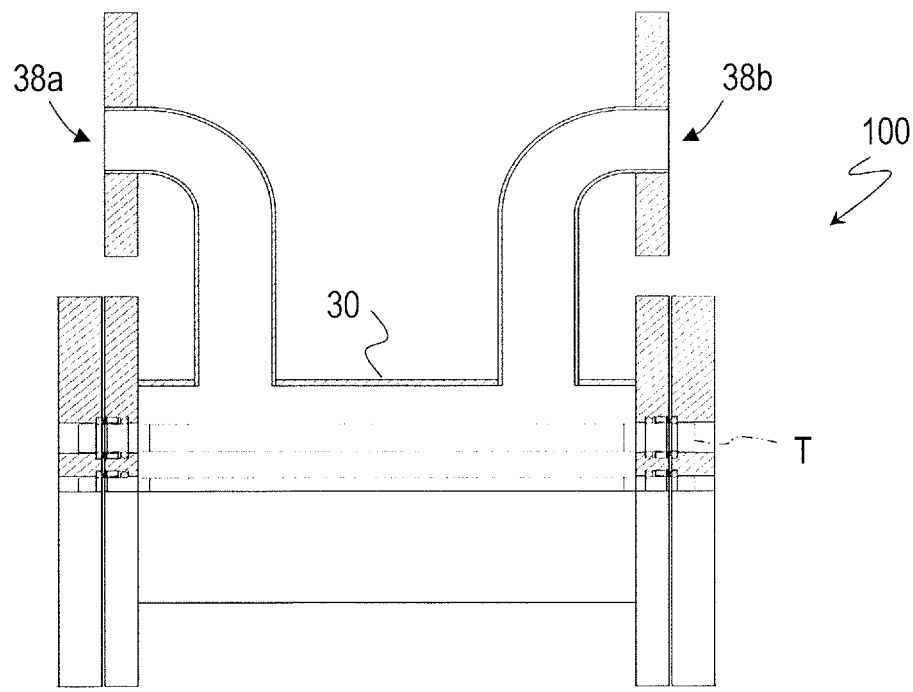
FIG. 8 schematically illustrates a portion of a cross section of the thermoelectric generator unit 100 as viewed on the plane M-M shown in FIG. 7B.

FIG. 8 schematically illustrates a portion of a cross section of the thermoelectric generator unit 100 as viewed on the plane M-M shown in FIG. 7B. It should be noted that in FIG. 8, a cross section of the lower half of the container 30 is not shown but its front portion is shown instead. As shown in FIG. 8, the container 30 has a fluid inlet port 38a and a fluid outlet port 38b through which a fluid flows inside the container 30. In this thermoelectric generator unit 100, the fluid inlet and outlet ports 38a and 38b are arranged in the upper part of the container 30. However, the fluid inlet port 38a does not have to be arranged in the upper part of the container 30 but may also be arranged in the lower part of the container 30 as well. The same can be said about the fluid outlet port 38b. The fluid inlet and outlet ports 38a and 38b do not always have to be used as inlet and outlet for a fluid but may be inverted at regular or irregular intervals. That is to say, the fluid flow direction does not have to be fixed. Also, although only one fluid inlet port 38a and only one fluid outlet port 38b are shown in FIG. 8, this is only an example, and more than one fluid inlet port 38a and/or more than one fluid outlet port 38b may be provided as well.

Figure 9:
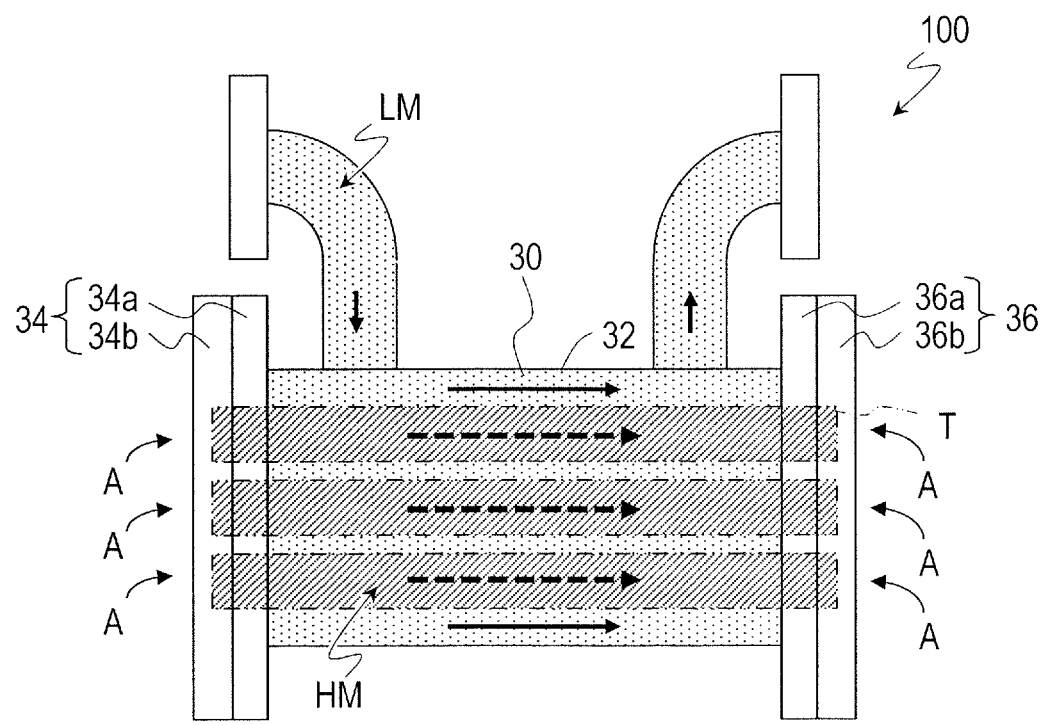
FIG. 9 schematically shows exemplary flow directions of the hot and cold heat transfer media introduced into the thermoelectric generator unit 100.

FIG. 9 schematically shows exemplary flow directions of the hot and cold media introduced into the thermoelectric generator unit 100. In the example shown in FIG. 9, a hot medium HM is supplied into the internal flow path of each of the tubular thermoelectric generators T1 to T10, while a cold medium LM is supplied into the container 30. In this example, the hot medium HM is introduced into the internal flow path of each tubular thermoelectric generator through the openings A cut through the plate 34. The hot medium HM introduced into the internal flow path of each tubular thermoelectric generator contacts with the inner peripheral surface of the tubular thermoelectric generator. On the other hand, the cold medium LM is introduced into the container 30 through the fluid inlet port 38a. The cold medium LM introduced into the container 30 contacts with the outer peripheral surface of each tubular thermoelectric generator.

In the example shown in FIG. 9, while flowing through the internal flow path of each tubular thermoelectric generator, the hot medium HM exchanges heat with the cold medium LM. The hot medium HM, of which the temperature has decreased through heat exchange with the cold medium LM, is discharged out of the thermoelectric generator unit 100 through the openings A of the plate 36. On the other hand, while flowing inside the container 30, the cold medium LM exchanges heat with the hot medium HM. The cold medium LM, of which the temperature has increased through heat exchange with the hot medium HM, is discharged out of the thermoelectric generator unit 100 through the fluid outlet port 38*b*. The flow directions of the hot and cold media HM and LM shown in FIG. 9 are only an example. One or both of the hot and cold media HM and LM may flow from the right to the left on the paper.

In one implementation, the hot medium HM (e.g., hot water) may be introduced into the flow path of each tubular thermoelectric generator T, and the cold medium LM (e.g., cooling water) may be introduced through the fluid inlet port 38*a* to fill the inside of the container 30 with the cold medium LM. Conversely, the cold medium LM (e.g., cooling water) may be introduced into the flow path of each tubular thermoelectric generator T, and the hot medium HM (e.g., hot water) may be introduced through the fluid inlet port 38*a* to fill the inside of the container 30 with the hot medium HM. In this manner, a temperature difference which is large enough to generate electric power can be created between the outer and inner peripheral surfaces 24 and 26 of each tubular thermoelectric generator T.

<Implementations of Sealing from Fluids and Electrical Connection Between Tubular Thermoelectric Generators>

Figure 10:
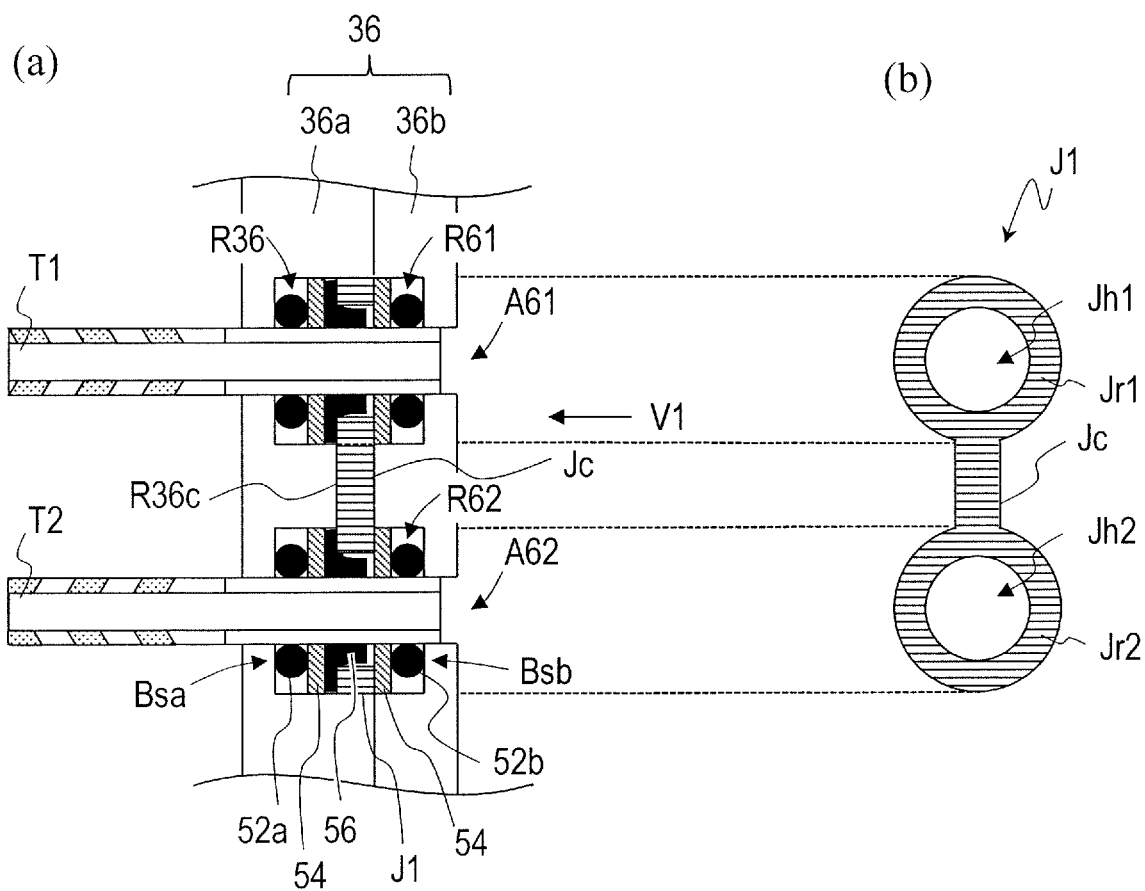
FIG. 10 schematically illustrates a cross section of a portion of a plate 36 and the appearance of an electrically conductive member J1.

Portion (a) of FIG. 10 schematically illustrates a partial cross-sectional view of the plate 36. Specifically, portion (a) of FIG. 10 schematically illustrates a cross section of the plate 36 as viewed on a plane including the respective center axes of both of two tubular thermoelectric generators T1 and T2. More specifically, portion (a) of FIG. 10 illustrates the structure of openings A61 and A62 of multiple openings A that the plate 36 has and a region surrounding them. Portion (b) of FIG. 10 schematically illustrates the appearance of an electrically conductive member J1 as viewed in the direction indicated by the arrow V1 in portion (a) of FIG. 10. This electrically conductive member J1 has two through holes Jh1 and Jh2. In detail, this electrically conductive member J1 includes a first ring portion Jr1 with the through hole Jh1, a second ring portion Jr2 with the through hole Jh2, and a connecting portion Jc to connect these two ring portions Jr1 and Jr2 together.

As shown in portion (a) of FIG. 10, one end of the tubular thermoelectric generator T1 (on the second electrode side) is inserted into the opening A61 of the plate 36 and one end of the tubular thermoelectric generator T2 (on the first electrode side) is inserted into the opening A62. In this state, those ends of the tubular thermoelectric generators T1 and T2 are respectively inserted into the through holes Jh1 and Jh2 of the electrically conductive member J1. That end of the tubular thermoelectric generator T1 (on the second electrode side) and that of the tubular thermoelectric generator T2 (on the first electrode side) are electrically connected together via this electrically conductive member J1. In the present specification, an electrically conductive member to connect two tubular thermoelectric generators electrically together will be hereinafter referred to as a "connection plate".

It should be noted that the first and second ring portions Jr1 and Jr2 do not need to have an annular shape. As long as electrical connection is established between the tubular thermoelectric generators, the through hole Jh1 or Jh2 may also have a circular, elliptical or polygonal shape as well. For example, the shape of the through hole Jh1 or Jh2 may be different from the cross-sectional shape of the first or second electrode E1 or E2 as viewed on a plane that intersects with the axial direction at right angles. In the present specification, the "ring" shape includes not only an annular shape but other shapes as well.

In the example illustrated in portion (a) of FIG. 10, the first plate portion 36*a* has a recess R36 which has been cut for the openings A61 and A62. This recess R36 includes a groove portion R36*c* to connect the openings A61 and A62 together. The connecting portion Jc of the electrically conductive member J1 is located in this groove portion R36*c*. On the other hand, recesses R61 and R62 have been cut in the second plate portion 36*b* for the openings A61 and A62, respectively. In this example, various members to establish sealing and electrical connection are arranged inside the space formed by these recesses R36, R61 and R62. That space forms a channel C61 to house the electrically conductive member J1 and the openings A61 and A62 are connected together via the channel C61.

In the example illustrated in portion (a) of FIG. 10, not only the electrically conductive member J1 but also a first O-ring 52*a*, washers 54, an electrically conductive ring member 56 and a second O-ring 52*b* are housed in the channel C61. The respective ends of the tubular thermoelectric generators T1 and T2 go through the holes of these members. The first O-ring 52*a* arranged closest to the shell 32 of the container 30 is in contact with the seating surface Bsa that has been formed in the first plate portion 36*a* and establishes sealing so as to prevent a fluid that has been supplied into the shell 32 from entering the channel C61. On the other hand, the second O-ring 52*b* arranged most distant from the shell 32 of the container 30 is in contact with a seating surface Bsb that has been formed in the second plate portion 36*b* and establishes sealing so as to prevent a fluid located outside of the second plate portion 36*b* from entering the channel C61.

The O-rings 52*a* and 52*b* are annular seal members with an O (i.e., circular) cross section. The O-rings 52*a* and 52*b* may be made of rubber, metal or plastic, for example, and have the function of preventing a fluid from leaking out, or flowing into, through a gap between the members. In portion (a) of FIG. 10, there is a space which communicates with the flow paths of the respective tubular thermoelectric generators T on the right-hand side of the second plate portion 36*b* and there is a fluid (the hot or cold medium in this example) in that space. According to this embodiment, by using the members shown in FIG. 10, electrical connection between the tubular thermoelectric generators T and sealing from the fluids (the hot and cold media) are established. The structure and function of the electrically conductive ring member 56 will be described in detail later.

The same members as the ones described for the plate 36 are provided for the plate 34, too. Although the respective openings A of the plates 34 and 36 are arranged mirror symmetrically, the groove portions connecting any two openings A together on the plate 34 are not arranged mirror symmetrically with the groove portions connecting any two openings A together on the plate 36. If the arrangement patterns of the electrically conductive members to electrically connect the tubular thermoelectric generators T together on the plates 34 and 36, were mirror symmetric to each other, then those tubular thermoelectric generators T could not be connected together in series.

If a plate (such as the plate 36) fixed onto the shell 32 includes first and second plate portions (36*a* and 36*b*) as in this embodiment, each of the multiple openings A cut through the first plate portion (36a) has a first seating surface (Bsa) associated therewith to receive the first O-ring 52a, and each of the multiple openings A cut through the second plate portion (36b) has a second seating surface (Bsb) to receive the second O-ring 52b. However, the plates 34 and 36 do not need to have the configuration shown in FIG. 10 and the plate 36 does not have to be divided into the first and second plate portions 36a and 36b, either. If the electrically conductive member J1 is pressed by another member instead of the second plate portion 36b, the respective first O-rings 52a press against the first seating surface (Bsa) to establish sealing, too.

In the example shown in portion (a) of FIG. 10, the electrically conductive ring member 56 is interposed between the tubular thermoelectric generator T1 and the electrically conductive member J1. Likewise, another electrically conductive ring member 56 is interposed between the tubular thermoelectric generator T2 and the electrically conductive member J1, too.

The electrically conductive member J1 is typically made of a metal. Examples of materials to make the electrically conductive member J1 include copper (oxygen-free copper), brass and aluminum. The material may be plated with nickel or tin for anticorrosion purposes. As long as electrical connection is established between the electrically conductive member J (e.g., J1 in this example) and the tubular thermoelectric generators T (e.g., T1 and T2 in this example) inserted into the two through holes of the electrically conductive member J (e.g., Jh1 and Jh2 in this example), the electrically conductive member J may be partially coated with an insulator. That is to say, the electrically conductive member J may include a body made of a metallic material and an insulating coating which covers the surface of the body at least partially. The insulating coating may be made of a resin such as TEFLON™, for example. If the body of the electrically conductive member J is made of aluminum, the surface may be partially coated with an oxide skin as an insulating coating.

Figure 11A:
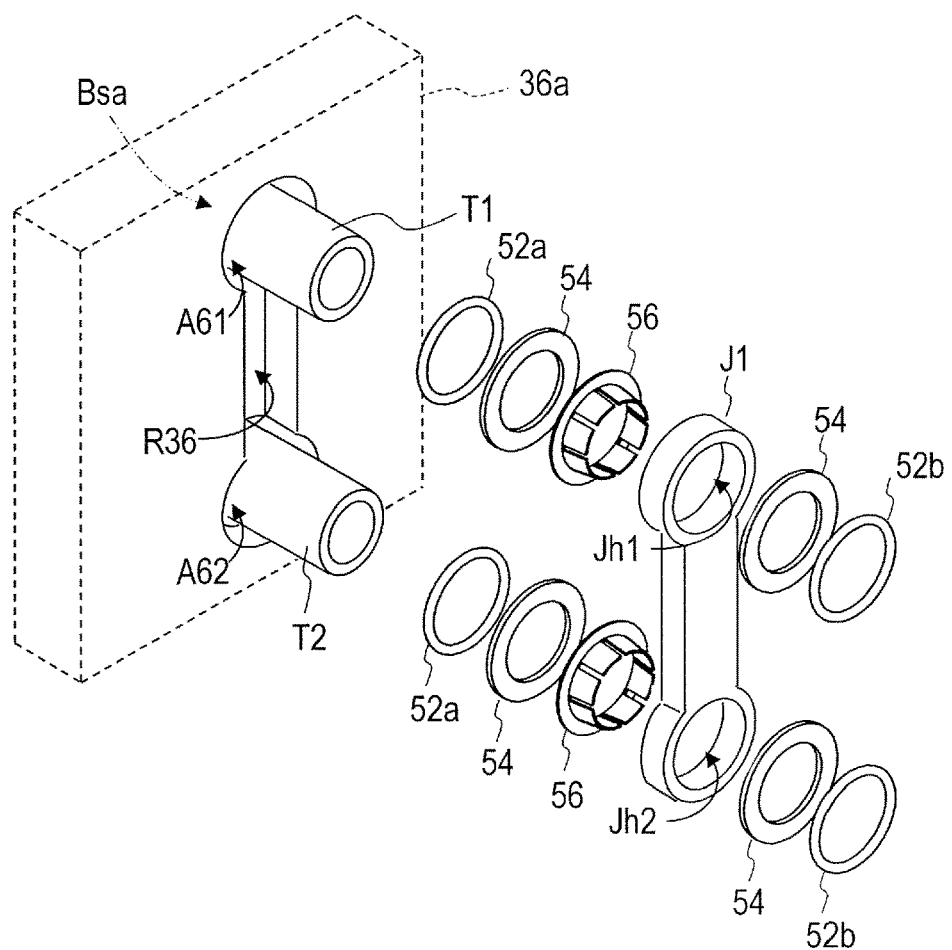
FIG. 11A is an exploded perspective view schematically illustrating the channel C61 to house the electrically conductive member J1 and its vicinity.

FIG. 11A is an exploded perspective view schematically illustrating the channel C61 to house the electrically conductive member J1 and its vicinity. As shown in FIG. 11A, the first O-rings 52a, electrically conductive ring members 56, electrically conductive member J1 and second O-rings 52b are inserted into the openings A61 and A62 from outside of the container 30. In this example, washers 54 are arranged between the first O-rings 52a and the electrically conductive ring members 56. Washers 54 may also be arranged between the electrically conductive member J1 and the second O-rings 52b. The washers 54 are inserted between the flat portions 56f of the electrically conductive ring members 56 to be described later and the O-rings 52a (or 52b).

Figure 11B:
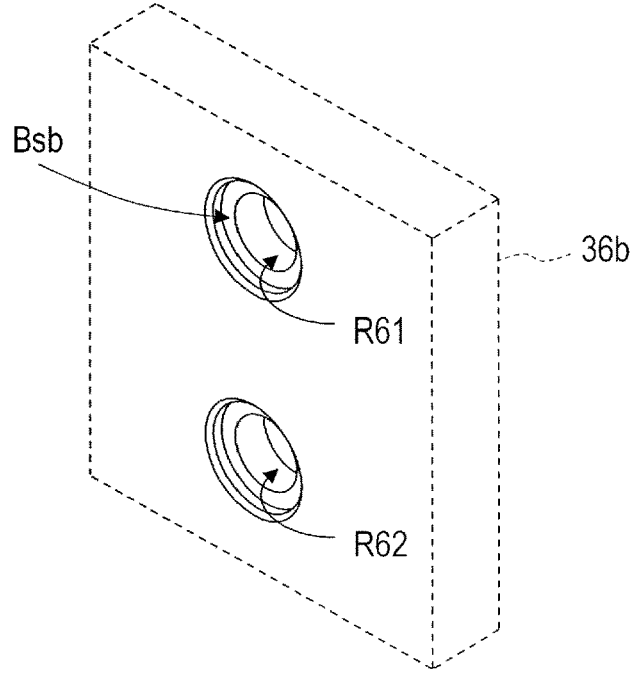
FIG. 11B is a perspective view schematically illustrating a portion of the sealing surface of the second plate portion 36b (i.e., the surface that faces the first plate portion 36a) associated with the openings A61 and A62.

FIG. 11B schematically illustrates a portion of the sealing surface of the second plate portion 36b (i.e., the surface that faces the first plate portion 36a) associated with the openings A61 and A62. As described above, the openings A61 and A62 of the second plate portion 36b each have a seating surface Bsb to receive the second O-ring 52b. That is why if the respective sealing surfaces of the first and second plate portions 36a and 36b are arranged to face each other and fastened together by flange connection, for example, the first O-rings 52a in the first plate portion 36a can be pressed against the seating surfaces Bsa. More specifically, the second seating surfaces Bsb press the first O-rings 52a against the seating surfaces Bsa through the second O-rings 52b, electrically conductive member J1 and electrically conductive ring members 56. In this manner, the electrically conductive member J1 can be sealed from the hot and cold media.

If the first and second plate portions 36a and 36b are made of an electrically conductive material such as a metal, then the sealing surfaces of the first and second plate portions 36a and 36b may be coated with an insulator material. Parts of the first and second plate portions 36a and 36b to contact with the electrically conductive member J during operation may be coated with an insulator so as to be electrically insulated from the electrically conductive member J. In one implementation, the sealing surfaces of the first and second plate portions 36a and 36b may be sprayed and coated with a fluoroethylene resin.

<Detailed Configuration for Electrically Conductive Ring Members>

A detailed configuration for the electrically conductive ring members 56 will be described with reference to FIGS. 12A and 12B.

Figure 12A:
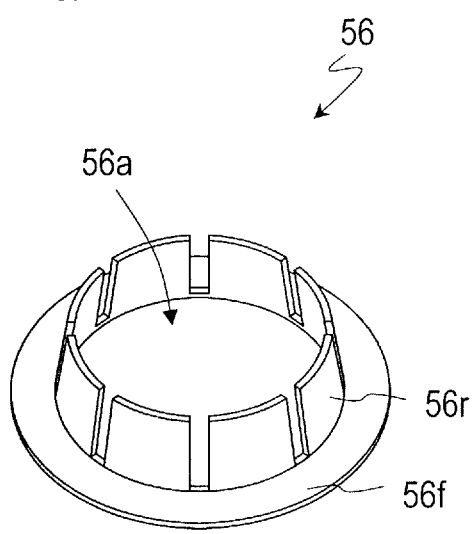
FIG. 12A is a perspective view illustrating an exemplary shape of the electrically conductive ring member 56.

FIG. 12A is a perspective view illustrating an exemplary shape of an electrically conductive ring member 56. The electrically conductive ring member 56 shown in FIG. 12A includes a ringlike flat portion 56f and a plurality of elastic portions 56r. The flat portion 56f has a through hole 56a. Those elastic portions 56r project from around the periphery of the through hole 56a of the flat portion 56f and are biased toward the center of the through hole 56a with elastic force. Such an electrically conductive ring member 56 can be made easily by patterning a single metallic plate (with a thickness of 0.1 mm to a few mm, for example). Likewise, the electrically conductive members J can also be made easily by patterning a single metallic plate (with a thickness of 0.1 mm to a few mm, for example).

An end (on the first or second electrode side) of an associated tubular thermoelectric generator T is inserted into the through hole 56a of each electrically conductive ring member 56. That is why the shape and size of the through hole 56a of the ringlike flat portion 56f are designed so as to match the shape and size of that end (on the first or second electrode side) of the tubular thermoelectric generator T.

Figure 13A:
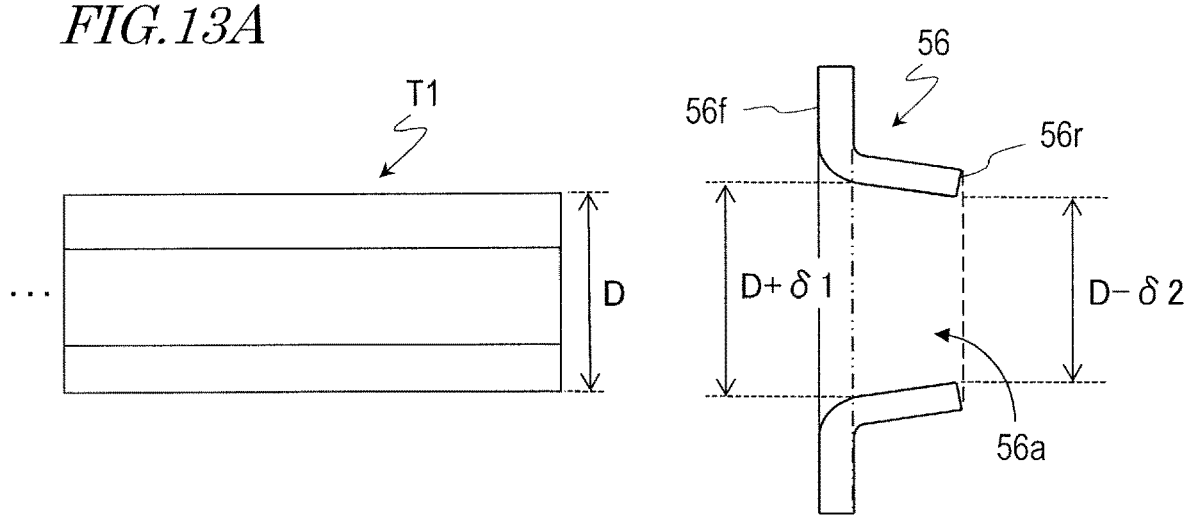
FIG. 13A is a cross-sectional view schematically illustrating the electrically conductive ring member 56 and tubular thermoelectric generator T1.
Figure 13B:
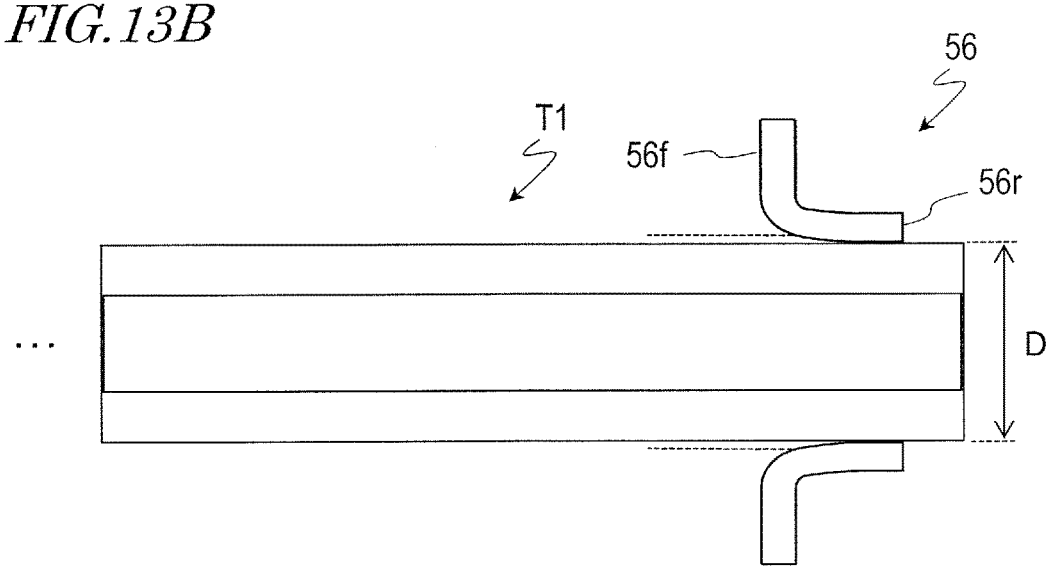
FIG. 13B is a cross-sectional view schematically illustrating a state where an end of the tubular thermoelectric generator T1 has been inserted into the electrically conductive ring member 56.
Figure 13C:
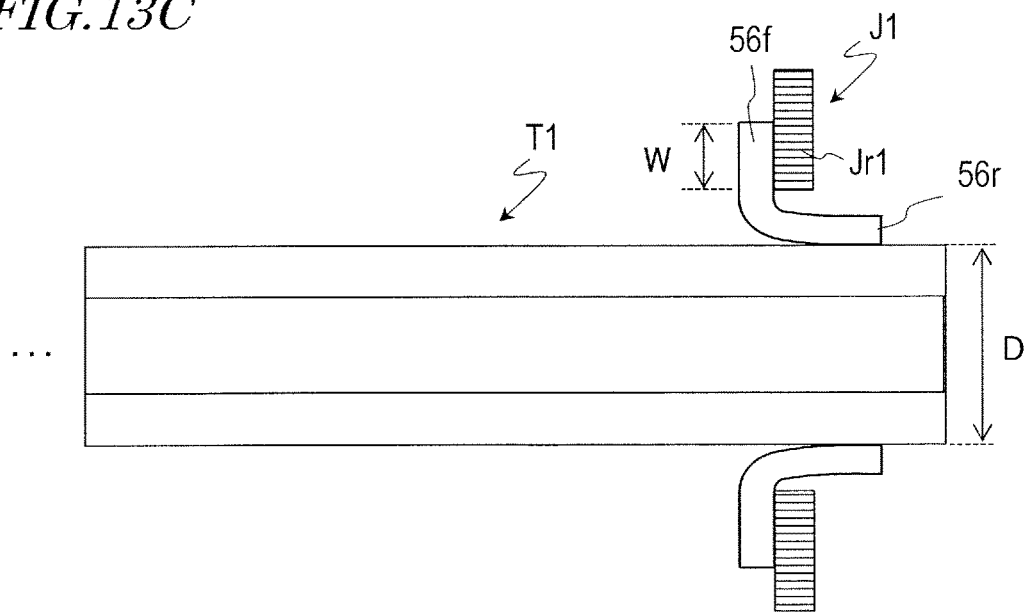
FIG. 13C is a cross-sectional view schematically illustrating a state where an end of the tubular thermoelectric generator T1 has been inserted into the electrically conductive ring member 56 and electrically conductive member J1.

Next, the shape of the electrically conductive ring member 56 will be described in further detail with reference to FIGS. 13A, 13B and 13C. FIG. 13A is a cross-sectional view schematically illustrating portions of the electrically conductive ring member 56 and tubular thermoelectric generator T1. FIG. 13B is a cross-sectional view schematically illustrating a state where an end of the tubular thermoelectric generator T1 has been inserted into the electrically conductive ring member 56. And FIG. 13C is a cross-sectional view schematically illustrating a state where an end of the tubular thermoelectric generator T1 has been inserted into the respective through holes of the electrically conductive ring member 56 and electrically conductive member J1. The cross sections illustrated in FIGS. 13A, 13B and 13C are viewed on a plane including the axis (i.e., the center axis) of the tubular thermoelectric generator T1.

Suppose the outer peripheral surface of the tubular thermoelectric generator T1 at that end (on the first or second electrode side) is a circular cylinder with a diameter D as shown in FIG. 13A. In that case, the through hole 56a of the electrically conductive ring member 56 is formed in a circular shape with a diameter D+δ1 (where δ1>1) so as to pass the end of the tubular thermoelectric generator T1. On the other hand, the respective elastic portions 56r have been formed so that biasing force is applied toward the center of the through hole 56a. The respective elastic portions 56r may be formed so as to be tilted toward the center of the through hole 56a as shown in FIG. 13A. That is to say, the elastic portions 56r have been shaped so as to be circumscribed with the outer peripheral surface of a circular cylinder, of which a cross section has a diameter that is smaller than D (and that is represented by D−δ2 (where δ2>0)) unless any external force is applied.

D+δ1>D>D−δ2 is satisfied. That is why when the end of the tubular thermoelectric generator T1 is inserted into the through hole 56a, the respective elastic portions 56r are brought into physical contact with the outer peripheral surface at the end of the tubular thermoelectric generator T1 as shown in FIG. 13B. In this case, since elastic force is applied to the respective elastic portions 56r toward the center of the through hole 56a, the respective elastic portions 56r press the outer peripheral surface at the end of the tubular thermoelectric generator T1 with the elastic force. In this manner, the outer peripheral surface of the tubular thermoelectric generator T1 inserted into the through hole 56a establishes stabilized physical and electrical contact with those elastic portions 56r.

Next, look at FIG. 13C. Inside the opening A cut through the plate 34, 36, the electrically conductive member J1 contacts with the flat portion 56f of the electrically conductive ring member 56. More specifically, when the end of the tubular thermoelectric generator T1 is inserted into the electrically conductive ring member 56 and electrically conductive member J1, the surface of the flat portion 56f of the electrically conductive ring member 56 contacts with the surface of the ring portion Jr1 of the electrically conductive member J1 as shown in FIG. 13C. As can be seen, in this embodiment, the electrically conductive ring member 56 and the electrically conductive member J1 may be electrically connected together by bringing their planes into contact with each other. Since the electrically conductive ring member 56 and the electrically conductive member J1 contact with each other on their planes, a contact area which is large enough to make the electric current generated in the tubular thermoelectric generator T1 flow can be secured. The width W of the flat portion 56f is set appropriately to secure a contact area which is large enough to make the electric current generated in the tubular thermoelectric generator T1 flow. As long as a contact area can be secured between the electrically conductive ring member 56 and the electrically conductive member J1, either the surface of the flat portion 56f or the surface of the ring portion Jr1 of the electrically conductive member J1 may have some unevenness. For example, an even larger area of contact can be secured by making the surface of the ring portion Jr1 of the electrically conductive member J1 have an embossed pattern matching the one on the surface of the flat portion 56f.

Figure 14A:
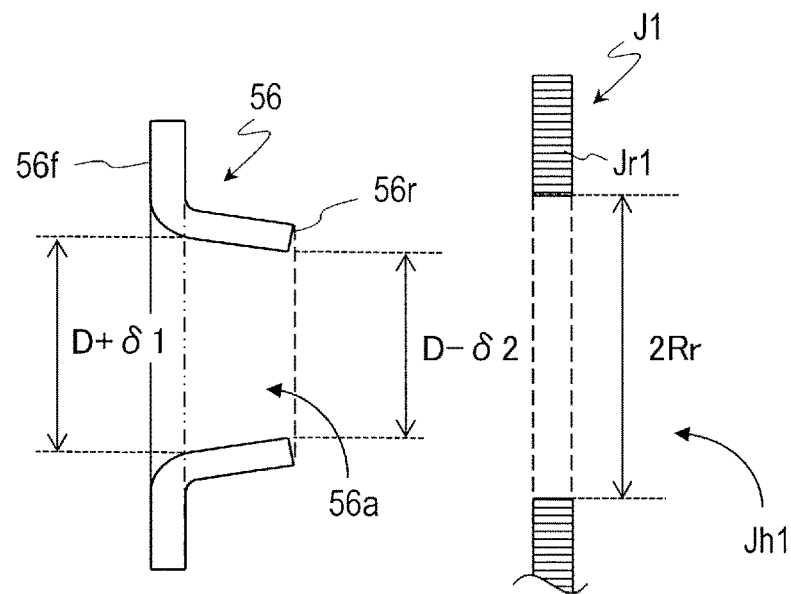
FIG. 14A is a cross-sectional view schematically illustrating the electrically conductive ring member 56 and a portion of the electrically conductive member J1.
Figure 14B:
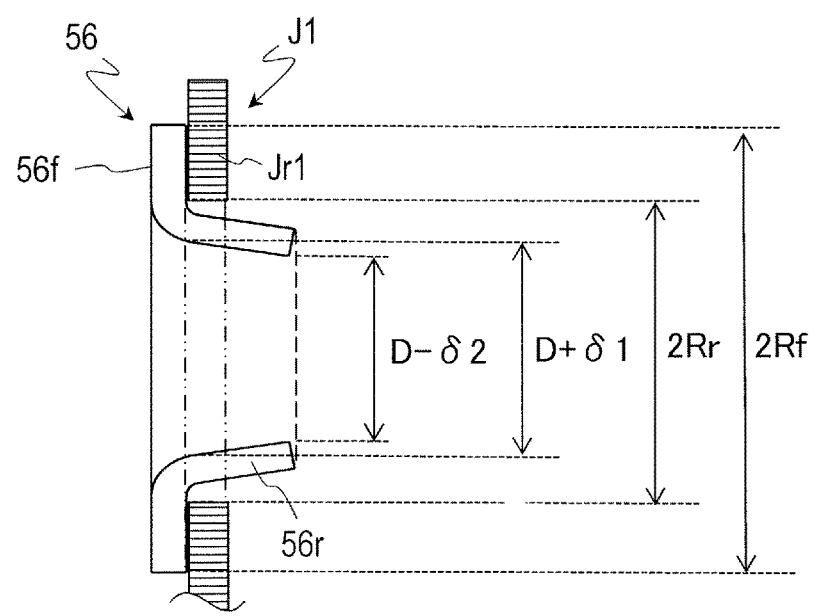
FIG. 14B is a cross-sectional view schematically illustrating a state where the elastic portions 56r of the electrically conductive ring member 56 have been inserted into the through hole Jh1 of the electrically conductive member J1.

Next, look at FIGS. 14A and 14B. FIG. 14A is a cross-sectional view schematically illustrating the electrically conductive ring member 56 and a portion of the electrically conductive member J1. FIG. 14B is a cross-sectional view schematically illustrating a state where the elastic portions 56r of the electrically conductive ring member 56 have been inserted into the through hole Jh1 of the electrically conductive member J1. The cross sections shown in FIGS. 14A and 14B are obtained by viewing the electrically conductive ring member 56 and the electrically conductive member J1 on a plane including the axis (center axis) of the tubular thermoelectric generator T1.

If the diameter of the through hole (e.g., Jh1 in this case) of the electrically conductive member J is supposed to be 2Rr, the through hole of the electrically conductive member J is formed to satisfy D<2Rr (i.e., so as to pass the end of the tubular thermoelectric generator T1 through itself). Also, if the diameter of the flat portion 56f of the electrically conductive ring member 56 is supposed to be 2Rf, the through hole of the electrically conductive member J is formed to satisfy 2Rr<2Rf so that the respective surfaces of the flat portion 56f and ring portion Jr1 contact with each other just as intended.

Figure 15:
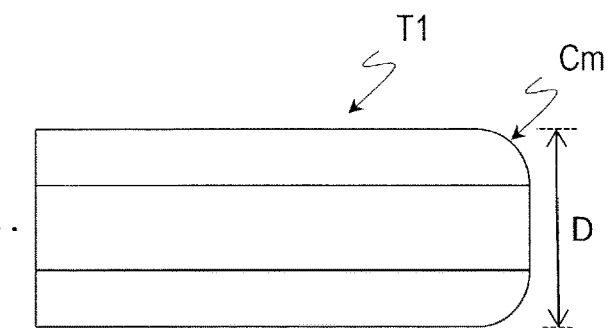
FIG. 15 is a cross-sectional view illustrating an exemplary tubular thermoelectric generator T with a chamfered portion Cm at its end.

Optionally, the end of the tubular thermoelectric generator T may have a chamfered portion Cm as shown in FIG. 15. The reason is that when the end of the tubular thermoelectric generator T (e.g., tubular thermoelectric generator T1) is inserted into the through hole 56a of the electrically conductive ring member 56, the elastic portions 56r of the electrically conductive ring member 56 and the end of the tubular thermoelectric generator T contact with each other, thus possibly getting the end of the tubular thermoelectric generator T damaged. However, by providing such a chamfered portion Cm at the end of the tubular thermoelectric generator T, such damage that could be done on the end of the tubular thermoelectric generator T due to the contact between the elastic portions 56r and the end of the tubular thermoelectric generator T can be avoided. And by avoiding the occurrence of the damage on the end of the tubular thermoelectric generator T, the electrically conductive member J can be sealed more securely from the hot and cold media. In addition, electrical contact failure between the outer peripheral surface of the tubular thermoelectric generator T and the elastic portions 56r can also be reduced. The chamfered portion Cm may have the curved surface as shown in FIG. 15 or may also have a planar surface.

In this manner, the electrically conductive member J1 is electrically connected to the outer peripheral surface at the end of the tubular thermoelectric generator T via the electrically conductive ring member 56. According to this embodiment, by fastening the first and second plate portions 36a and 36b together, the flat portion 56f of the electrically conductive ring member 56 and the electrically conductive member J can make electrical contact with each other with good stability and sealing described above can be established.

Furthermore, by arranging the electrically conductive ring member 56 with respect to the end of the tubular thermoelectric generator T, the electrically conductive member J1 can be sealed more tightly. As described above, the first O-ring 52a is pressed against the seating surface Bsa via the electrically conductive member J1 and the electrically conductive ring member 56. In this case, the electrically conductive ring member 56 has the flat portion 56f. That is to say, the pressure is applied to the first O-ring 52a through the flat portion 56f of the electrically conductive ring member 56. That is to say, since the electrically conductive ring member 56 has the flat portion 56f, the pressure can be applied evenly to the first O-ring 52a. As a result, the first O-ring 52a can be pressed against the seating surface Bsa firmly enough to get sealing done just as intended from the fluid in the container. In the same way, proper pressure can also be applied to the second O-ring 52b, and therefore, sealing can be done from the fluid outside of the container, too.

Next, it will be described how the electrically conductive ring member 56 may be fitted into the tubular thermoelectric generator T.

First of all, as shown in FIG. 11A, the respective ends of the tubular thermoelectric generators T1 and T2 are inserted into the openings A61 and A62 of the first plate portion 36a. After that, the first O-rings 52a (and the washers 54 if necessary) are fitted into the tubular thermoelectric generators through their tip ends and pushed deeper into the openings A61 and A62. Next, the electrically conductive ring members 56 are fitted into the tubular thermoelectric generators through their tip ends and pushed deeper into the openings A61 and A62. Subsequently, the electrically conductive member J1 (and the washers 54 and second O-rings 52b if necessary) is/are fitted into the tubular thermoelectric generators through their tip ends and pushed deeper into the openings A61 and A62. Finally, the sealing surface of the second plate portion 36b is arranged to face the first plate portion 36a and the first and second plate portions 36a and 36b are fastened together by flange connection, for example, so that the respective tip ends of the tubular thermoelectric generators are inserted into the openings of the second plate portion 36b. In this case, the first and second plate portions 36a and 36b may be fastened together with bolts and nuts through the holes 36bh cut through the second plate portion 36b (shown in FIG. 7B) and the holes cut through the first plate portion 36a.

The electrically conductive ring member 56 is not connected permanently to, and is readily removable from, the tubular thermoelectric generator T. For example, when the tubular thermoelectric generator T is replaced with a new tubular thermoelectric generator T, to remove the electrically conductive ring member 56 from the tubular thermoelectric generator T, the operation of fitting the electrically conductive ring members 56 into the tubular thermoelectric generators T may be performed in reverse order. The electrically conductive ring member 56 may be used a number of times (i.e., is recyclable) or replaced with a new one.

The electrically conductive ring member 56 does not always need to have the exemplary shape shown in FIG. 12A. The ratio of the width of the flat portion 56f (as measured radially) to the radius of the through hole 56a may also be defined arbitrarily. The respective elastic portions 56r may have any of various shapes and the number of the elastic portions 56r to provide may be set arbitrarily, too.

Figure 12B:
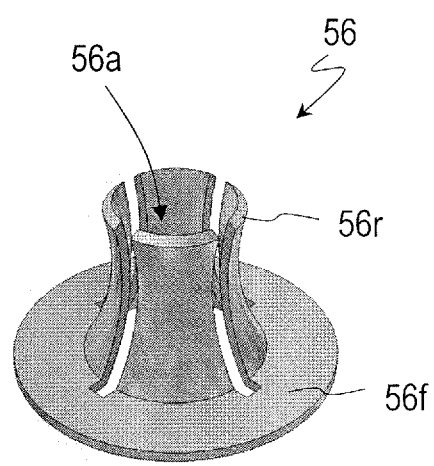
FIG. 12B is a perspective view illustrating another exemplary shape of the electrically conductive ring member 56.

FIG. 12B is a perspective view illustrating another exemplary shape of the electrically conductive ring member 56. The electrically conductive ring member 56 shown in FIG. 12B also has a ringlike flat portion 56f and a plurality of elastic portions 56r. The flat portion 56f has a through hole 56a. Each of the elastic portions 56r projects from around the through hole 56a of the flat portion 56f and is biased toward the center of the through hole 56a with elastic force. In this example, the number of the elastic portions 56r to provide is four. The number of the elastic portions 56r may be two but is suitably three or more. For example, six or more elastic portions 56r may be provided.

It should be noted that according to such an arrangement in which the flat-plate electrically conductive member J is brought into contact with the flat portion 56f of the electrically conductive ring member 56, some gap (or clearance) may be left between the through hole inside the ring portion of the electrically conductive member J and the tubular thermoelectric generator to be inserted into the hole. Thus, even if the tubular thermoelectric generator is made of a brittle material, the tubular thermoelectric generator can also be connected with good stability without allowing the ring portion Jr1 of the electrically conductive member J to do damage on the tubular thermoelectric generator.

<Electrical Connection Via Connection Plate>

As described above, the electrically conductive member (connection plate) is housed inside the channel C which has been cut to interconnect at least two of the openings A that have been cut through the plate 36. Note that the respective ends of the two tubular thermoelectric generators may be electrically connected together without the electrically conductive ring members 56. In other words, the electrically conductive ring members 56 may be omitted from the channel C. In that case, the respective ends of the two tubular thermoelectric generators may be electrically connected together via an electric cord, a conductor bar, or electrically conductive paste, for example. If the ends of the two tubular thermoelectric generators are electrically connected together via an electric cord, those ends of the tubular thermoelectric generators and the cord may be electrically connected together by soldering, crimping or crocodile-clipping, for example.

However, by electrically connecting the respective ends of the two tubular thermoelectric generators via the electrically conductive member that is housed in the channel C as shown in FIGS. 10, 11A and 11B, the respective ends of the tubular thermoelectric generators T and the electrically conductive member J1 can be electrically connected together more stably. If the electrically conductive member J has a flat plate shape (e.g., if the connecting portion Jc has a broad width), the electrical resistance between the two tubular thermoelectric generators can be reduced compared to a situation where an electric cord is used. In addition, since no terminals are fixed onto the ends of the tubular thermoelectric generators T, the tubular thermoelectric generators T can be replaced easily. Alternatively, with the electrically conductive ring members 56, the respective ends of the two tubular thermoelectric generators can be not only fixed to each other but also electrically connected together.

In the thermoelectric generator unit 100, the plate 34 or 36 has the channel C which has been cut to connect together at least two of the openings A, and therefore, electrical connecting function which has never been provided by any tube sheet for a heat exchanger is realized. In addition, since the thermoelectric generator unit 100 can be configured so that the first and second O-rings 52a and 52b press the seating surfaces Bsa and Bsb, respectively, sealing can be established so that either airtight or watertight condition is maintained with the ends of the tubular thermoelectric generators T inserted. As can be seen, by providing the channel C for the plate 34 or 36, even in an implementation in which the electrically conductive ring members 56 are omitted, the ends of the two tubular thermoelectric generators can also be electrically connected together and sealing from the fluids (e.g., the hot and cold media) can also be established.

<Relation Between Direction of Flow of Heat and Tilt Direction of Planes of Stacking>

Now, the relation between the direction of flow of heat in each thermoelectric generation tube T and the tilt direction of the planes of stacking in the thermoelectric generation tube T will be described with reference to FIGS. 16A and 16B.

Figure 16A:
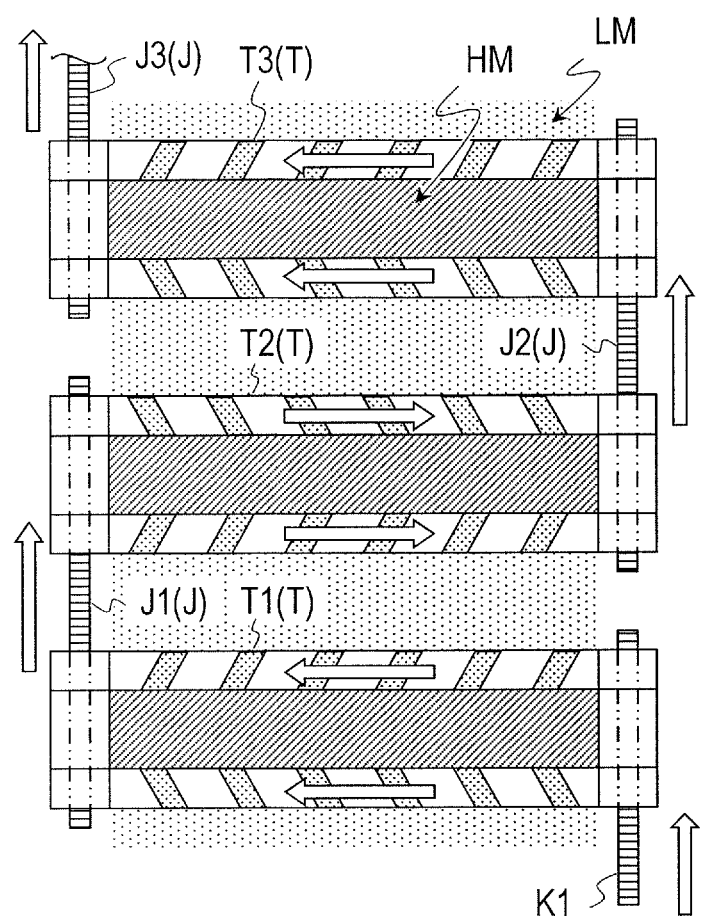
FIG. 16A schematically illustrates how electric current flows in tubular thermoelectric generators T which are electrically connected together in series.

FIG. 16A schematically illustrates how electric current flows in tubular thermoelectric generators T which are electrically connected together in series. FIG. 16A schematically illustrates cross sections of three (T1 to T3) of the tubular thermoelectric generators T1 to T10.

In FIG. 16A, an electrically conductive member (terminal plate) K1 is connected to one end of the tubular thermoelectric generator T1 (e.g., at the first electrode end), while an electrically conductive member (connection plate) J1 is connected to the other end (e.g., at the second electrode end) of the tubular thermoelectric generator T1. The electrically conductive member J1 is also connected to one end (i.e., at the first electrode end) of the tubular thermoelectric generator T2. As a result, the tubular thermoelectric generators T1 and T2 are electrically connected together. Furthermore, the other end (i.e., at the second electrode end) of the tubular thermoelectric generator T2 and one end (i.e., at the first electrode end) of the tubular thermoelectric generator T3 are electrically connected together via the electrically conductive member J2.

In this case, as shown in FIG. 16A, the tilt direction of the planes of stacking in the tubular thermoelectric generator T1 is opposite from the tilt direction of the planes of stacking in the tubular thermoelectric generator T2. Likewise, the tilt direction of the planes of stacking in the tubular thermoelectric generator T2 is opposite from the tilt direction of the planes of stacking in the tubular thermoelectric generator T3. That is to say, in this thermoelectric generator unit 100, each of the tubular thermoelectric generator T1 to T10 has planes of stacking that is tilted in the opposite direction from those of an adjacent one of the tubular thermoelectric generators that is connected to itself via a connection plate.

Suppose the hot medium HM has been brought into contact with the inner peripheral surface of each of the tubular thermoelectric generators T1 to T3, and the cold medium LM has been brought into contact with their outer peripheral surface, as shown in FIG. 16A. In that case, in the tubular thermoelectric generator T1, electric current flows from the right to the left on the paper, for example. On the other hand, in the tubular thermoelectric generator T2, of which the planes of stacking are tilted in the opposite direction from those of the tubular thermoelectric generator T1, electric current flows from the left to the right on the paper.

Figure 17:
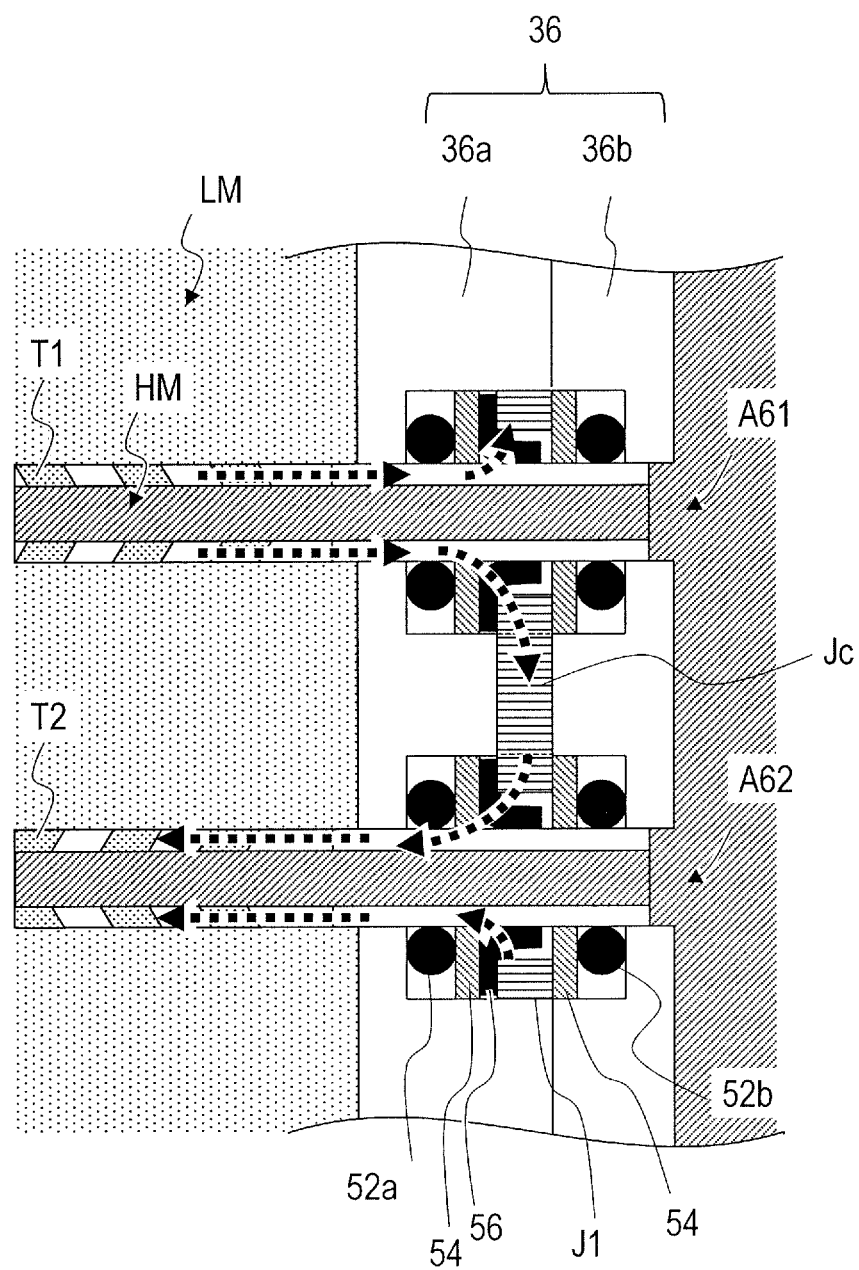
FIG. 17 schematically shows the directions in which electric current flows through the two openings A61 and A62 and their surrounding region.

FIG. 17 schematically shows the directions in which electric current flows through the two openings A61 and A62 and their surrounding region. FIG. 17 is a drawing corresponding to portion (a) of FIG. 10. In FIG. 17, the flow directions of the electric current are schematically indicated by the dotted arrows. As shown in FIG. 17, the electric current generated in the tubular thermoelectric generator T1 flows toward the tubular thermoelectric generator T2 through the electrically conductive ring member 56 of the opening A61, the electrically conductive member J1 and the electrically conductive ring member 56 of the opening A62 in this order. The electric current that has flowed into the tubular thermoelectric generator T2 is combined with electric current generated in the tubular thermoelectric generator T2, and the electric current thus combined flows toward the tubular thermoelectric generator T3. As shown in FIG. 16A, the planes of stacking of the tubular thermoelectric generator T3 are tilted in the opposite direction from those of the tubular thermoelectric generator T2. That is why in the tubular thermoelectric generator T3, the electric current flows from the right to the left in FIG. 16A. Consequently, the electromotive forces generated in the respective tubular thermoelectric generators T1 to T3 get superposed one upon the other without canceling each other. By sequentially connecting a plurality of tubular thermoelectric generators T together in this manner so that the tilt direction of their planes of stacking inverts alternately one generator after another, an even greater voltage can be extracted from the thermoelectric generator unit.

Figure 16B:
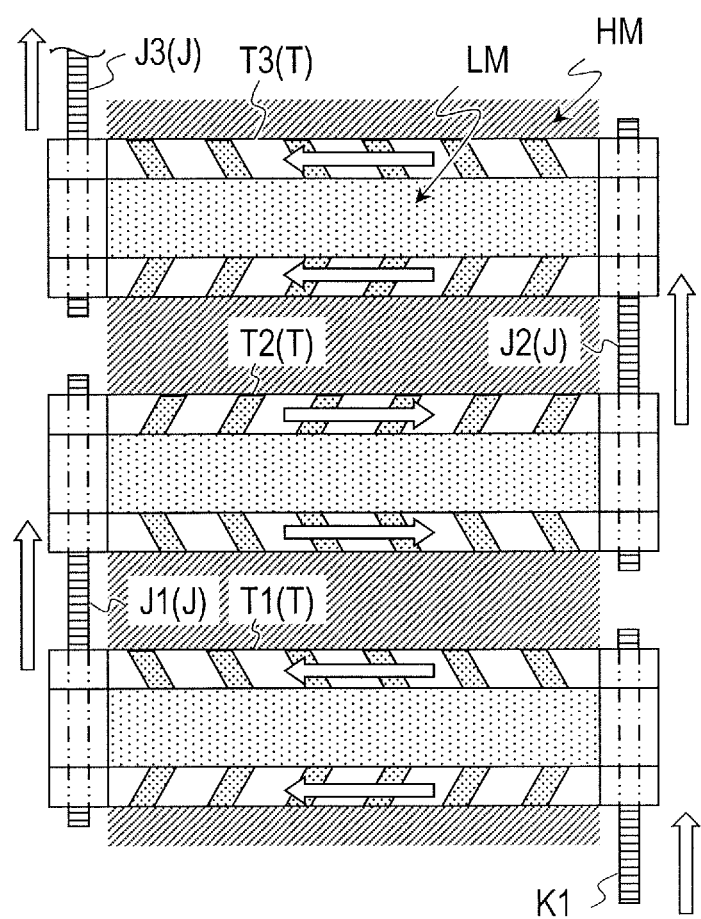
FIG. 16B schematically illustrates how electric current flows in tubular thermoelectric generators T which are electrically connected together in series.

Next, look at FIG. 16B, which also schematically shows, just like FIG. 16A, electric current flowing through tubular thermoelectric generators T which are electrically connected in series. As in the example shown in FIG. 16A, the tubular thermoelectric generators T1 to T3 are also sequentially connected in FIG. 16B so that the tilt direction of their planes of stacking inverts alternately one generator after another. In this case, since the planes of stacking in one of any two adjacent tubular thermoelectric generators connected together are tilted in the opposite direction from the planes of stacking in the other tubular thermoelectric generator, the electromotive forces generated in the respective tubular thermoelectric generators T1 to T3 get superposed one upon the other without canceling each other.

If the cold medium LM is brought into contact with the inner peripheral surface of each of the tubular thermoelectric generators T1 to T3 and the hot medium HM is brought into contact with their outer peripheral surface as shown in FIG. 16B, the polarity of voltage generated in each of the tubular thermoelectric generators T1 to T3 becomes opposite from the one shown in FIG. 16A. In other words, if the direction of the temperature gradient in each tubular thermoelectric generator is inverted, then the polarity of the electromotive force in that tubular thermoelectric generator (which may also be called the direction of electric current flowing through that tubular thermoelectric generator) inverts. Therefore, to make electric current flow from the electrically conductive member K1 toward the electrically conductive member J3 as in FIG. 16A, the configurations on the first and second electrode sides in each of the tubular thermoelectric generators T1 to T3 may be opposite from the configurations shown in FIG. 16A. It should be noted that electric current flow directions shown in FIGS. 16A and 16B are just examples. Depending on the material to make the metal layers 20 and the thermoelectric material to make the thermoelectric material layers 22, the electric current flow directions may be opposite from the ones shown in FIGS. 16A and 16B.

As already described with reference to FIGS. 16A and 16B, the polarity of the voltage generated in the tubular thermoelectric generator T depends on the tilt direction of the planes of stacking of that tubular thermoelectric generator T. That is why when the tubular thermoelectric generator T is going to be replaced, for example, the tubular thermoelectric generator T needs to be arranged appropriately with the temperature gradient between the inner and outer peripheral surfaces of the tubular thermoelectric generator T in the thermoelectric generator unit 100 taken into account.

Figure 18A:
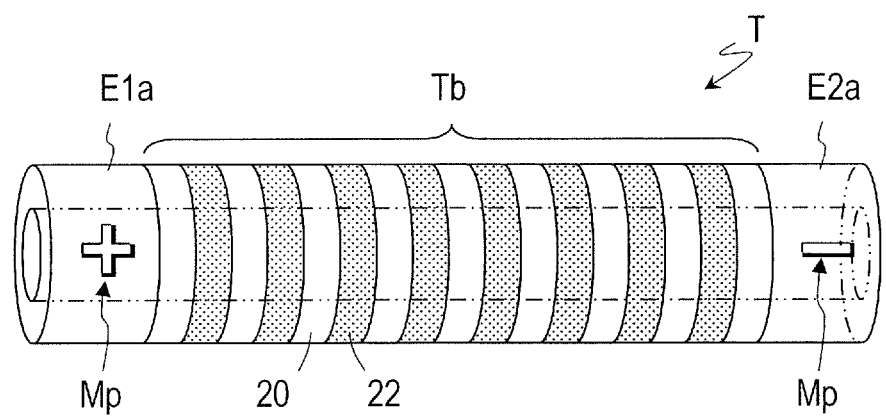
FIG. 18A is a perspective view illustrating an exemplary tubular thermoelectric generator, of which the electrodes have indicators of their polarity.
Figure 18B:
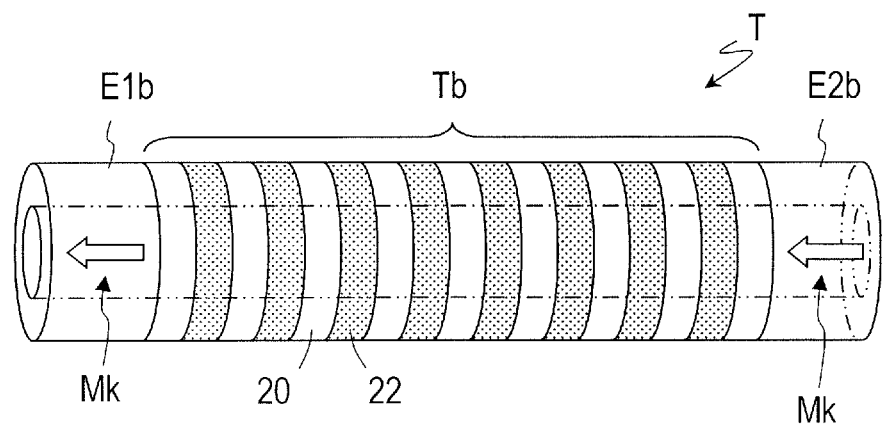
FIG. 18B is a perspective view illustrating another exemplary tubular thermoelectric generator, of which the electrodes have indicators of their polarity.

FIGS. 18A and 18B are perspective views each illustrating an exemplary tubular thermoelectric generator, of which the electrodes have indicators of their polarity. In the tubular thermoelectric generator T shown in FIG. 18A, molded portions (embossed marks) Mp indicating the polarity of the voltage generated in the tubular thermoelectric generator have been formed on the first and second electrodes E1a and E2a. On the other hand, in the tubular thermoelectric generator T shown in FIG. 18B, marks Mk indicating whether the planes of stacking in the tubular thermoelectric generator T are tilted toward the first electrode E1b or the second electrode E2b are left on the first and second electrodes E1b and E2b. These molded portions (e.g., convex or concave portions) and marks may be combined together. Optionally, these molded portions and marks may be added to the tube body Tb or to only one of the first and second electrodes.

In this manner, molded portions or marks indicating the polarity of the voltage generated in the tubular thermoelectric generator T may be added to the first and second electrodes, for example. In that case, it can be seen quickly just from the appearance of the tubular thermoelectric generator T whether the planes of stacking of the tubular thermoelectric generator T are tilted toward the first electrode or the second electrode. Optionally, instead of adding such molded portions or marks, the first and second electrodes may have mutually different shapes. For example, the lengths, thicknesses or cross-sectional shapes as viewed on a plane that intersects with the axial direction at right angles may be different from each other between the first and second electrodes.

<Electrical Connection Structure for Extracting Electric Power Out of Thermoelectric Generator Unit 100>

Now look at FIG. 5 again. In the example illustrated in FIG. 5, ten tubular thermoelectric generators T1 to T10 are electrically connected in series via electrically conductive members J1 to J9. Each of these electrically conductive members J1 to J9 connects its associated two tubular thermoelectric generators T together just as described above. An exemplary electrical connection structure for extracting electric power out of the thermoelectric generator unit 100 from the two tubular generators T1 and T10 located at both ends of the series circuit will now be described.

Figure 19:
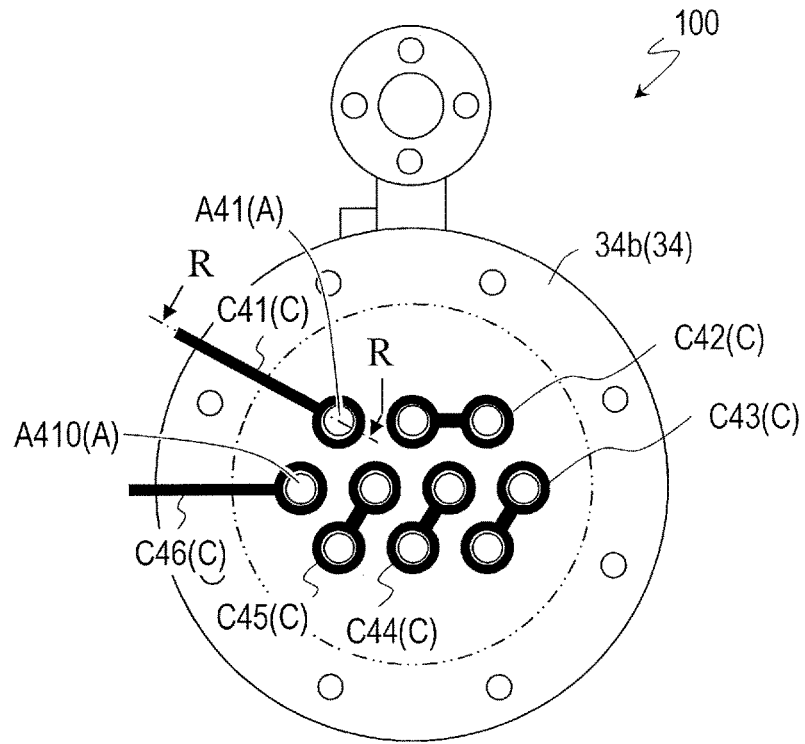
FIG. 19 illustrates the other side face of the thermoelectric generator unit 100 shown in FIG. 7A (left side view).

First, look at FIG. 19, which illustrates the other side face of the thermoelectric generator unit 100 shown in FIG. 7A (left side view). While FIG. 7B shows a configuration for the plate 36, FIG. 19 shows a configuration for the plate 34. Any member or operation that has already been described with respect to the plate 36 will not be described all over again to avoid redundancies.

As shown in FIG. 19, each of the channels C42 to C45 interconnects at least two of the openings A cut through the plate 34. In the present specification, such channels will sometimes be referred to as "interconnections" hereinbelow. The electrically conductive members housed in these interconnections may have the same configuration as the electrically conductive member J1. On the other hand, the channel C41 is provided for the plate 34 so as to run from the opening A41 to the outer edge of the plate 34. In the present specification, such a channel provided to run from an opening of a plate to its outer edge will be sometimes hereinafter referred to as a "terminal connection". The channels C41 and C46 shown in FIG. 19 are terminal connections. In each terminal connection, the electrically conductive member functioning as a terminal for connecting to an external circuit is housed.

Figure 20:
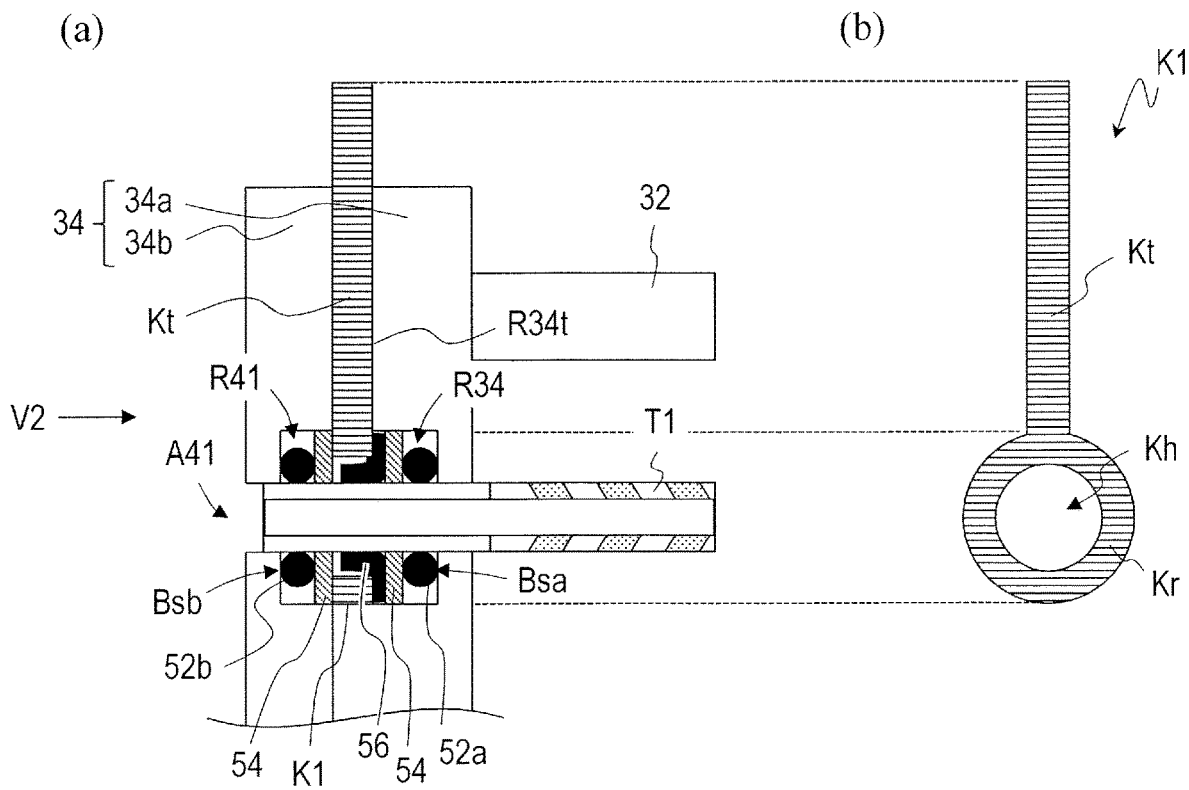
FIG. 20 schematically illustrates a cross section of a portion of a plate 34 and the appearance of an electrically conductive member K1.

Portion (a) of FIG. 20 is a schematic partial cross-sectional view of the plate 34. Specifically, portion (a) of FIG. 20 schematically illustrates a cross section of the plate as viewed on a plane including the center axis of the tubular thermoelectric generator T1 and corresponding to the plane R-R shown in FIG. 19. More specifically, portion (a) of FIG. 20 illustrates the structure of one A41 of multiple openings A that the plate 34 has and a region surrounding it. Portion (b) of FIG. 20 illustrates the appearance of an electrically conductive member K1 as viewed in the direction indicated by the arrow V2 in portion (a) of FIG. 20. This electrically conductive member K1 has a through hole Kh at one end. More specifically, this electrically conductive member K1 includes a ring portion Kr with the through hole Kh and a terminal portion Kt extending outward from the ring portion Kr. Just like the electrically conductive member J1, this electrically conductive member K1 is also typically made of a metal.

As shown in portion (a) of FIG. 20, one end of the tubular thermoelectric generator T1 (on the first electrode side) is inserted into the opening A41 of the plate 34. In this state, the end of the tubular thermoelectric generator T1 is inserted into the through hole Kh of the electrically conductive member K1. As can be seen, an electrically conductive member J or K1 according to this embodiment can be said to be an electrically conductive plate with at least one hole to pass the tubular thermoelectric generator T through. The structure of the opening A410 and the region surrounding it is the same as that of the opening A41 and the region surrounding it except that the end of the tubular thermoelectric generator T10 is inserted into the opening A410 of the plate 34.

In the example illustrated in portion (a) of FIG. 20, the first plate portion 34a has a recess R34 which has been cut for the opening A41. This recess R34 includes a groove portion R34t which extends from the opening A41 through the outer edge of the first plate portion 34a. In this groove portion R34t, located is the terminal portion Kt of the electrically conductive member K1. In this example, the space defined by the recess R34 and a recess R41 which has been cut in the second plate portion 34b forms a channel to house the electrically conductive member K1. As in the example illustrated in portion (a) of FIG. 10, not only the electrically conductive member K1 but also a first O-ring 52a, washers 54, an electrically conductive ring member 56 and a second O-ring 52b are housed in the channel C41 in the example illustrated in portion (a) of FIG. 20, too. And the end of the tubular thermoelectric generator T1 goes through the holes of these members. The first O-ring 52a establishes sealing so as to prevent a fluid that has been supplied into the shell 32 from entering the channel C41. On the other hand, the second O-ring 52b establishes sealing so as to prevent a fluid located outside of the second plate portion 34b from entering the channel C41.

Figure 21:
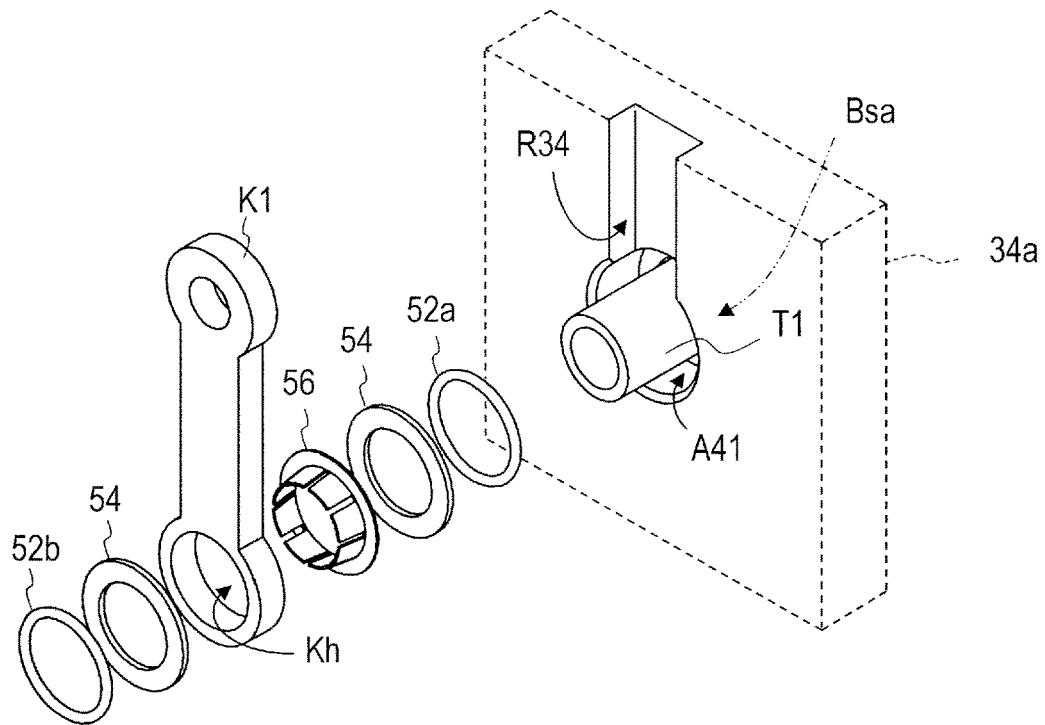
FIG. 21 is an exploded perspective view schematically illustrating the channel C41 to house the electrically conductive member K1 and its vicinity.

FIG. 21 is an exploded perspective view schematically illustrating the channel C41 to house the electrically conductive member K1 and its vicinity. For example, a first O-ring 52a, a washer 54, an electrically conductive ring member 56, the electrically conductive member K1, another washer 54 and a second O-ring 52b may be inserted into the opening A41 from outside of the container 30. The sealing surface of the second plate portion 34b (i.e., the surface that faces the first plate portion 34a) has substantially the same configuration as the sealing surface of the second plate portion 36b shown in FIG. 11B. Thus, by fastening the first and second plate portions 34a and 34b together, the second seating surface Bsb of the second plate portion 34b presses the first O-ring 52a against the seating surface Bsa of the first plate portion 34a through the second O-ring 52b, electrically conductive member K1 and electrically conductive ring member 56. In this manner, the electrically conductive member K1 can be sealed from the hot and cold media.

The ring portion Kr of the electrically conductive member K1 contacts with the flat portion 56f of the electrically conductive ring member 56 inside the opening A cut through the plate 34. In this manner, the electrically conductive member K1 is electrically connected to the outer peripheral surface at the end of the tubular thermoelectric generator T via the electrically conductive ring member 56. In this case, one end of the electrically conductive member K1 (i.e., the terminal portion Kt) sticks out of the plate 34 as shown in portion (a) of FIG. 20. Thus, that part of the terminal portion Kt that sticks out of the plate 34 may function as a terminal to connect the thermoelectric generator unit to an external circuit. As shown in FIG. 21, that part of the terminal portion Kt to stick out of the plate 34 may have a ring shape. In the present specification, an electrically conductive member, one end of which receives a tubular thermoelectric generator inserted and the other end of which sticks out, will sometimes be referred to as a "terminal plate" hereinbelow.

As described above, in this thermoelectric generator unit 100, the tubular thermoelectric generators T1 and T10 are respectively connected to the two terminal plates housed in the terminal connections. In addition, between those two terminal plates, those tubular thermoelectric generators T1 through T10 are electrically connected together in series via the connection plate housed in the interconnection of the channel. Consequently, through the two terminal plates, one end of which sticks out of the plate (34, 36), the electric power generated by those tubular thermoelectric generators T1 to T10 can be extracted out of this thermoelectric generator unit 100.

The arrangements of the electrically conductive ring member 56 and electrically conductive member J, K1 may be changed appropriately inside the channel C. In that case, the electrically conductive ring member 56 and the electrically conductive member (J, K1) just need to be arranged so that the elastic portions 56r of the electrically conductive ring member 56 are inserted into the through hole Jh1, Jh2 or Kh of the electrically conductive member. Also, as mentioned above, in an implementation in which the electrically conductive ring member 56 is omitted, the end of the tubular thermoelectric generator T may be electrically connected to the electrically conductive member K1. Optionally, part of the flat portion 56f of the electrically conductive ring member 56 may be extended and used in place of the terminal portion Kt of the electrically conductive member K1. In that case, the electrically conductive member K1 may be omitted.

In the embodiments described above, a channel C is formed by respective recesses cut in the first and second plate portions. However, the channel C may also be formed by a recess which has been cut in one of the first and second plate portions. If the container 30 is made of a metallic material, the inside of the channel C may be coated with an insulator to prevent the electrically conductive members (i.e., the connection plates and the terminal plates) from becoming electrically conductive with the container 30. For example, the plate 34 (consisting of the plate portions 34a and 34b) may be comprised of a body made of a metallic material and an insulating coating which covers the surface of the body at least partially. Likewise, the plate 36 (consisting of the plate portions 36a and 36b) may also be comprised of a body made of a metallic material and an insulating coating which covers the surface of the body at least partially. If the respective surfaces of the recesses cut in the first and second plate portions are coated with an insulator, the insulating coating can be omitted from the surface of the electrically conductive member.

<Another Exemplary Structure to Establish Sealing and Electrical Connection>

Figure 22:
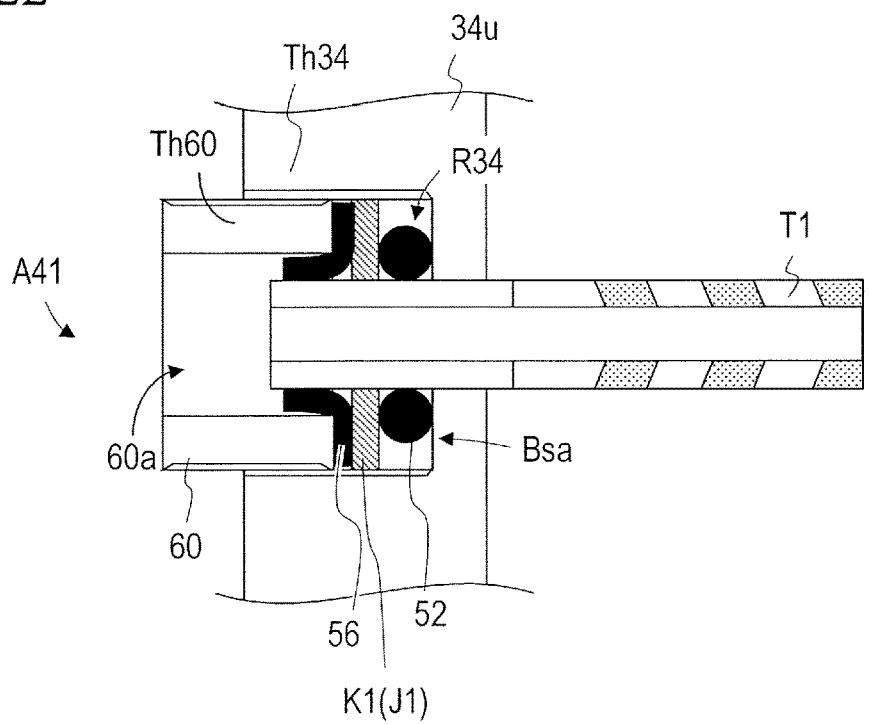
FIG. 22 is a cross-sectional view schematically illustrating an exemplary structure for separating the medium which flows in contact with the outer peripheral surfaces of the tubular thermoelectric generators T from the medium which flows in contact with the inner peripheral surface of each of the tubular thermoelectric generators T1 to T10 so as to prevent those media from mixing together.

FIG. 22 is a cross-sectional view schematically illustrating an exemplary structure for separating the medium which flows in contact with the outer peripheral surfaces of the tubular thermoelectric generators T from the medium which flows in contact with the inner peripheral surface of each of the tubular thermoelectric generators T1 to T10 so as to prevent those media from mixing together. In the example illustrated in FIG. 22, a bushing 60 is inserted from outside of the container 30, thereby separating the hot and cold media from each other and electrically connecting the tubular thermoelectric generator and the electrically conductive member together.

In the example illustrated in FIG. 22, the opening A41 cut through the plate 34u has an internal thread portion Th34. More specifically, the wall surface of the recess R34 that has been cut with respect to the opening A41 of the plate 34u has the thread. The busing 60 with an external thread portion Th60 is inserted into the recess R34. The busing 60 has a through hole 60a that runs in the axial direction. In this case, the end of the tubular thermoelectric generator T1 has been inserted into the opening A41 of the plate 34u. That is why when the busing 60 is inserted into the recess R34, the through hole 60a communicates with the internal flow path of the tubular thermoelectric generator T1.

Inside the space left between the recess R34 and the busing 60, arranged are various members to establish sealing and electrical connection. In the example illustrated in FIG. 22, an O-ring 52, the electrically conductive member K1 and the electrically conductive ring member 56 are arranged in this order from the seating surface Bsa of the plate 34u toward the outside of the container 30. The end of the tubular thermoelectric generator T1 is inserted into the respective holes of these members. The O-ring 52 contacts with the seating surface Bsa of the plate 34u and the outer peripheral surface at the end of the tubular thermoelectric generator T1. In this case, when the external thread portion Th60 is inserted into the internal thread portion Th34, the external thread portion Th60 presses the O-ring 52 against the seating surface Bsa via the flat portion 56f of the electrically conductive ring member 56 and the electrically conductive member K1. As a result, sealing can be established so as to prevent the fluid supplied into the shell 32 and the fluid supplied into the internal flow path of the tubular thermoelectric generator T1 from mixing with each other. In addition, since the outer peripheral surface of the tubular thermoelectric generator T1 contacts with the elastic portions 56r of the electrically conductive ring member 56 and since the flat portion 56f of the electrically conductive ring member 56 contacts with the ring portion Kr of the electrically conductive member K1, the tubular thermoelectric generator and the electrically conductive member can be electrically connected together.

As can be seen, by using the members shown in FIG. 22, the hot and cold media can be separated from each other and the tubular thermoelectric generator and the electrically conductive member can be electrically connected together with a simpler configuration.

Figure 23A:
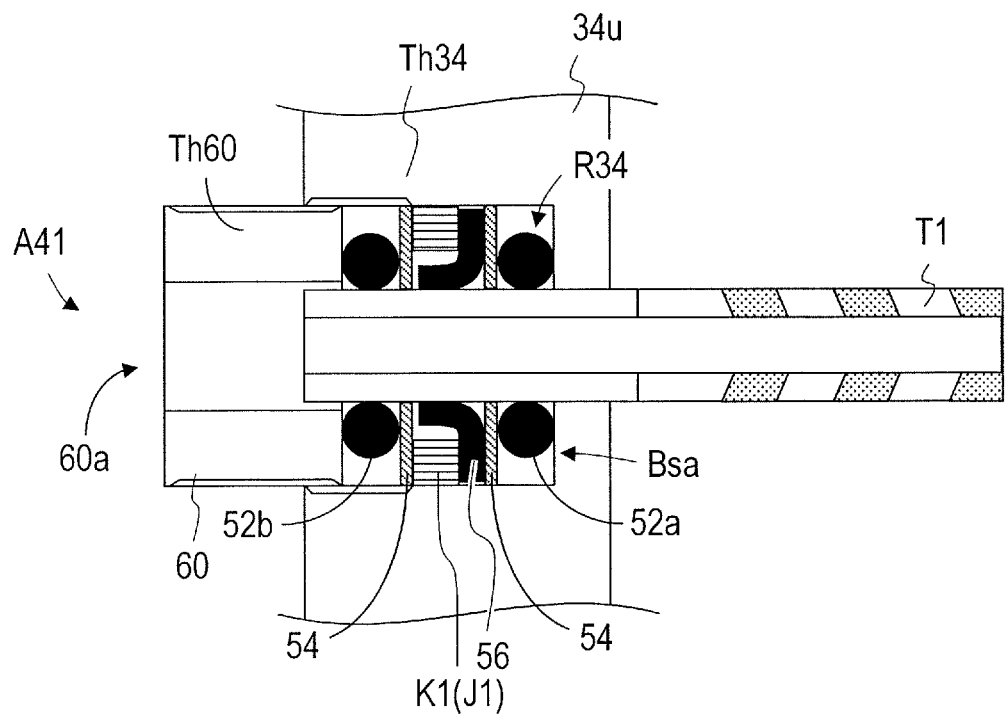
FIG. 23A is a cross-sectional view schematically illustrating another exemplary structure for separating the hot and cold heat transfer media from each other and electrically connecting the tubular thermoelectric generator and the electrically conductive member together.
Figure 23B:
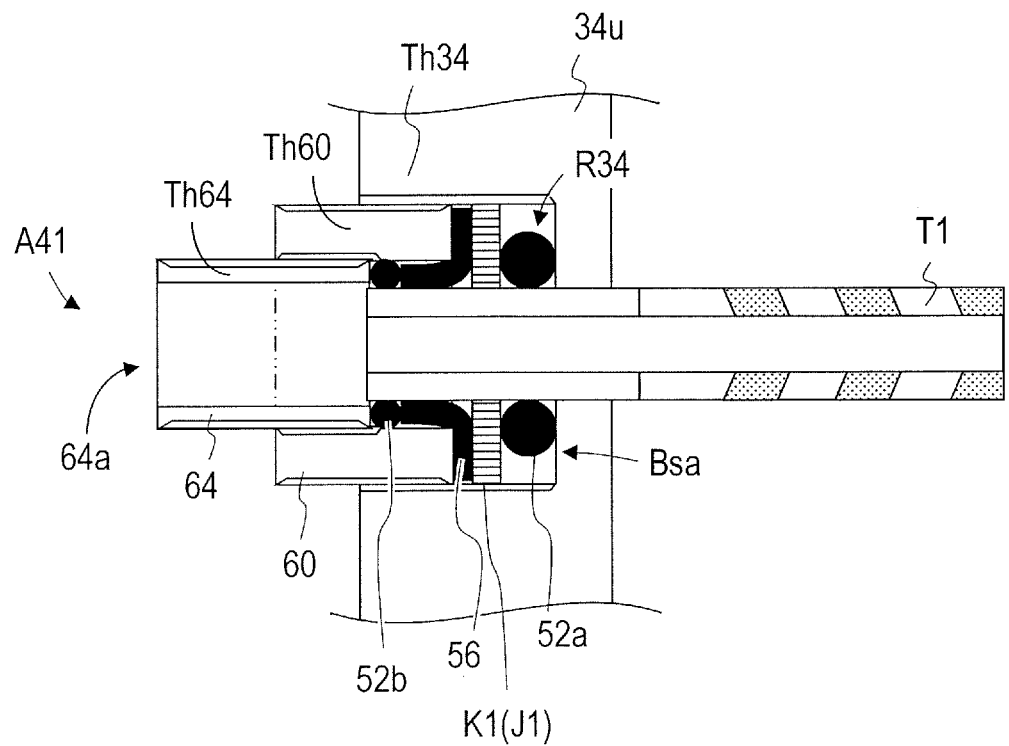
FIG. 23B is a cross-sectional view schematically illustrating still another exemplary structure for separating the hot and cold heat transfer media from each other and electrically connecting the tubular thermoelectric generator and the electrically conductive member together.

FIGS. 23A and 23B are cross-sectional views schematically illustrating two other exemplary structures for separating the hot and cold media from each other and electrically connecting the tubular thermoelectric generator and the electrically conductive member together. Specifically, in the example shown in FIG. 23A, a first O-ring 52a, a washer 54, the electrically conductive ring member 56, the electrically conductive member K1, another washer 54 and a second O-ring 52b are arranged in this order from the seating surface Bsa of the plate 34u toward the outside of the container 30. In the example illustrated in FIG. 23A, the external thread portion Th60 presses the O-ring 52a against the seating surface Bsa via the electrically conductive member K1 and the flat portion 56f of the electrically conductive ring member 56. On the other hand, in the example shown in FIG. 23B, a first O-ring 52a, the electrically conductive member K1, the electrically conductive ring member 56 and a second O-ring 52b are arranged in this order from the seating surface Bsa of the plate 34u toward the outside of the container 30. In addition, in FIG. 23B, another busing 64 with a through hole 64a has been inserted into the through hole 60a of the busing 60. The through hole 64a also communicates with the internal flow path of the tubular thermoelectric generator T1. In the example illustrated in FIG. 23B, the external thread portion Th64 of the busing 64 presses the second O-ring 52b against the seating surface Bsa. Sealing from both of the fluids (the hot and cold media) can be established by arranging the first and second O-rings 52a and 52b in this manner. By establishing sealing from both of the fluids (the hot and cold media), corrosion of the electrically conductive ring member 56 can be minimized.

As described above, one end of the terminal portion Kt of the electrically conductive member K1 sticks out of the plate 34u and can function as a terminal to connect the thermoelectric generator unit to an external circuit. In the implementations shown in FIGS. 22, 23A and 23B, the electrically conductive member K1 (terminal plate) may be replaced with a connection plate such as the electrically conductive member J1. In that case, the end of the tubular thermoelectric generator T1 is inserted into the through hole Jh1. If necessary, a washer 54 may be arranged between the O-ring and the electrically conductive member, for example.

<Embodiment of Thermoelectric Generator System>

Next, an embodiment of a thermoelectric generator system according to the present disclosure will be described.

Figure 24A:
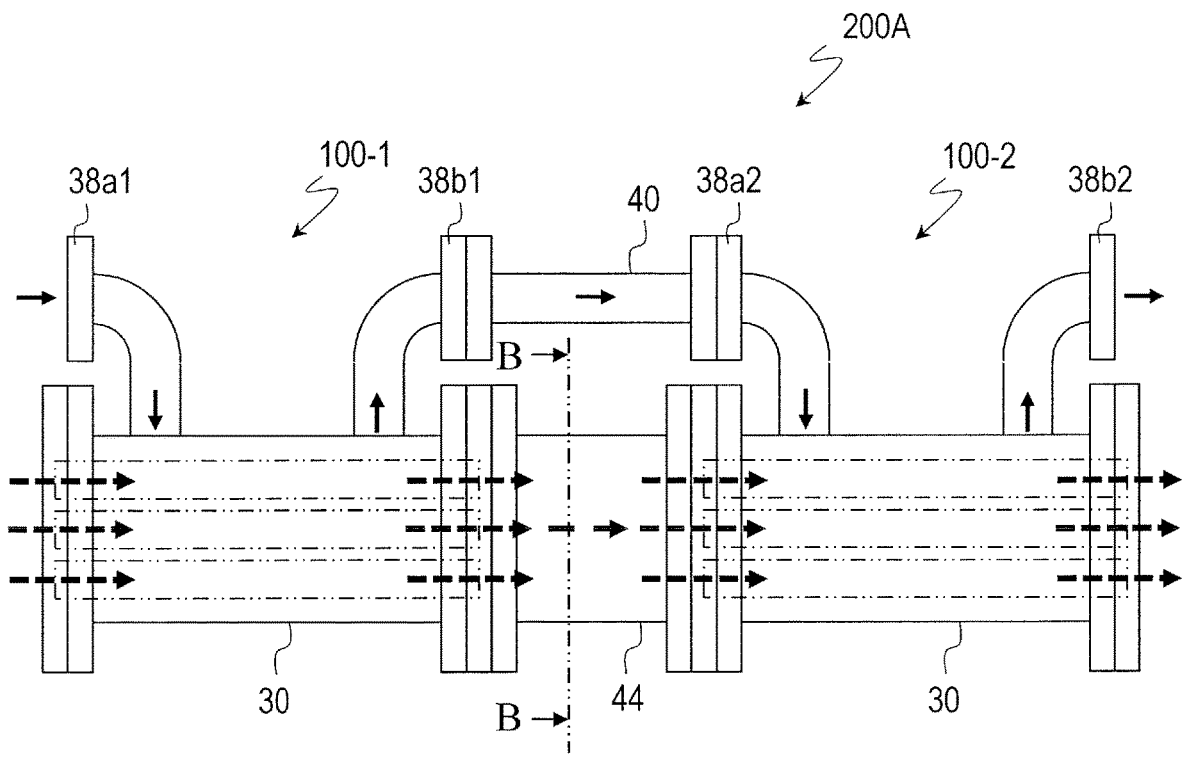
FIG. 24A illustrates an embodiment of a thermoelectric generator system according to the present disclosure.
Figure 24B:
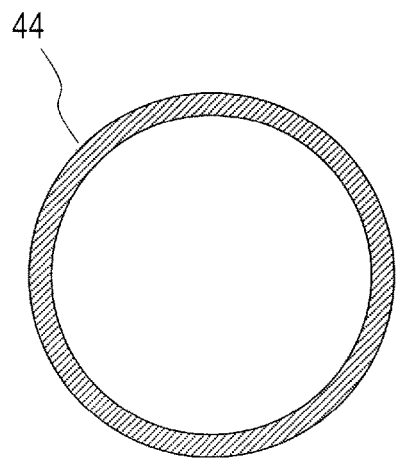
FIG. 24B is a cross-sectional view of the system as viewed on the plane B-B shown in FIG. 24A.
Figure 24C:
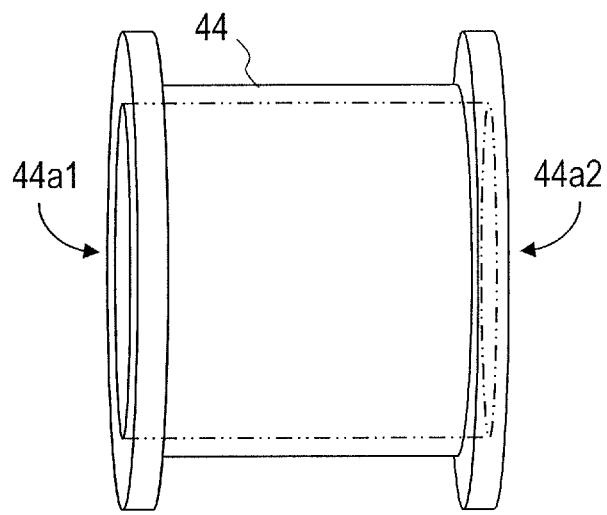
FIG. 24C is a perspective view illustrating an exemplary configuration for a buffer vessel that the thermoelectric generator system shown in FIG. 24A has.

FIG. 24A illustrates an embodiment of a thermoelectric generator system according to the present disclosure. FIG. 24B is a cross-sectional view of the system as viewed on the plane B-B shown in FIG. 24A. And FIG. 24C is a perspective view illustrating an exemplary configuration for a buffer vessel that the thermoelectric generator system shown in FIG. 24A has. In FIG. 24A, the bold solid arrows generally indicate the flow direction of the medium in contact with the outer peripheral surface of a tubular thermoelectric generator (i.e., the medium flowing inside of the container 30 (and outside of the tubular thermoelectric generator)). On the other hand, the bold dashed arrows generally indicate the flow direction of the medium in contact with the inner peripheral surface of a tubular thermoelectric generator (i.e., the medium flowing through the through hole (i.e., the inner flow path) of the tubular thermoelectric generator). In the present specification, a path communicating with the fluid inlet and outlet ports of each container 30 will sometimes be referred to as a "first medium path" and a path encompassing the flow path of each tubular thermoelectric generator will sometimes be referred to as a "second medium path" hereinbelow.

The thermoelectric generator system 200A shown in FIG. 24A includes first and second thermoelectric generator units 100-1 and 100-2, each of which has the same configuration as the thermoelectric generator unit 100 described above. This thermoelectric generator system 200A further includes a thick circular cylindrical buffer vessel 44 which is arranged between the first and second thermoelectric generator units 100-1 and 100-2. This buffer vessel 44 has a first opening 44a1 communicating with the respective flow paths of multiple tubular thermoelectric generators in the first thermoelectric generator unit 100-1 and a second opening 44a2 communicating with the respective flow paths of multiple tubular thermoelectric generators in the second thermoelectric generator unit 100-2.

In this thermoelectric generator system 200A, the medium that has been introduced through the fluid inlet port 38a1 of the first thermoelectric generator unit 100-1 sequentially flows through the container 30 of the first thermoelectric generator unit 100-1, the fluid outlet port 38b1 of the first thermoelectric generator unit 100-1, a conduit 40, the fluid inlet port 38a2 of the second thermoelectric generator unit 100-2 and the container 30 of the second thermoelectric generator unit 100-2 in this order to reach a fluid outlet port 38b2 (which is the first medium path). That is to say, the medium that has been supplied into the container 30 of the first thermoelectric generator unit 100-1 is supplied to the inside of the container 30 of the second thermoelectric generator unit 100-2 through the conduit 40. It should be noted that this conduit 40 does not have to be a straight one but may be a bent one, too.

On the other hand, the internal flow paths of the multiple tubular thermoelectric generators in the first thermoelectric generator unit 100-1 communicate with the internal flow paths of the multiple tubular thermoelectric generators in the second thermoelectric generator unit 100-2 through the first and second openings 44a1 and 44a2 of the buffer vessel 44 (which is the second medium path). The medium that has been introduced into the respective internal flow paths of the multiple tubular thermoelectric generators in the first thermoelectric generator unit 100-1 is confluent with each other in the buffer vessel 44 and then introduced into the respective internal flow paths of the multiple tubular thermoelectric generators in the second thermoelectric generator unit 100-2.

In a thermoelectric generator system including a plurality of thermoelectric generator units, the second medium path encompassing the flow paths of the respective tubular thermoelectric generators may be designed arbitrarily. Note that the degree of heat exchange to be carried out in a single container 30 via multiple tubular thermoelectric generators may vary from one generator to another. For this reason, between two adjacent thermoelectric generator units, if the internal flow paths of the respective tubular thermoelectric generators in one thermoelectric generator unit are connected in series to the internal flow paths of the respective tubular thermoelectric generators in the other thermoelectric generator unit, the temperature of the medium flowing through the internal flow paths will vary even more. With increased variations in the temperature of the medium among the internal flow paths of the respective tubular thermoelectric generators, the power output levels of the respective tubular thermoelectric generators may also vary from one generator to another.

For example, if the tubular thermoelectric generators are electrically connected in series together in each thermoelectric generator unit, electric power can be generated efficiently by reducing a variation in power output level between the respective tubular thermoelectric generators. Particularly when a plurality of thermoelectric generator units are electrically connected in series together, electric power can be generated even more efficiently by reducing a variation in power output level between those thermoelectric generator units.

In this thermoelectric generator system 200A, the medium that has flowed through the respective internal flow paths of the multiple tubular thermoelectric generators in the first thermoelectric generator unit 100-1 into the buffer vessel 44 exchanges heat in the buffer vessel 44 and then is supplied to the internal flow paths of the multiple tubular thermoelectric generators in the second thermoelectric generator unit 100-2. Since the medium that has flowed through the internal flow paths of the multiple tubular thermoelectric generators in the first thermoelectric generator unit 100-1 into the buffer vessel 44 exchanges heat in the buffer vessel 44, the temperature of the medium can be more uniform. By mixing the medium flowing through the internal flow path of one tubular thermoelectric generator with the medium flowing through the internal flow path of another tubular thermoelectric generator in this manner, the temperature of the media flowing through the respective internal flow paths of multiple tubular thermoelectric generators can be made more uniform, which is advantageous.

In the example illustrated in FIG. 24A, the second medium path is designed so that the fluid flows in the same direction through the respective flow paths of multiple tubular thermoelectric generators T. However, the flow direction of the fluid through the flow paths of multiple tubular thermoelectric generators T does not have to be the same direction. Alternatively, the flow direction of the fluid through the flow paths of multiple tubular thermoelectric generators T may also be set in various manners according to the design of the flow paths of the hot and cold media. Also, in the thermoelectric generator system of the present disclosure, multiple thermoelectric generator units may be connected either in series to each other or parallel with each other.

<Another Embodiment of Thermoelectric Generator System>

Figure 25A:
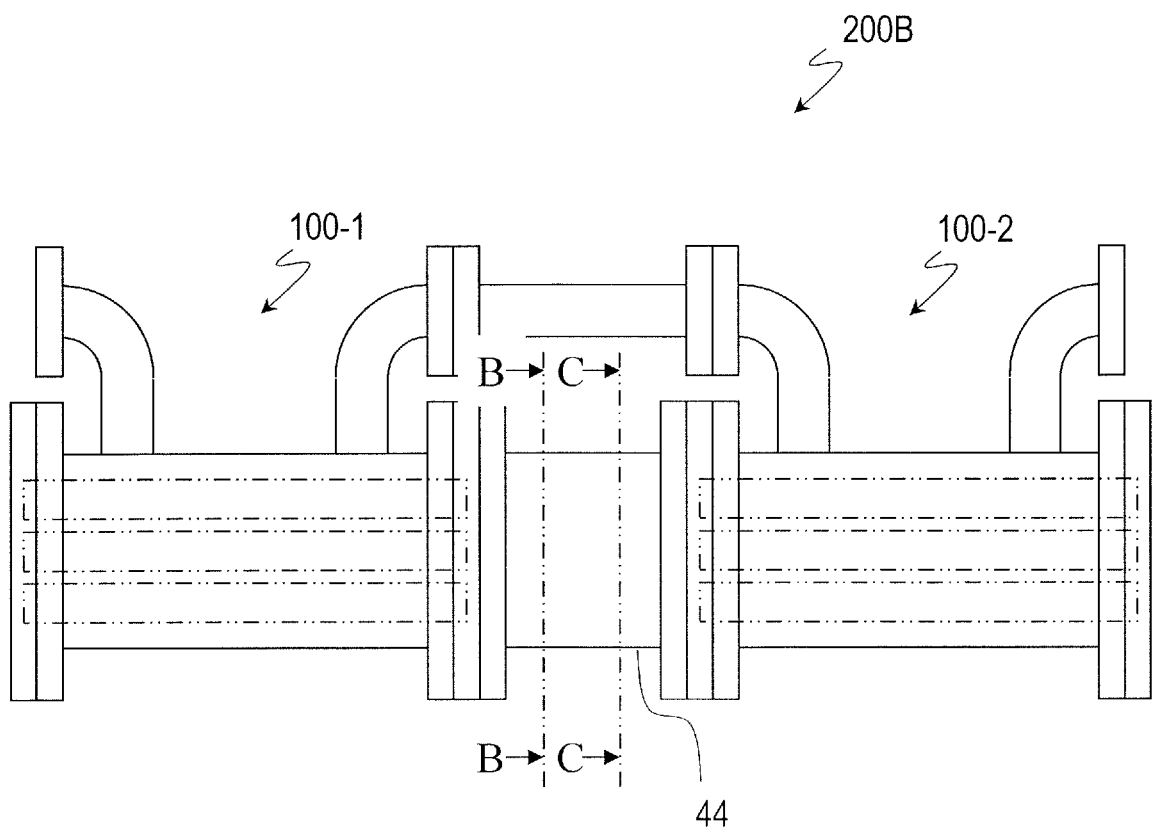
FIG. 25A illustrates another embodiment of a thermoelectric generator system according to the present disclosure.
Figure 25B:
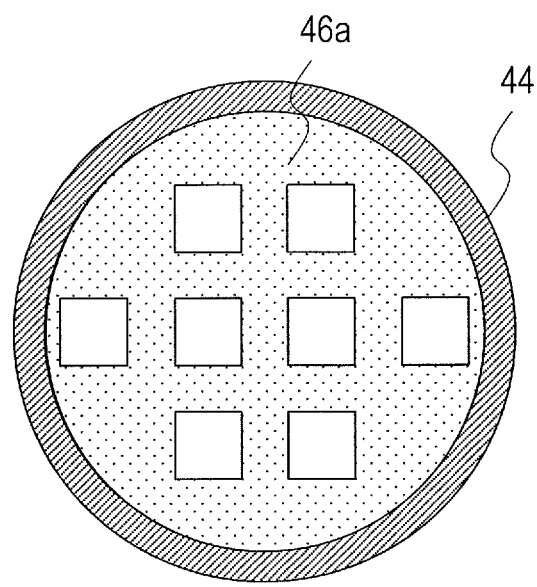
FIG. 25B is a cross-sectional view of the system as viewed on the plane B-B shown in FIG. 25A.
Figure 25C:
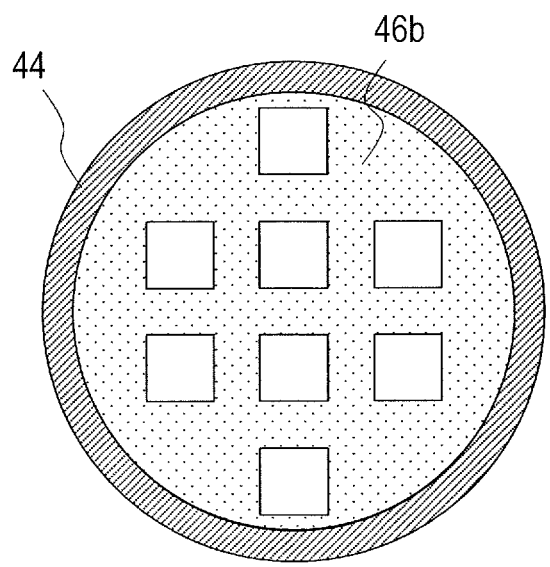
FIG. 25C is a cross-sectional view of the system as viewed on the plane C-C shown in FIG. 25A.

FIG. 25A illustrates another embodiment of a thermoelectric generator system according to the present disclosure. FIG. 25B is a cross-sectional view of the system as viewed on the plane B-B shown in FIG. 25A. And FIG. 25C is a cross-sectional view of the system as viewed on the plane C-C shown in FIG. 25A.

In the thermoelectric generator system 200B of this embodiment, the buffer vessel 44 has two baffle plates 46a and 46b inside. A number of rectangular openings are cut through one of these two baffle plates 46a or 46b, and a number of rectangular openings are also cut through the other baffle plate 46b or 46a, the distribution pattern of rectangular openings being dissimilar between the two baffle plates 46a and 46b (see FIGS. 25B and 25C). The medium flowing inside the buffer vessel 44 passes through those openings cut through each of the two baffle plates 46a, 46b, whereby a turbulent flow is generated and a stirring effect emerges to promote uniformity of the temperature of the medium. In this manner, the buffer vessel 44 may have such a baffle structure for disturbing the flow of the fluid that has flowed into the buffer vessel 44 through the respective flow paths of those tubular thermoelectric generators.

The baffle plates 46a, 46b just need to have such a shape as to at least partially change the flow direction of the fluid. That is why the shape, size and locations of those openings cut through the baffle plates 46a, 46b do not have to be the exemplary ones illustrated in FIGS. 25B and 25C but may also be arbitrary ones. Each of those baffle plates may be divided into multiple pieces. Each of those openings may be a slit. Any arbitrary number of baffle plates may be provided. For example, the stirring effect can also be achieved with only one baffle plate. The baffle plate does not need to have a flat plate shape but may also have a helical, radial or grid shape.

Figure 26A:
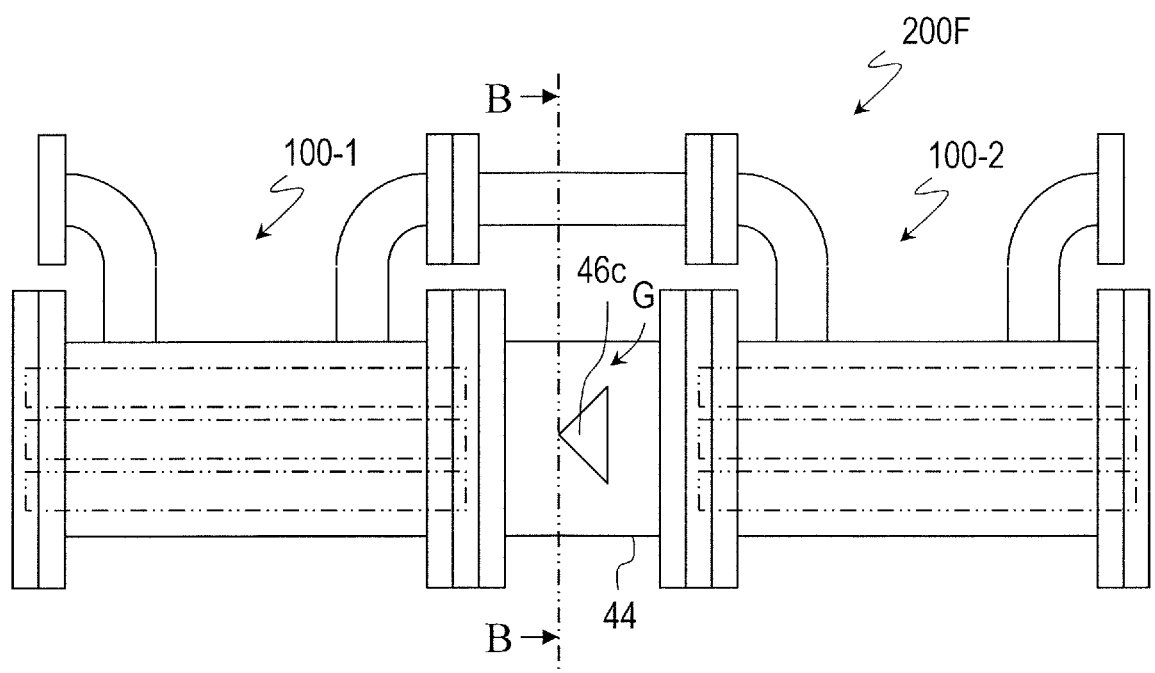
FIG. 26A illustrates still another embodiment of a thermoelectric generator system according to the present disclosure.
Figure 26B:
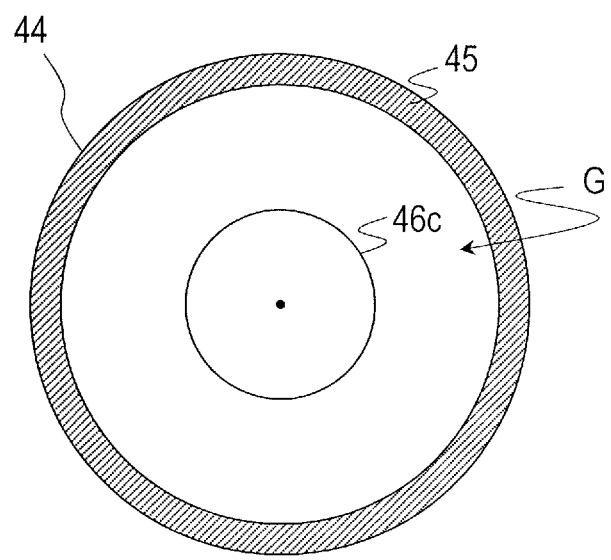
FIG. 26B is a cross-sectional view of the system as viewed on the plane B-B shown in FIG. 26A.

FIG. 26A illustrates still another embodiment of a thermoelectric generator system according to the present disclosure. FIG. 26B is a cross-sectional view of the system as viewed on the plane B-B shown in FIG. 26A.

In the exemplary configuration shown in FIGS. 26A and 26B, a baffle 46c with a three-dimensional shape is provided for the buffer vessel 44 of the thermoelectric generator system 200F. In the example illustrated in FIGS. 26A and 26B, the baffle 46c is arranged around the center of the buffer vessel 44 on a cross section which intersects at right angles with the flow direction of the fluid that has flowed into the buffer vessel 44. As a result, a gap G is left between the inner wall 45 of the buffer vessel 44 and the outer edge of the baffle 46c. The fluid that has flowed into the buffer vessel 44 passes through this gap G and then is introduced into the respective internal flow paths of the tubular thermoelectric generators of the thermoelectric generator unit (e.g., the second thermoelectric generator unit 100-2). It should be noted that the baffle 46c may be supported inside the buffer vessel 44 by a supporting member arranged between the baffle 46c and the inner wall 45 of the buffer vessel 44. However, illustration of such a supporting member is omitted in FIGS. 26A and 26B.

As schematically shown in FIG. 24A, the fluid flowing through the second medium path goes from the left toward the right in FIG. 26A, for example. In the example illustrated in FIG. 26A, the baffle 46c has such a shape as to change the flow direction of the fluid flowing around the center of the buffer vessel 44 so that the fluid goes outward from the center of the buffer vessel 44. For example, the baffle 46c may have a shape which expands gradually in the flow direction of the fluid as shown in FIG. 26A. In the example illustrated in FIG. 26A, the baffle 46c has a circular cone shape.

In the configuration illustrated in FIGS. 26A and 26B, while the fluid flows into the buffer vessel 44 from the first thermoelectric generator unit 100-1, the portion of the fluid flowing around the center of the buffer vessel 44 collides against the baffle 46c existing near the center of the buffer vessel 44. The fluid flowing around the center of the buffer vessel 44 has its flow direction changed by colliding against the baffle 46c, passes through the gap G and then goes toward the second thermoelectric generator unit 100-2. Meanwhile, another part of the fluid that has flowed into the buffer vessel 44 flows around the inner wall 45, passes through the gap G and then goes toward the second thermoelectric generator unit 100-2. That is to say, both the fluid flowing around the center of the buffer vessel 44 and the fluid flowing around the inner wall 45 pass through the gap G. In such a situation, the medium temperature can be made even more uniform by mixing these fluids together.

As described above, in a thermoelectric generator unit including a plurality of tubular thermoelectric generators, the degree of heat exchange carried out by those tubular thermoelectric generators varies according to the position of a tubular thermoelectric generator in the container 30. This will be described by taking, as an example, a situation where the temperature of a medium flowing through the first medium path is lower than that of a medium flowing through the second medium path.

The temperature of the medium (hot medium) flowing inside the tubular thermoelectric generators of the first thermoelectric generator unit 100-1 decreases as the medium goes farther inside the tubular thermoelectric generators as a result of heat exchange with the medium (cold medium) supplied through the fluid inlet port of the container 30 and flowing through the first medium path. In the exemplary configuration described above, the cold medium is introduced through the side surface of the container 30 and some of the multiple tubular thermoelectric generators is arranged so as to be surrounded with the other tubular thermoelectric generators in a single thermoelectric generator unit. For example, in the configuration shown in FIG. 3B, among the ten tubular thermoelectric generators T1 through T10, the tubular thermoelectric generators T6 and T8 arranged around the center of the container 30 are surrounded with the other tubular thermoelectric generators T1 to T5, T7, T9 and T10. That is why a decrease in the temperature of the medium flowing inside the tubular thermoelectric generators T6 and T8 tends to be less significant than a decrease in the temperature of the medium flowing inside the tubular thermoelectric generators that are arranged near the inner wall of the container 30. That is to say, in the fluid that has flowed into the buffer vessel 44, a part of the fluid flowing around the center of the buffer vessel 44 sometimes has a higher temperature than another part of the fluid flowing around the inner wall 45. Consequently, the medium flowing into the buffer vessel 44 from the first thermoelectric generator unit 100-1 may have a temperature distribution in which the temperature gets higher the closer to the center of the first opening 44a1 and gets lower the closer to the periphery.

As can be seen from the foregoing description, by providing, inside the buffer vessel 44, a mechanism for making a medium that has flowed in through the center of the first opening 44a1 go toward the periphery, the temperature of the medium in the buffer vessel 44 can be made uniform more efficiently. For example, by providing a baffle 46c such as the one shown in FIGS. 26A and 26B inside the buffer vessel 44, the temperature of the medium inside the buffer vessel 44 can be made uniform more efficiently and variation in power output level between the respective tubular thermoelectric generators can be reduced. A structure such as the baffle may be any mechanism as long as it can guide the medium flowing around the center of the buffer vessel 44 toward the periphery. The baffle does not need to have a circular cone shape such as the one shown in FIGS. 26A and 26B but may also have a triangular pyramid, quadrangular pyramid or any other pyramid shape or a spherical shape as well.

Optionally, from the standpoint of making the temperature of the medium as uniform as possible inside the buffer vessel 44, a structure having such a shape as to change the flow direction of the fluid flowing around the peripheral area inside the buffer vessel 44 so that the fluid goes toward the center of the buffer vessel 44 may be provided for the buffer vessel 44. Even if such a configuration is adopted, the temperature of the medium can also be made more uniform by mixing together the fluid flowing around the center of the buffer vessel 44 and the fluid flowing around the inner wall 45 of the buffer vessel 44.

For example, the buffer vessel 44 may have, as such a structure for disturbing the flow of the fluid that has flowed into the buffer vessel 44, projections on the inner wall 45. The projections are arranged so as to project toward the center of the buffer vessel 44. The arrangement, number and size of the projections may be determined appropriately. For example, the projections may be baffles or fins which either form parts of the inner wall 45 or have been formed separately from the inner wall 45. The shape of the projections is not particularly limited and does not have to be a flat plate shape. The surface of the projections may or may not be connected smoothly to the surface of the inner wall 45.

By providing such projections that project toward the center of the buffer vessel 44, an aperture, of which the area is smaller than that of the first opening 44a1, may be formed around the center of the buffer vessel 44. In the fluid that has flowed into the buffer vessel 44, if the fluid flowing around the inner wall 45 of the buffer vessel 44 is guided by those projections toward such an aperture and is mixed with the fluid flowing around the center of the buffer vessel 44, the temperature of the medium can be made even more uniform.

As long as it can achieve the effect of making the temperature distribution uniform by stirring up the medium, any structure other than the one described above may either be provided inside of the buffer vessel or form part of the buffer vessel. For example, the inner wall of the buffer vessel 44 may have unevenness or grooves. Alternatively, the buffer vessel 44 may be narrowed in the middle. Still alternatively, a structure having such a shape as to change the flow direction of the fluid flowing around the center of the buffer vessel 44 so that the fluid goes outward from the center and a structure having such a shape as to change the flow direction of the fluid flowing around the periphery so that the fluid goes toward the center may be used in combination.

Figure 27A:
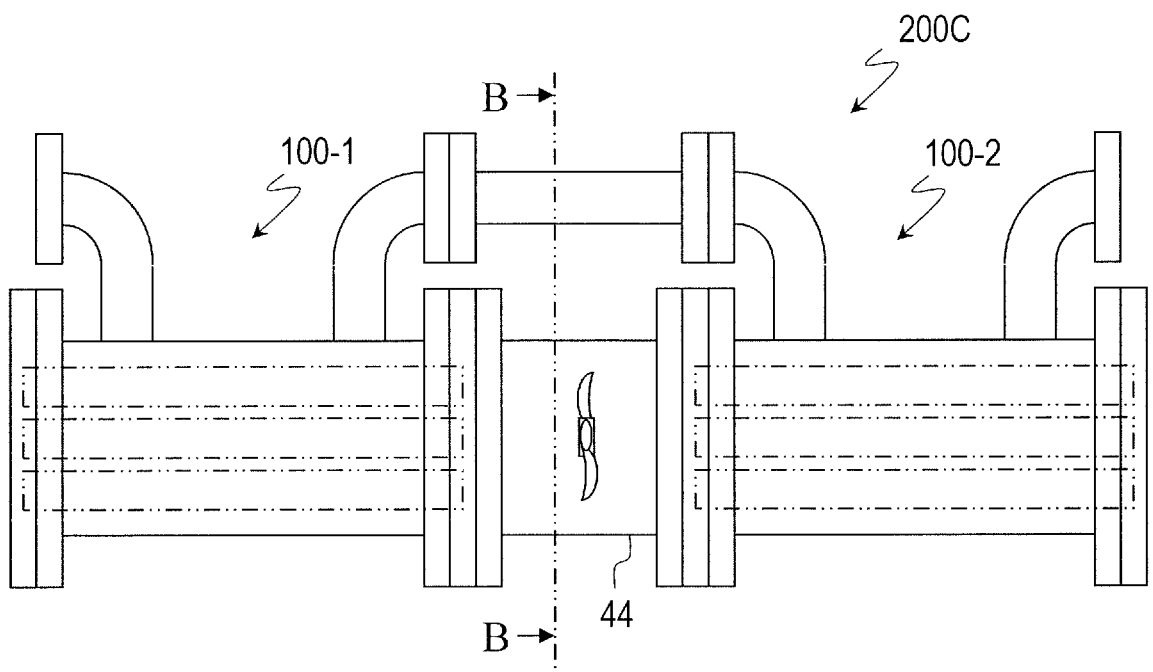
FIG. 27A illustrates yet another embodiment of a thermoelectric generator system according to the present disclosure.
Figure 27B:
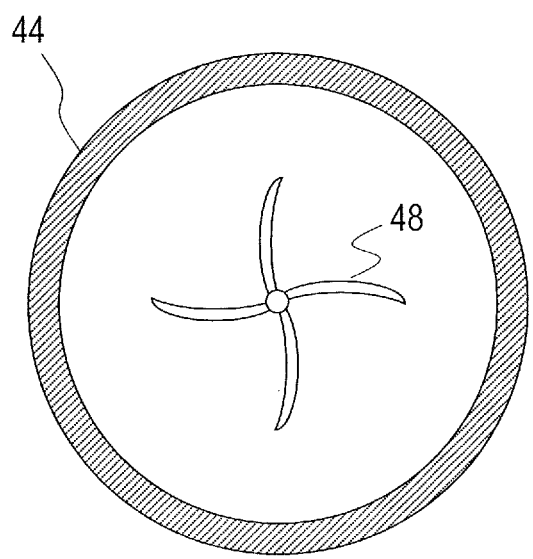
FIG. 27B is a cross-sectional view of the system as viewed on the plane B-B shown in FIG. 27A.

FIG. 27A illustrates yet another embodiment of a thermoelectric generator system according to the present disclosure. FIG. 27B is a cross-sectional view of the system as viewed on the plane B-B shown in FIG. 27A.

The structure arranged inside the buffer vessel 44 may include a movable portion to change at least partially the flow direction of the fluid that has flowed into the buffer vessel 44. In the thermoelectric generator system 200C of this embodiment, the buffer vessel 44 has blades 48 which rotate internally. Those blades 48 are supported rotatably by a supporting member (not shown) and rotated by the medium flow. Optionally, the blades 48 may be driven by an external power unit such as a motor. In any case, as the blades 48 rotate, a turbulent flow is generated and the stirring effect is produced to make the temperature of the medium even more uniform. Even when fixed so as not to rotate, those blades 48 also disturb the medium flow as much as the baffle, thus also making the medium temperature more uniform. If necessary, multiple sets of blades 48 (or propellers) may be provided inside the buffer vessel 44.

In place of, or in addition to, the blades 48, any other stirring mechanism which gets rotated, swung or deformed by the medium flow may be provided inside the buffer vessel 44 as well.

Figure 28A:
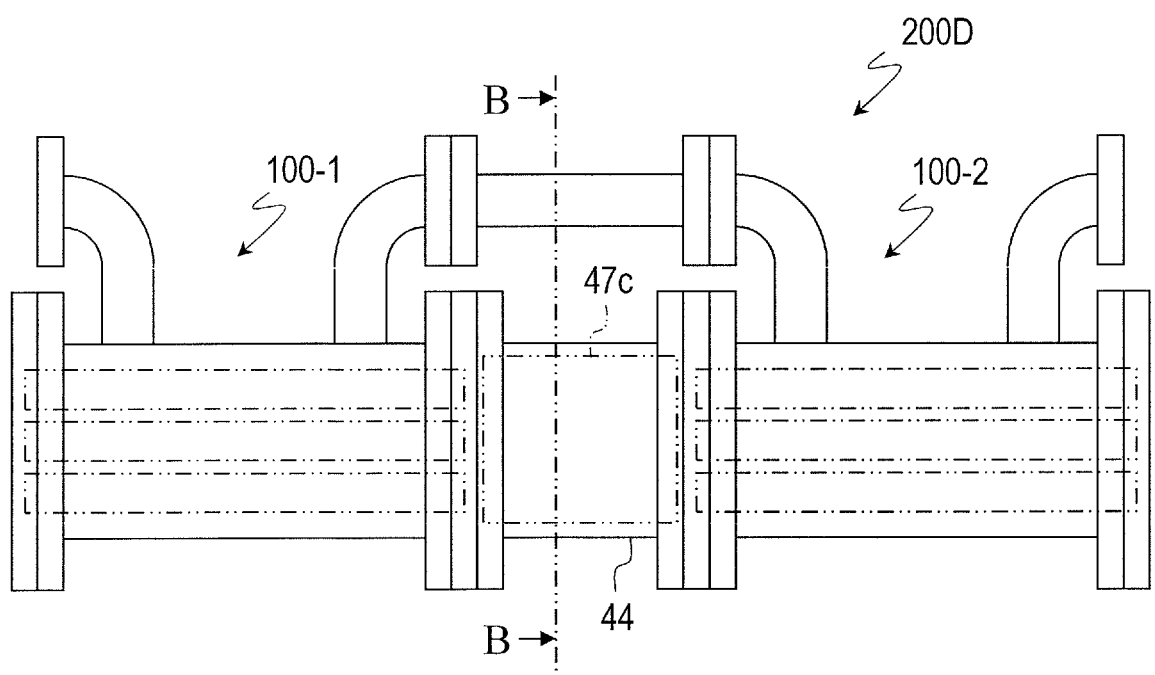
FIG. 28A illustrates yet another embodiment of a thermoelectric generator system according to the present disclosure.
Figure 28B:
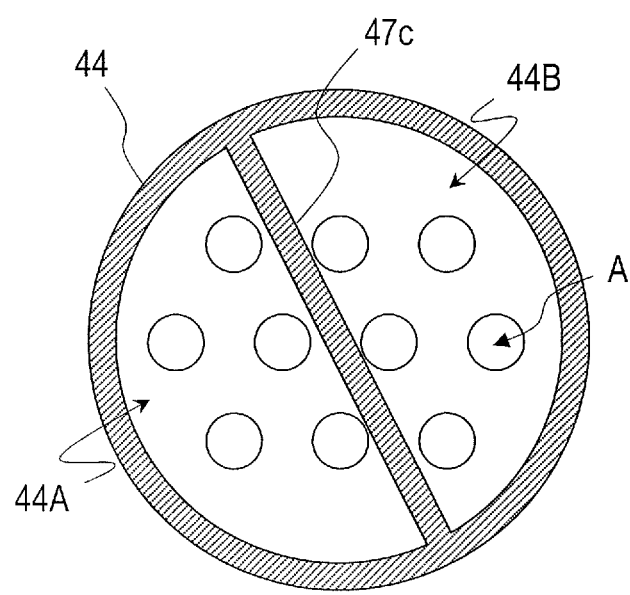
FIG. 28B is a cross-sectional view of the system as viewed on the plane B-B shown in FIG. 28A.

FIG. 28A illustrates yet another embodiment of a thermoelectric generator system according to the present disclosure. FIG. 28B is a cross-sectional view of the system as viewed on the plane B-B shown in FIG. 28A.

In the thermoelectric generator system 200D of this embodiment, the buffer vessel 44 has a partition 47c inside. Thus, the space inside of the buffer vessel 44 is divided into two spaces 44A and 44B. For example, as shown in FIG. 28B, the space 44A communicates with half of the openings A cut through the container of the second thermoelectric generator unit 100-2. On the other hand, the space 44B communicates with the other half of the openings A cut through the container of the second thermoelectric generator unit 100-2.

In this thermoelectric generator system 200D, part of the medium flows into the space 44A inside the buffer vessel 44 from a half of the tubular thermoelectric generators in the first thermoelectric generator unit 100-1. The rest of the medium flows into the space 44B from the other half of the tubular thermoelectric generators in the first thermoelectric generator unit 100-1. In each of these two spaces 44A and 44B created inside the buffer vessel 44, the medium that has flowed in from the respective internal flow paths of the tubular thermoelectric generators of the first thermoelectric generator unit 100-1 is subjected to heat exchange. In this manner, the inside of the buffer vessel 44 may be divided into multiple spaces and the medium that has flowed into the buffer vessel 44 may be subjected to heat exchange in each of those divided spaces.

The shape, number and arrangement of the partition 47c do not have to be the ones shown in FIGS. 28A and 28B but may be determined arbitrarily. If three or more thermoelectric generator units are connected together in series, the shape, number or arrangement of the partitions 47c may be changed from one buffer vessel inserted between two adjacent ones of the thermoelectric generator unit to another. In that case, the medium temperature can be made even more uniform.

Optionally, the baffles (e.g., baffle plates), stirring mechanism, and partitions that have been described with reference to FIGS. 25A through 28B may be used in combination. If three or more thermoelectric generator units are connected together in series, the buffer vessel 44 may be inserted either between each pair of two adjacent thermoelectric generator units or between only some pair(s) of two adjacent thermoelectric generator units.

Alternatively, the baffles, stirring mechanism and partitions may be provided inside the container 30. For example, when the hot medium flows through the internal flow paths of the tubular thermoelectric generators, the cold medium flows inside the container 30. The cold medium is heated by the tubular thermoelectric generators in the container 30 to have its temperature raised locally. However, the temperature of the cold medium remains relatively low distant from the tubular thermoelectric generators. That is why if the flow of the cold medium is disturbed inside the container 30 by the baffles or stirring mechanism, the temperature distribution of the cold medium can be made more uniform, and the temperature of the cold medium can be lowered in a region where the cold medium is in contact with the tubular thermoelectric generators.

Figure 29:
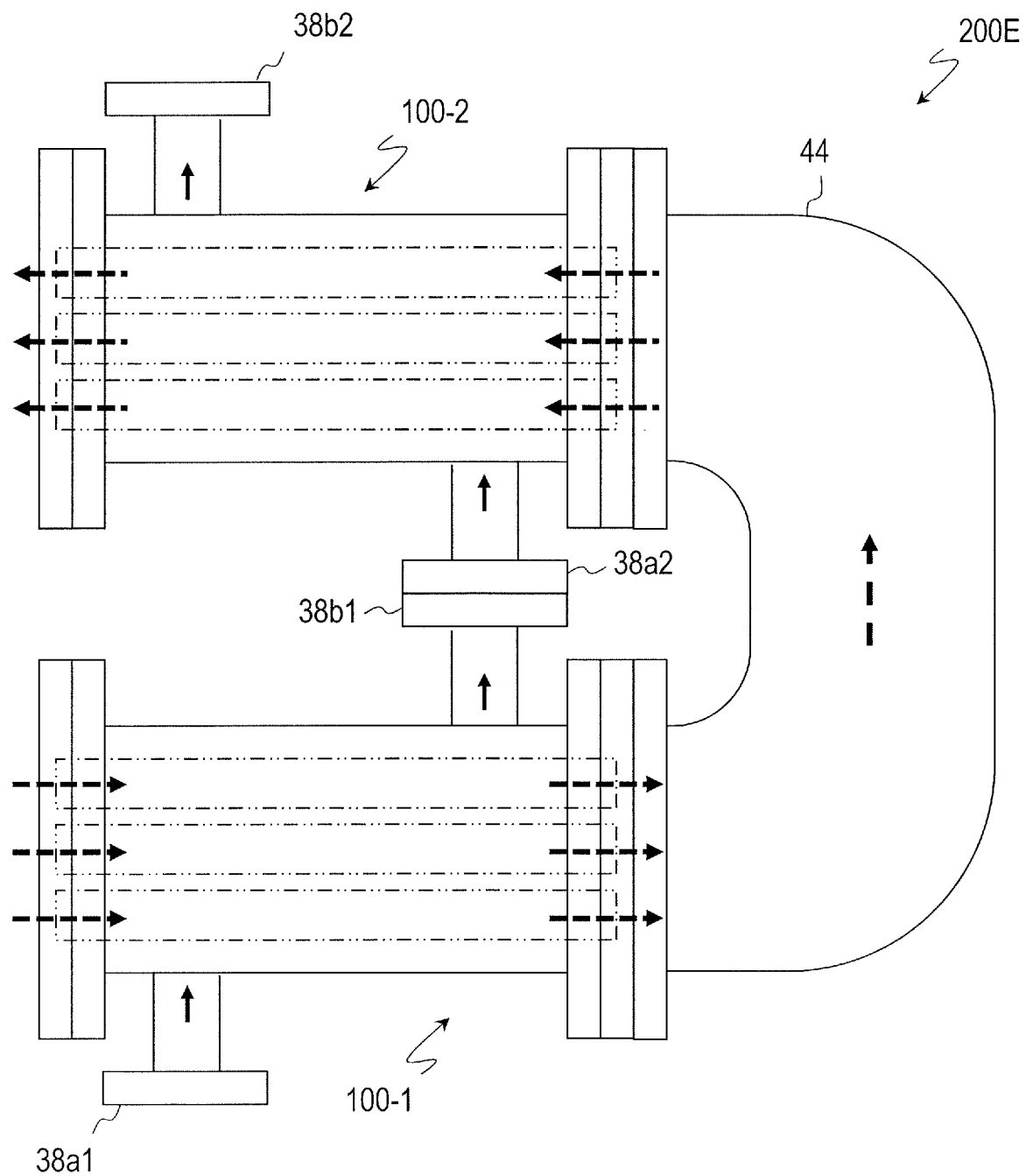
FIG. 29 illustrates yet another embodiment of a thermoelectric generator system according to the present disclosure.

Next, look at FIG. 29, which illustrates still another exemplary configuration for a thermoelectric generator system according to the present disclosure. In FIG. 29, the bold solid arrows generally indicate the flow direction of the medium in contact with the outer peripheral surface of a tubular thermoelectric generator. On the other hand, the bold dashed arrows generally indicate the flow direction of the medium in contact with the inner peripheral surface of the tubular thermoelectric generator as in FIG. 24A. This thermoelectric generator system 200E is configured so that the flow direction of the fluid flowing through the respective flow paths of the multiple tubular thermoelectric generators T in the first thermoelectric generator unit 100-1 is antiparallel to that of the fluid flowing through the respective flow paths of the multiple tubular thermoelectric generators T in the second thermoelectric generator unit 100-2.

In this thermoelectric generator system 200E, the first and second thermoelectric generator units 100-1 and 100-2 are arranged spatially parallel with each other. For example, the second thermoelectric generator unit 100-2 may be arranged by the first thermoelectric generator unit 100-1. Optionally, the first and second thermoelectric generator units 100-1 and 100-2 may be vertically stacked one upon the other. In that case, the medium will flow vertically through the first medium path.

As shown in FIG. 29, the buffer vessel 44 may have a bent shape. As can be seen, in a thermoelectric generator system according to the present disclosure, the flow paths for hot and cold media may be designed in various manners. For example, the flow paths may be designed flexibly according to the area of the place where the thermoelectric generator system needs to be installed. The arrangements shown in FIGS. 24A through 29 are just examples. Rather the first medium path communicating with the fluid inlet and outlet ports of each container and the second medium path encompassing the respective flow paths of the tubular thermoelectric generators may be designed arbitrarily. Also, those thermoelectric generator units may be electrically connected either in series to each other or parallel with each other.

<Exemplary Configuration for Thermoelectric Generator System's Electric Circuit>

Next, an exemplary configuration for an electric circuit that the thermoelectric generator system according to the present disclosure may include will be described with reference to FIG. 30.

Figure 30:
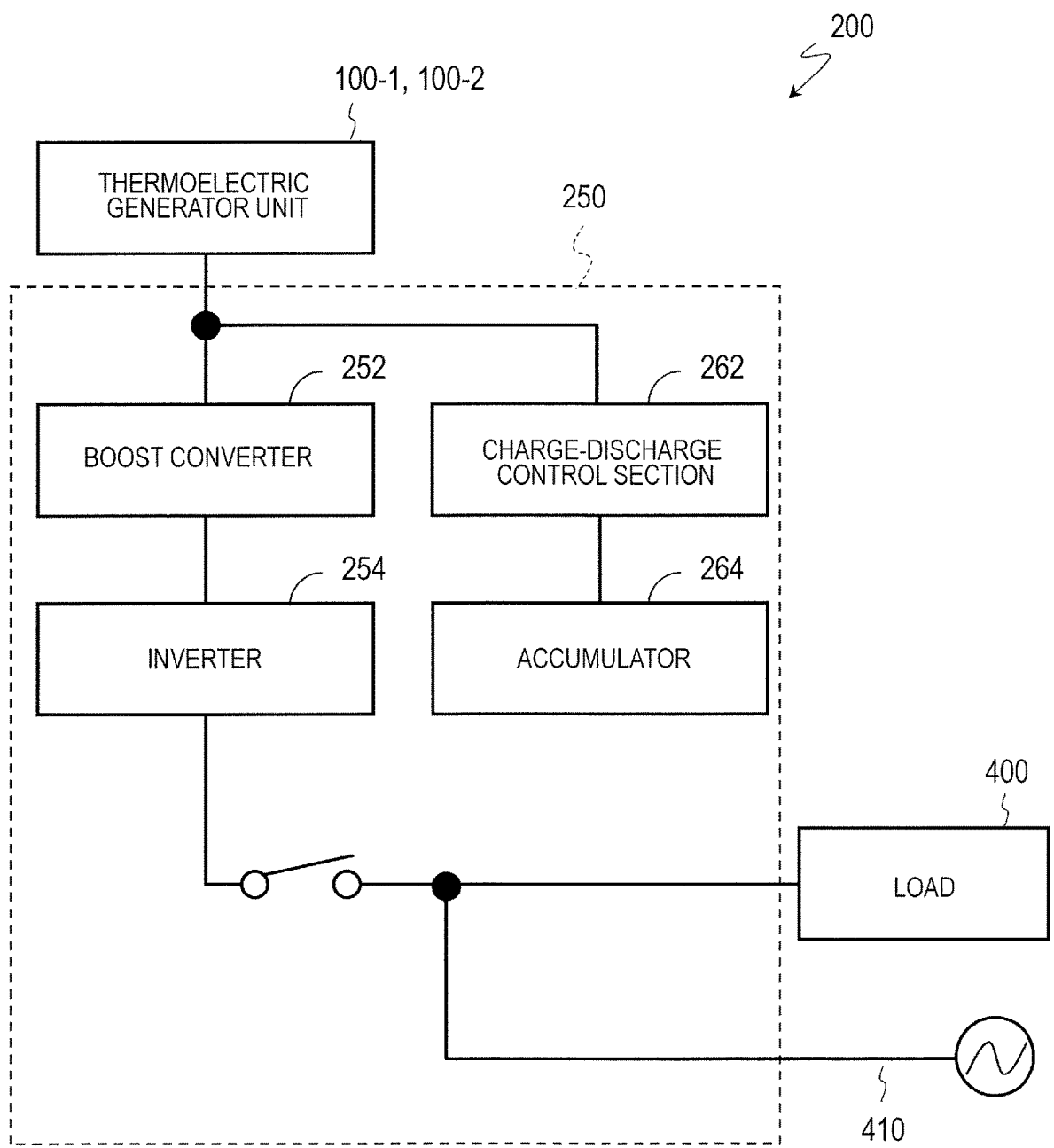
FIG. 30 is a block diagram illustrating an exemplary configuration of an electric circuit that the thermoelectric generator system according to the present disclosure may include.

In the example shown in FIG. 30, the thermoelectric generator system 200 according to this embodiment includes an electric circuit 250 which receives electric power from the thermoelectric generator units 100-1, 100-2. That is to say, in one implementation, the plurality of electrically conductive members may have an electric circuit which is electrically connected to the plurality of tubular thermoelectric generators.

The electric circuit 250 includes a boost converter 252 which boosts the voltage of the electric power supplied from the thermoelectric generator units 100-1, 100-2, and an inverter (DC-AC inverter) 254 which converts the DC power supplied from the boost converter 252 into AC power (of which the frequency may be 50/60 Hz, for example, but may also be any other frequency). The AC power may be supplied from the inverter 254 to a load 400. The load 400 may be any of various electrical or electronic devices that operate using AC power. The load 400 may have a charging function in itself, and does not have to be fixed to the electric circuit 250. Any AC power that has not been dissipated by the load 400 may be connected to a commercial grid 410 so that the electricity can be sold.

The electric circuit 250 in the example shown in FIG. 30 includes a charge-discharge control section 262 and an accumulator 264 for storing the DC power obtained from the thermoelectric generator units 100-1, 100-2. The accumulator 264 may be a chemical battery such as a lithium ion secondary battery, or a capacitor such as an electric double-layer capacitor, for example. The electric power stored in the accumulator 264 may be fed as needed to the boost converter 252 by the charge-discharge control section 262, and may be used or sold as AC power via the inverter 254.

The magnitude of the electric power supplied from the thermoelectric generator unit 100-1, 100-2 may vary with time either periodically or irregularly. For example, if the heat source of the hot medium is the waste heat discharged from a factory, the temperature of the hot medium may vary according to the operating schedule of that factory. In that case, the power generation state of the thermoelectric generator unit 100-1, 100-2 will vary so significantly that the voltage of the electric power and/or the amount of electric current supplied from the thermoelectric generator unit 100-1, 100-2 will vary, too. However, even if the power generation state varies in this manner, the thermoelectric generator system 200 shown in FIG. 30 can also minimize the influence caused by such a variation in power output level by making the charge-discharge control section 262 accumulate electric power in the accumulator 264.

If the electric power generated is dissipated in real time, then the voltage step-up ratio of the boost converter 252 may be adjusted according to the variation in power generation state. Alternatively, a control operation may also be carried out so that the power generation state is maintained in steady state by regulating the flow rate, temperature and other parameters of the hot or cold medium to be supplied to the thermoelectric generator unit 100-1, 100-2 with such a variation in power generation state sensed or predicted.

Now take a look at FIG. 4 again. In the system illustrated in FIG. 4, the flow rate of the hot medium may be adjusted by the pump P1. In the same way, the flow rate of the cold medium may be adjusted by the pump P2. By adjusting the flow rate(s) of one or both of the hot and cold media, the power output level of the tubular thermoelectric generator can be controlled.

Optionally, the temperature of the hot medium may be controlled by adjusting the quantity of heat supplied from a high-temperature heat source (not shown) to the hot medium. In the same way, the temperature of the cold medium may also be controlled by adjusting the quantity of heat dissipated from the cold medium into a low-temperature heat source (not shown, either).

Although not shown in FIG. 4, the flow rates of the respective media supplied to the thermoelectric generator system may be adjusted by providing a valve and a branch path for at least one of the flow paths of the hot and cold media.

<Another Embodiment of Thermoelectric Generator System>

Another embodiment of a thermoelectric generator system according to the present disclosure will now be described with reference to FIG. 31.

In this embodiment, a thermoelectric generator unit (such as the thermoelectric generator unit 100-1, 100-2) is provided for a general waste disposal facility (that is a so-called "garbage disposal facility" or a "clean center"). In recent years, at a waste disposal facility, high-temperature, high-pressure steam (at a temperature of 400 to 500 degrees Celsius and at a pressure of several MPa) is sometimes generated from the thermal energy produced when garbage (waste) is incinerated. Such steam energy is converted into electricity by turbine generator and the electricity thus generated is used to operate the equipment in the facility.

The thermoelectric generator system 300 of this embodiment includes a plurality of thermoelectric generator units. In the example illustrated in FIG. 31, the hot medium supplied to the thermoelectric generator units 100-1 and 100-2 has been produced based on the heat of combustion generated at the waste disposal facility. More specifically, this system includes an incinerator 310, a boiler 320 to produce high-temperature, high-pressure steam based on the heat of combustion generated by the incinerator 310, and a turbine 330 which is driven by the high-temperature, high-pressure steam produced by the boiler 320. The energy generated by the turbine 330 driven is given to a synchronous generator (not shown), which converts the energy into AC power (such as three-phase AC power).

The steam that has been used to drive the turbine 330 is turned back by a condenser 360 into liquid water, which is then supplied by a pump 370 to the boiler 320. This water is a working medium that circulates through a "heat cycle" formed by the boiler 320, turbine 330 and condenser 360. Part of the heat given by the boiler 320 to the water does work to drive the turbine 330 and then is given by the condenser 360 to cooling water. In general, cooling water circulates between the condenser 360 and a cooling tower 350 as indicated by the dotted arrows in FIG. 31.

As can be seen, only a part of the heat generated by the incinerator 310 is converted by the turbine 330 into electricity, and the thermal energy that the low-temperature, low-pressure steam has after the turbine 330 has been driven has not been converted into, and used as, electrical energy but often just dumped into the ambient according to conventional technologies. According to this embodiment, however, the low-temperature steam or hot water that has done work to drive the turbine 330 can be used effectively as a heat source for the hot medium. In this embodiment, heat is obtained by the heat exchanger 340 from the steam at such a low temperature (of 140 degrees Celsius, for example) and hot water at 99 degrees Celsius is obtained, for example. And this hot water is supplied as hot medium to the thermoelectric generator units 100-1, 100-2.

On the other hand, a part of the cooling water used at a waste disposal facility, for example, may be used as the cold medium. If the waste disposal facility has the cooling tower 350, water at about 10 degrees Celsius can be obtained from the cooling tower 350 and used as the cold medium. Alternatively, the cold medium does not have to be obtained from a special cooling tower but may also be well water or river water inside the facility or in the neighborhood.

Figure 31:
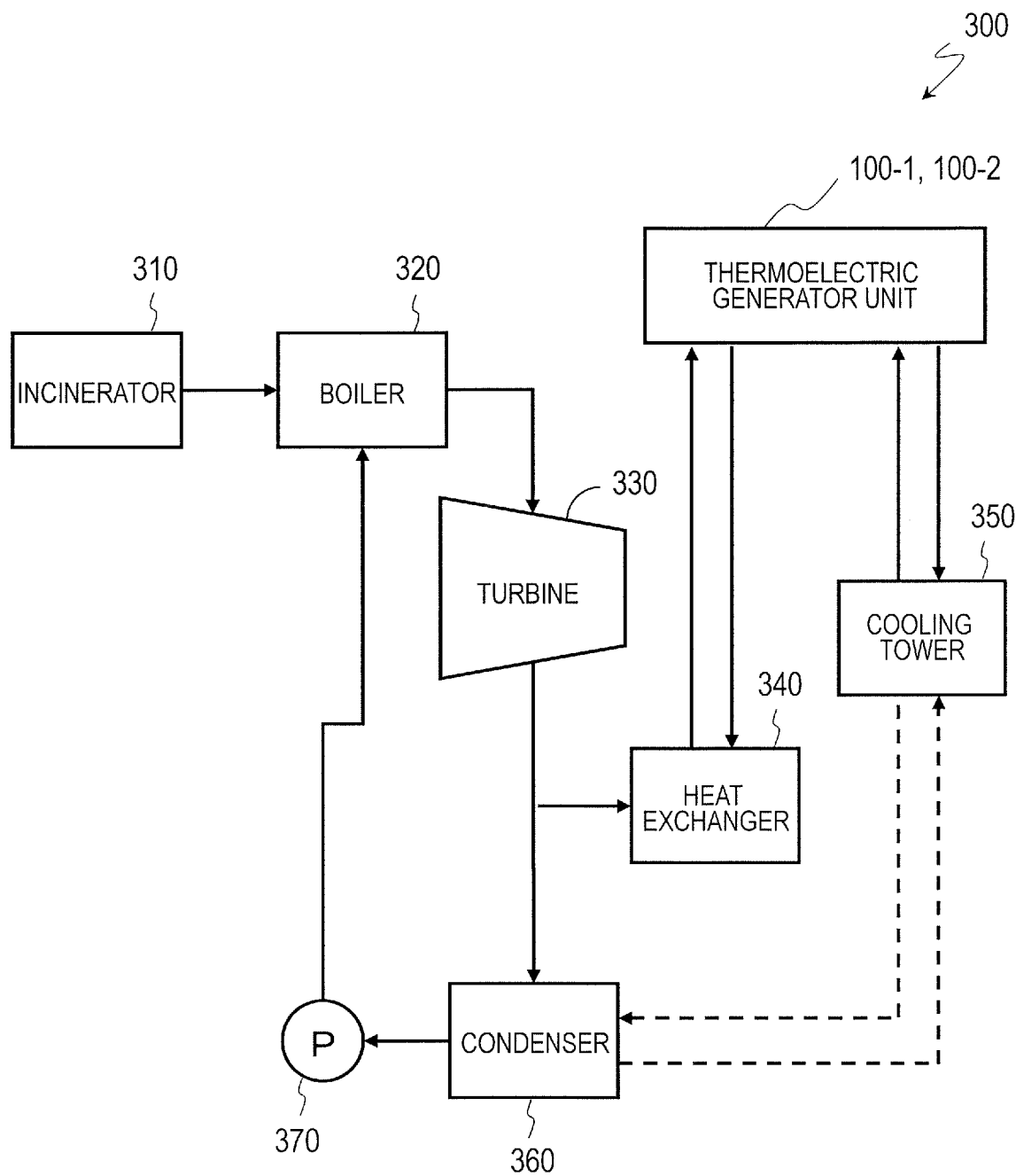
FIG. 31 is a block diagram illustrating an exemplary configuration for another embodiment in which a thermoelectric generator system according to the present disclosure may be used.

The thermoelectric generator units 100-1, 100-2 shown in FIG. 31 may be connected to the electric circuit 250 shown in FIG. 30, for example. The electricity generated by the thermoelectric generator units 100-1, 100-2 may be either used in the facility or accumulated in the accumulator 264. The extra electric power may be converted into AC power and then sold through the commercial grid 410.

The thermoelectric generator system 300 shown in FIG. 31 has a configuration in which a plurality of thermoelectric generator units are incorporated into the waste heat utilization system of a waste disposal facility including the boiler 320 and the turbine 330. However, to operate the thermoelectric generator units 100-1, 100-2, the boiler 320, turbine 330, condenser 360 and heat exchanger 340 are not indispensable members. If there is any gas or hot water at a relatively low temperature which has been just disposed of according to conventional technologies, that gas or water may be effectively used as hot medium directly. Or another gas or liquid may be heated by a heat exchanger and used as a hot medium. The system shown in FIG. 31 is just one of many practical examples.

As is clear from the foregoing description of embodiments, an embodiment of a thermoelectric generator system according to the present disclosure can collect and utilize effectively such thermal energy that has been just dumped unused into the ambient according to conventional technologies. For example, by generating a high-temperature medium based on the heat of combustion of garbage at a waste disposal facility, the thermal energy of a gas or hot water at a relatively low temperature that has been just disposed of according to conventional technologies can be utilized effectively.

A thermoelectric generator system according to one aspect of the present disclosure comprises a plurality of thermoelectric generator units including first and second thermoelectric generator units. Each of the first and second thermoelectric generator units includes a plurality of tubular thermoelectric generators. Each of the plurality of tubular thermoelectric generators may have an outer peripheral surface, an inner peripheral surface and a flow path defined by the inner peripheral surface, and may generate electromotive force in an axial direction of each said tubular thermoelectric generator based on a difference in temperature between the inner and outer peripheral surfaces. Each of the first and second thermoelectric generator units may further include: a container housing the plurality of tubular thermoelectric generators inside, the container having fluid inlet and outlet ports through which a fluid flows inside the container, and a plurality of openings into which the respective tubular thermoelectric generators are inserted; and a plurality of electrically conductive members providing electrical interconnection for the plurality of tubular thermoelectric generators. The thermoelectric generator system may further include a buffer vessel which is arranged between the first and second thermoelectric generator units. The buffer vessel may have a first opening communicating with the respective flow paths of the plurality of tubular thermoelectric generators in the first thermoelectric generator unit and a second opening communicating with the respective flow paths of the plurality of tubular thermoelectric generators in the second thermoelectric generator unit.

In one embodiment, the buffer vessel contains a baffle structure therein.

In one embodiment, the structure is shaped to change at least partially the flow direction of a fluid flowing into the buffer vessel through the respective flow paths of the plurality of tubular thermoelectric generators of an upstream one of the first and second thermoelectric generator units.

In one embodiment, the structure includes at least one baffle plate.

In one embodiment, the structure has a movable portion.

In one embodiment, the structure is shaped to change the flow direction of the fluid flowing around a cross-sectional center of the buffer vessel so that the fluid goes outward from the cross-sectional center of the buffer vessel.

In one embodiment, the structure is shaped to expand gradually in the flow direction of the fluid.

In one embodiment, a gap is left between an inner wall of the buffer vessel and an outer edge of the structure.

In one embodiment, the structure is shaped to change the flow direction of the fluid flowing around an inner periphery of the buffer vessel so that the fluid goes toward a cross-sectional center of the buffer vessel.

In one embodiment, the structure is a projection which is provided on the inner wall of the buffer vessel so as to project toward a cross-sectional center of the buffer vessel.

In one embodiment, the container includes: a shell surrounding the plurality of tubular thermoelectric generators; and a pair of plates. Each of the pair of plates is fixed to the shell and at least one of the pair of plates has a plurality of openings and channels. Each channel house an electrically conductive member. The respective ends of the tubular thermoelectric generators may be inserted into the plurality of openings of the plates, and at least one of the channels may have an interconnection which connects at least two of the plurality of openings together.

Any of the aforementioned thermoelectric generator systems may include: a first medium path communicating with the fluid inlet and outlet ports of the container in the first thermoelectric generator unit and the fluid inlet and outlet ports of the container in the second thermoelectric generator unit; and a second medium path encompassing the respective flow paths of the plurality of tubular thermoelectric generators in the first and second thermoelectric generator units.

In one embodiment, in the second medium path, the fluid flows in the same direction through the respective flow paths of the plurality of tubular thermoelectric generators.

In one embodiment, the plurality of electrically conductive members connect the plurality of tubular thermoelectric generators electrically in series together.

The thermoelectric generator system may further comprise an electric circuit electrically connected to the plurality of tubular thermoelectric generators via at least one of the plurality of electrically conductive members.

In one embodiment, the first and second thermoelectric generator units are electrically connected in series together.

A thermoelectric generator system according to another aspect of the present disclosure comprises a plurality of thermoelectric generator units including first and second thermoelectric generator units. Each of the first and second thermoelectric generator units includes a plurality of tubular thermoelectric generators. Each of the plurality of tubular thermoelectric generators may have an outer peripheral surface, an inner peripheral surface and a flow path defined by the inner peripheral surface, and may generate electromotive force in an axial direction of each said tubular thermoelectric generator based on a difference in temperature between the inner and outer peripheral surfaces. Each of the first and second thermoelectric generator units may further include: a container housing the plurality of tubular thermoelectric generators inside, the container having fluid inlet and outlet ports through which a fluid flows inside the container, and a plurality of openings into which the respective tubular thermoelectric generators are inserted; and a plurality of electrically conductive members providing electrical interconnection for the plurality of tubular thermoelectric generators in series. The first and second thermoelectric generator units may be electrically connected in series together. The thermoelectric generator system further may include a buffer vessel which is arranged between the first and second thermoelectric generator units. The buffer vessel may have a first opening communicating with the respective flow paths of the plurality of tubular thermoelectric generators in the first thermoelectric generator unit and a second opening communicating with the respective flow paths of the plurality of tubular thermoelectric generators in the second thermoelectric generator unit. The thermoelectric generator system may further include a medium path encompassing the respective flow paths of the tubular thermoelectric generators in the first and second thermoelectric generator units. In the medium path, a further fluid may flow in the same direction through the respective flow paths of the plurality of tubular thermoelectric generators.

In one embodiment, the buffer vessel contains a baffle structure therein. The structure may be shaped to change the flow direction of the further fluid flowing into the buffer vessel through the respective flow paths of the plurality of tubular thermoelectric generators, such that a portion of the further fluid flowing around a cross-sectional center of the buffer vessel goes outward from the cross-sectional center of the buffer vessel.

Alternatively, The structure may be shaped to change the flow direction of the further fluid flowing into the buffer vessel through the respective flow paths of the plurality of tubular thermoelectric generators, such that a portion of the further fluid flowing around an inner periphery of the buffer vessel goes toward a cross-sectional center of the buffer vessel.

A method of producing a thermoelectric generator system according to the present disclosure includes: providing the tubular thermoelectric generators described above; inserting the tubular thermoelectric generators into a plurality of openings of first and second containers with the configuration described above so that the tubular thermoelectric generators are held inside the first and second containers; electrically connecting the tubular thermoelectric generators together via a plurality of electrically conductive members; and arranging a buffer vessel between the first and second containers. The buffer vessel has a first opening communicating with the respective flow paths of the tubular thermoelectric generators housed in the first container and a second opening communicating with the respective flow paths of the tubular thermoelectric generators housed in the second container.

A method of generating electric power according to the present disclosure includes: introducing a first medium through fluid inlet and outlet ports of the container of each said thermoelectric generator unit of the thermoelectric generator system described above and bringing the first medium into contact with the outer peripheral surface of each tubular thermoelectric generator; introducing a second medium having a different temperature from the first medium into the flow paths of the respective tubular thermoelectric generators; and extracting electric power generated by the tubular thermoelectric generators through the electrically conductive members.

A thermoelectric generator unit according to the present disclosure may be used by itself without being connected with other units via the buffer vessel. A thermoelectric generator unit according to the present disclosure includes a plurality of tubular thermoelectric generators, each of which has an outer peripheral surface, an inner peripheral surface and a flow path defined by the inner peripheral surface, and is configured to generate electromotive force in an axial direction of each tubular thermoelectric generator based on a difference in temperature between the inner and outer peripheral surfaces. Typically, those tubular thermoelectric generators are electrically connected together in series via a plurality of plate electrically conductive members. Those electrically conductive members may be located inside or outside of the container that surrounds the tubular thermoelectric generators as long as the plate electrically conductive members are insulated from the heat transfer medium.

A thermoelectric generator system according to the present disclosure may be used as a power generator which utilizes the heat of an exhaust gas exhausted from a car or a factory, for example.

While the present invention has been described with respect to exemplary embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A thermoelectric generator system comprising a plurality of thermoelectric generator units including first and second thermoelectric generator units, each of which includes a plurality of tubular thermoelectric generators, wherein each of the plurality of tubular thermoelectric generators has an outer peripheral surface, an inner peripheral surface and a flow path defined by the inner peripheral surface, and generates electromotive force in an axial direction of each said tubular thermoelectric generator based on a difference in temperature between the inner and outer peripheral surfaces, each of the first and second thermoelectric generator units further includes:

a container housing the plurality of tubular thermoelectric generators inside, the container having fluid inlet and outlet ports through which a fluid flows inside the container, and a plurality of openings into which the respective tubular thermoelectric generators are inserted;

a fluid conduit connected between the fluid outlet port of the container of the first thermoelectric generator unit and the fluid inlet port of the container of the second thermoelectric generator unit, through which fluid from the first thermoelectric generator unit is communicated into the second thermoelectric generator unit, wherein the fluid conduit defines a first medium path communicating with the fluid inlet and outlet ports of the container in the first thermoelectric generator unit and the fluid inlet and outlet ports of the container in the second thermoelectric generator unit; and a plurality of electrically conductive members providing electrical interconnection for the plurality of tubular thermoelectric generators, and the thermoelectric generator system further includes a buffer vessel which is arranged between the first and second thermoelectric generator units, the buffer vessel having a first opening communicating with the respective flow paths of the plurality of tubular thermoelectric generators in the first thermoelectric generator unit and a second opening communicating with the respective flow paths of the plurality of tubular thermoelectric generators in the second thermoelectric generator unit, wherein the buffer vessel defines a second medium path between the respective flow paths of the plurality of tubular thermoelectric generators in the first thermoelectric generator unit and the respective flow paths of the plurality of tubular thermoelectric generators in the second thermoelectric generator unit, wherein in the second medium path, fluid flows downstream from inside the plurality of tubular thermoelectric generators in the second thermoelectric generator unit through the buffer vessel and to inside the plurality of tubular thermoelectric generators in the first thermoelectric generator unit, and wherein in the first medium path, fluid flows downstream from an area inside the container of the first thermoelectric generator unit that is outside the plurality of tubular thermoelectric generators in the first thermoelectric generator unit, through the fluid conduit outside of the container of the first thermoelectric generator unit, and to an area that is inside the container of the second thermoelectric generator unit and outside the plurality of tubular thermoelectric generators in the second thermoelectric generator unit.

2. The thermoelectric generator system of claim 1, wherein the buffer vessel contains a baffle structure therein.

3. The thermoelectric generator system of claim 2, wherein the baffle structure is shaped to change at least partially a flow direction of the fluid flowing in the second medium path into the buffer vessel.

4. The thermoelectric generator system of claim 3, wherein the baffle structure includes at least one baffle plate.

5. The thermoelectric generator system of claim 3, wherein the baffle structure has a movable portion.

6. The thermoelectric generator system of claim 3, wherein the baffle structure is shaped to change the flow direction of the fluid flowing in the second medium path around a cross-sectional center of the buffer vessel.

7. The thermoelectric generator system of claim 3, wherein the baffle structure is shaped to radially expand gradually in the flow direction of the fluid flowing in the second medium path.

8. The thermoelectric generator system of claim 3, wherein a gap is left between an inner wall of the buffer vessel and an outer edge of the baffle structure.

9. The thermoelectric generator system of claim 3, wherein the baffle structure is shaped to change the flow direction of the fluid flowing in the second medium path around an inner periphery of the buffer vessel so that the fluid flowing in the second medium path flows toward a cross-sectional center of the buffer vessel.

10. The thermoelectric generator system of claim 3, wherein the baffle structure is a projection which is provided on an inner wall of the buffer vessel so as to project toward a cross-sectional center of the buffer vessel.

11. The thermoelectric generator system of claim 1, wherein the container includes:

a shell surrounding the plurality of tubular thermoelectric generators; and a pair of plates, each of which is fixed to the shell and at least one of which has a plurality of openings and channels, each channel housing one of the plurality of electrically conductive members, wherein respective ends of the tubular thermoelectric generators are inserted into the plurality of openings of the plates, and at least one of the channels has an interconnection which connects at least two of the plurality of openings together.

12. The thermoelectric generator system of claim 1, wherein the plurality of electrically conductive members connect the plurality of tubular thermoelectric generators electrically in series together.

13. The thermoelectric generator system of claim 12, further comprising:
an electric circuit electrically connected to the plurality of tubular thermoelectric generators via at least one of the plurality of electrically conductive members.

14. The thermoelectric generator system of claim 12, wherein the first and second thermoelectric generator units are electrically connected in series together.

15. A thermoelectric generator system comprising a plurality of thermoelectric generator units including first and second thermoelectric generator units, each of which includes a plurality of tubular thermoelectric generators,
wherein each of the plurality of tubular thermoelectric generators has an outer peripheral surface, an inner peripheral surface and a flow path defined by the inner peripheral surface, and generates electromotive force in an axial direction of each said tubular thermoelectric generator based on a difference in temperature between the inner and outer peripheral surfaces,
each of the first and second thermoelectric generator units further includes:
a container housing the plurality of tubular thermoelectric generators inside, the container having fluid inlet and outlet ports through which a fluid flows inside the container, and a plurality of openings into which the respective tubular thermoelectric generators are inserted;
a fluid conduit connected between the fluid outlet port of the container of the first thermoelectric generator unit and the fluid inlet port of the container of the second thermoelectric generator unit, through which fluid from the first thermoelectric generator unit is communicated into the second thermoelectric generator unit, wherein the fluid conduit defines a first medium path communicating with the fluid inlet and outlet ports of the container in the first thermoelectric generator unit and the fluid inlet and outlet ports of the container in the second thermoelectric generator unit; and
a plurality of electrically conductive members providing electrical interconnection for the plurality of tubular thermoelectric generators in series,
the first and second thermoelectric generator units are electrically connected in series together,
the thermoelectric generator system further includes a buffer vessel which is arranged between the first and second thermoelectric generator units,
the buffer vessel having a first opening communicating with the respective flow paths of the plurality of tubular thermoelectric generators in the first thermoelectric generator unit and a second opening communicating with the respective flow paths of the plurality of tubular thermoelectric generators in the second thermoelectric generator unit, wherein the buffer vessel defines a second medium path between the respective flow paths of the plurality of tubular thermoelectric generators in the first thermoelectric generator unit and the respective flow paths of the plurality of tubular thermoelectric generators in the second thermoelectric generator unit,
wherein in the second medium path, fluid flows downstream from inside the plurality of tubular thermoelectric generators in the second thermoelectric generator unit through the buffer vessel and to inside the plurality of tubular thermoelectric generators in the first thermoelectric generator unit, and
wherein in the first medium path, fluid flows downstream from an area inside the container of the first thermoelectric generator unit that is outside the plurality of tubular thermoelectric generators in the first thermoelectric generator unit, through the fluid conduit outside of the container of the first thermoelectric generator unit, and to an area that is inside the container of the second thermoelectric generator unit and outside the plurality of tubular thermoelectric generators in the second thermoelectric generator unit.

16. The thermoelectric generator system of claim 15, wherein the buffer vessel contains a baffle structure therein, the baffle structure being shaped to change a flow direction of the fluid flowing in the second medium path into the buffer vessel through the respective flow paths of the plurality of tubular thermoelectric generators in the second thermoelectric generator unit, such that a portion of the fluid flowing in the second medium path around a cross-sectional center of the buffer vessel flows outward from the cross-sectional center of the buffer vessel.

17. The thermoelectric generator system of claim 15, wherein the buffer vessel contains a baffle structure therein, the baffle structure being shaped to change a flow direction of the fluid flowing in the second medium path into the buffer vessel through the respective flow paths of the plurality of tubular thermoelectric generators in the second thermoelectric generator unit, such that a portion of the fluid flowing in the second medium path around an inner periphery of the buffer vessel flows toward a cross-sectional center of the buffer vessel.

18. The thermoelectric generator system of claim 1, wherein the fluid outlet port of the container in the first thermoelectric generator unit and the fluid inlet port of the container of the second thermoelectric generator unit are adjacent to each other and directly connected by the fluid conduit.

19. The thermoelectric generator system of claim 15, wherein the fluid outlet port of the container in the first thermoelectric generator unit and the fluid inlet port of the container of the second thermoelectric generator unit are adjacent to each other and directly connected by the fluid conduit.

* * * * *